US011183601B2

(12) United States Patent
Naito

(10) Patent No.: US 11,183,601 B2
(45) Date of Patent: Nov. 23, 2021

(54) SEMICONDUCTOR DEVICE WITH CARRIER LIFETIME CONTROL

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/663,294

(22) Filed: Oct. 24, 2019

(65) Prior Publication Data

US 2020/0058803 A1    Feb. 20, 2020

Related U.S. Application Data

(63) Continuation of application No. PCT/JP2018/042285, filed on Nov. 15, 2018.

(30) Foreign Application Priority Data

Nov. 15, 2017    (JP) .............................. JP2017-220347

(51) Int. Cl.
*H01L 29/861* (2006.01)
*H01L 21/8234* (2006.01)
(Continued)

(52) U.S. Cl.
CPC ........ *H01L 29/861* (2013.01); *H01L 21/8234* (2013.01); *H01L 27/06* (2013.01);
(Continued)

(58) Field of Classification Search
CPC ... H01L 29/861; H01L 21/8234; H01L 27/06; H01L 29/1095; H01L 29/12;
(Continued)

(56) References Cited

U.S. PATENT DOCUMENTS 5,859,446 A    1/1999    Nagasu
8,952,449 B2   2/2015    Koyama
(Continued)

FOREIGN PATENT DOCUMENTS

CN    102376759 A    3/2012
CN    106133889 A    11/2016
(Continued)

OTHER PUBLICATIONS

International Search Report and (ISA/237) Written Opinion of the International Search Authority for International Patent Application No. PCT/JP2018/042285, mailed by the Japan Patent Office dated Jan. 29, 2019.

(Continued)

*Primary Examiner* — Shahed Ahmed

(57) ABSTRACT

A semiconductor device includes a semiconductor substrate including a drift region of a first conductivity type, a transistor portion provided in the substrate, and an adjacent element portion provided in the substrate, the adjacent element and transistor portions being arranged along an arrangement direction. The transistor and adjacent element portions both include a base region of a second conductivity type provided above the drift region, trench portions formed through the base region, extending in an extending direction orthogonal to the arrangement direction on the upper surface, and having a conducting portion therein, and a first lower surface side lifetime control region provided, on a lower surface side, continuously from the transistor portion to the adjacent element portion and includes a lifetime killer. The lifetime control region is provided over entirety of the transistor portion and in a part of the adjacent element portion in a top view of the substrate.

18 Claims, 26 Drawing Sheets

(51) Int. Cl.
  *H01L 27/06* (2006.01)
  *H01L 29/10* (2006.01)
  *H01L 29/12* (2006.01)
  *H01L 29/739* (2006.01)
  *H01L 29/78* (2006.01)

(52) U.S. Cl.
  CPC .......... *H01L 29/1095* (2013.01); *H01L 29/12* (2013.01); *H01L 29/739* (2013.01); *H01L 29/78* (2013.01)

(58) Field of Classification Search
  CPC ... H01L 29/739; H01L 29/78; H01L 29/0619; H01L 29/7811; H01L 29/7804; H01L 29/7813; H01L 27/0727; H01L 29/32; H01L 29/8613; H01L 29/7802; H01L 29/083; H01L 29/404; H01L 29/407; H01L 29/0696; H01L 29/7397; H01L 29/66325–66348; H01L 29/7393–7398
  See application file for complete search history.

(56) References Cited

U.S. PATENT DOCUMENTS

| | | | |
|---|---|---|---|
| 10,056,450 B2 | 8/2018 | Kouno | |
| 10,170,607 B2 | 1/2019 | Kouno | |
| 10,256,234 B2 | 4/2019 | Tanabe | |
| 2012/0043582 A1 | 2/2012 | Koyama | |
| 2012/0309208 A1 | 12/2012 | Tanida | |
| 2013/0075783 A1* | 3/2013 | Yamazaki | H01L 29/36 257/139 |
| 2017/0069625 A1* | 3/2017 | Hirabayashi | H01L 21/26513 |
| 2017/0077216 A1* | 3/2017 | Kouno | H01L 27/0664 |
| 2017/0222029 A1* | 8/2017 | Kono | H01L 29/0804 |

FOREIGN PATENT DOCUMENTS

| | | |
|---|---|---|
| CN | 106463529 A | 2/2017 |
| JP | 2011238872 A | 11/2011 |
| JP | 2012043891 A | 3/2012 |
| JP | 2015065464 A | 4/2015 |
| JP | 2017045949 A | 3/2017 |
| WO | 2012063342 A1 | 5/2012 |
| WO | 2017033636 A1 | 3/2017 |

OTHER PUBLICATIONS

Notice of First Office Action for Patent Application No. 201880026725.4, issued by The National Intellectual Property Administration of the People's Republic of China dated Sep. 16, 2021.

* cited by examiner

SEMICONDUCTOR DEVICE WITH CARRIER LIFETIME CONTROL

The contents of the following Japanese patent applications are incorporated herein by reference:
NO. 2017-220347 filed in JP on Nov. 15, 2017, and
NO. PCT/JP2018/042285 filed on Nov. 15, 2018.

BACKGROUND

1. Technical Field

The present invention relates to a semiconductor device.

2. Related Art

Conventionally, semiconductor devices such as an insulated gate bipolar transistor (IGBT) have been known (see, for example, Japanese Patent Application Publication No. 2012-43891).

SUMMARY

In the semiconductor devices, leak current characteristics and the other like characteristics are preferably improved.
[General Disclosure]
According to one aspect of the present invention, a semiconductor device is provided including: a semiconductor substrate that includes a drift region of a first conductivity type; a transistor portion provided in the semiconductor substrate; and an adjacent element portion provided in the semiconductor substrate, the adjacent element portion and the transistor portion being arranged along a predetermined arrangement direction. The transistor portion and the adjacent element portion both include a base region of a second conductivity type provided above the drift region inside the semiconductor substrate, a plurality of trench portions that are formed through the base region from an upper surface of the semiconductor substrate, extend in an extending direction orthogonal to the arrangement direction on the upper surface of the semiconductor substrate, and have a conducting portion provided inside the trench portions, and a first lower surface side lifetime control region that is provided, on a lower surface side of the semiconductor substrate, continuously from the transistor portion to the adjacent element portion and includes a lifetime killer. In the arrangement direction, the first lower surface side lifetime control region is provided over entirety of the transistor portion and in a part of the adjacent element portion in a top view of the semiconductor substrate.

A second lower surface side lifetime control region is further included, that is provided on a lower surface side at a position deeper than the first lower surface side lifetime control region with respect to a lower surface of the semiconductor substrate, provided to overlap the first lower surface side lifetime control region in the top view of the semiconductor substrate, and includes a lifetime killer. In the arrangement direction, the second lower surface side lifetime control region may be provided continuously from the transistor portion to the adjacent element portion and provided in a part of the transistor portion and in a part of the adjacent element portion.

The transistor portion may further include an upper surface side lifetime control region including a lifetime killer, on an upper surface side of the semiconductor substrate. In the transistor portion, an end of the second lower surface side lifetime control region may be provided closer to the adjacent element portion in the arrangement direction than an end of the upper surface side lifetime control region is.

At an end of the transistor portion in the arrangement direction, the first lower surface side lifetime control region and the second lower surface side lifetime control region may overlap in a depth direction of the semiconductor substrate. The adjacent element portion may include a diode portion and a boundary portion that is sandwiched between the diode portion and the transistor portion in the arrangement direction. In the boundary portion, the first lower surface side lifetime control region and the second lower surface side lifetime control region may overlap in a depth direction of the semiconductor substrate.

At an end of the diode portion in the arrangement direction, the first lower surface side lifetime control region and the second lower surface side lifetime control region may not overlap in the depth direction of the semiconductor substrate. The upper surface side lifetime control region may be provided continuously from the transistor portion to the adjacent element portion in the arrangement direction, on the upper surface side of the semiconductor substrate. In the arrangement direction, the upper surface side lifetime control region may be provided in a part of the transistor portion and over entirety of the adjacent element portion.

The semiconductor device may further include a well region of the second conductivity type provided to overlap the plurality of trench portions in the top view of the semiconductor substrate. A part of the upper surface side lifetime control region may be provided to have a predetermined length in the extending direction, from an end of the well region to outside of the well region. The predetermined length may be larger than a thickness of the semiconductor substrate in a depth direction.

A part of the second lower surface side lifetime control region may be provided to have a predetermined length in the extending direction, from the end of the well region to the outside of the well region in the top view of the semiconductor substrate. The predetermined length may be larger than the thickness of the semiconductor substrate in the depth direction. A part of the first lower surface side lifetime control region may be provided to have a predetermined length in the extending direction, from the end of the well region to the outside of the well region in the top view of the semiconductor substrate. The predetermined length may be larger than the thickness of the semiconductor substrate in the depth direction.

The semiconductor device may further include an active portion provided with the transistor portion and the adjacent element portion. The semiconductor device may further include an edge termination structure portion surrounding the active portion in the top view. The first lower surface side lifetime control region may not be provided in at least a partial region of the edge termination structure portion.

The summary clause does not necessarily describe all necessary features of the embodiments of the present invention. The present invention may also be a sub-combination of the features described above.

BRIEF DESCRIPTION OF THE DRAWINGS

FIG. 1b is a diagram showing an example of the cross section taken along line a-a' in FIG. 1a.

FIG. 2b is a diagram showing an example of the cross section taken along line z-z' in FIG. 2a.

FIG. 3a is a diagram showing another example of the a-a' cross section in FIG. 1a.

FIG. 3b is a diagram showing a lifetime killer concentration distribution of the upper surface side lifetime control region 72 as well as the first lower surface side lifetime control region 74 and a second lower surface side lifetime control region 75-1, in a c-c' cross section in FIG. 3a.

FIG. 3c is a diagram showing another example of the a-a' cross section in FIG. 1a.

FIG. 4a is a diagram showing another example of the a-a' cross section in FIG. 1a.

FIG. 4b is a diagram showing another example of the a-a' cross section in FIG. 1a.

FIG. 5a is a diagram showing another example of the a-a' cross section in FIG. 1a.

FIG. 5b is a diagram showing a lifetime killer concentration distribution of the upper surface side lifetime control region 72 as well as the first lower surface side lifetime control region 74 and a second lower surface side lifetime control region 75, in a d-d' cross section in FIG. 5a.

FIG. 5c is a diagram showing another example of the a-a' cross section in FIG. 1a.

FIG. 5d is a diagram showing another example of the a-a' cross section in FIG. 1a.

FIG. 5e is a diagram showing another example of the a-a' cross section in FIG. 1a.

DESCRIPTION OF EXEMPLARY EMBODIMENTS

Hereinafter, embodiments of the present invention will be described. The embodiments do not limit the invention according to the claims, and all the combinations of the features described in the embodiments are not necessarily essential to means provided by aspects of the invention.

In this specification, one side in a direction in parallel with a depth direction of a semiconductor substrate is referred to as "upper", and the other side is referred to as "lower". Of two main surfaces of a wafer, a layer, or other members, one surface is referred to as an upper surface and the other surface is referred to as a lower surface. The "upper" and the "lower" directions are not limited to the direction of gravity, or a direction of attachment to a wafer and the like at the time of mounting a semiconductor device.

In this specification, technical matters may be described using orthogonal axes that are an X axis, a Y axis, and a Z axis. In this specification, a plane in parallel with the upper surface of the semiconductor substrate is defined as an XY plane, and a depth direction of the semiconductor substrate is defined as the Z axis.

In the embodiments, an example is described where a first conductivity type is an N type and a second conductivity type is a P type, but the first conductivity type may be the P type and the second conductivity type is the N type. In such a case, each of a wafer, a layer, a region, and the like has the polarity of the conductivity type reversed.

Figure 1A:
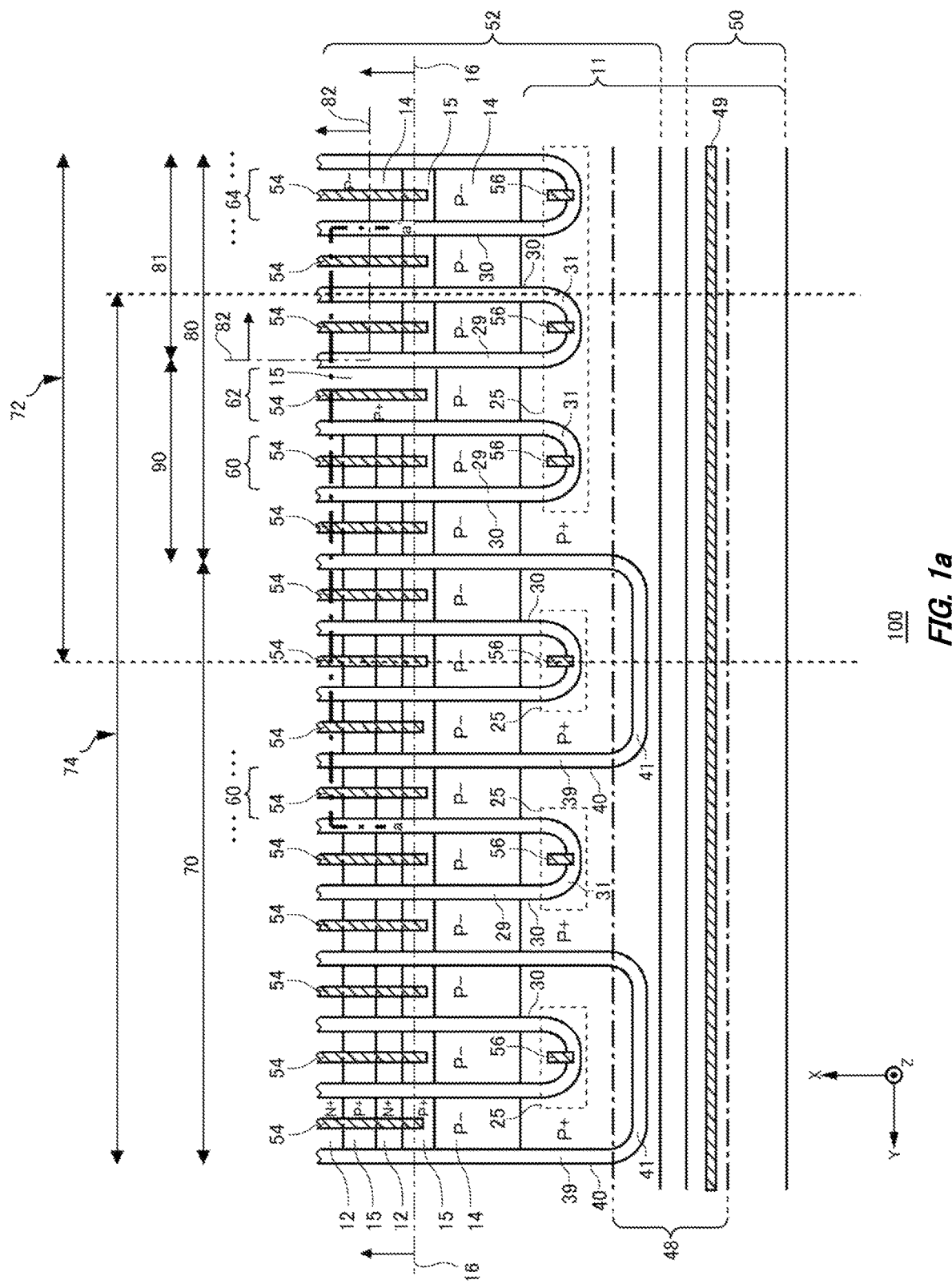
FIG. 1a is a diagram showing a part of an upper surface of a semiconductor device 100 according to the present embodiment.

FIG. 1a is a diagram showing a part of an upper surface of a semiconductor device 100 according to the present embodiment. The semiconductor device 100 of the present example is a semiconductor chip including transistor portions 70 and adjacent element portions 80 provided adjacent to the transistor portions 70. For example, the transistor portion 70 and the adjacent element portion 80 are arranged side by side in a Y axis direction. The transistor portions 70 and the adjacent element portions 80 may be alternately arranged in the Y axis direction. The transistor portions 70 and the adjacent element portions 80 may be in contact with each other in the Y axis direction. The transistor portion 70 includes a transistor such as an IGBT. The adjacent element portion 80 includes a diode portion 81. The adjacent element portion 80 may include a boundary portion 90 sandwiched between the diode portion 81 and the transistor portion 70 in the Y axis direction. FIG. 1a shows an example where the adjacent element portion 80 includes the diode portion 81 and the boundary portion 90. The diode portion 81 includes a diode such as a Free Wheeling Diode (FWD) provided to be in contact with the boundary portion 90 or the transistor portion 70 on the upper surface of the semiconductor substrate. In FIG. 1a, a chip upper surface around a chip end is shown, and other regions are omitted.

While FIG. 1a shows an active region of the semiconductor substrate in the semiconductor device 100, the semiconductor device 100 may include an edge termination structure portion surrounding the active region. The active region is a region in which current flows when the semiconductor device 100 is controlled to be in an ON state. The edge termination structure portion relaxes electric field concentration on an upper surface side of the semiconductor substrate. For example, the edge termination structure portion has a guard ring, field plate, or RESURF structure, or a combination thereof.

The semiconductor device 100 of this example includes gate trench portions 40, dummy trench portions 30, a well region 11, emitter regions 12, base regions 14, and contact regions 15 that are provided inside the semiconductor substrate and are exposed on the upper surface of the semiconductor substrate. The semiconductor device 100 of this example includes an emitter electrode 52 and a gate metal layer 50 provided above the upper surface of the semiconductor substrate. The emitter electrode 52 and the gate metal layer 50 are provided to be separated from each other.

An inter-layer insulating film, omitted in FIG. 1a, is provided between the upper surface of the semiconductor substrate and the emitter electrode 52 and between the upper surface of the semiconductor substrate and the gate metal layer 50. The inter-layer insulating film of this example has contact holes 56, a contact hole 49, and contact holes 54 provided through the inter-layer insulating film.

The emitter electrode 52 is connected to a dummy conductive portion in the dummy trench portion 30 through the contact holes 56. Connection portions 25, formed of a conductive material such as polysilicon doped with impurities, may be provided between the emitter electrode 52 and the dummy conductive portion. An insulating film such as an oxide film is provided between the connection portions 25 and the upper surface of the semiconductor substrate.

The gate metal layer 50 is in contact with a gate runner 48 through the contact hole 49. The gate runner 48 is formed of polysilicon doped with impurities, or the like. The gate runner 48 is connected to a gate conductive portion in the gate trench portion 40, on the upper surface of the semiconductor substrate. The gate runner 48 is not connected to the dummy conductive portion in the dummy trench portion 30.

The gate runner 48 of this example is provided from below the contact hole 49 to a tip of the gate trench portion 40. An insulating film such as an oxide film is provided between the gate runner 48 and the upper surface of the semiconductor substrate. At the edge portion of the gate trench portion 40, the gate conductive portion is exposed on the upper surface of the semiconductor substrate. The gate trench portion 40 is in contact with the gate runner 48, in the exposed portion of the gate conductive portion.

The emitter electrode 52 and the gate metal layer 50 are formed of a material including metal. For example, at least a partial region of the emitter electrode 52 may be formed of aluminum or an aluminum-silicon alloy. At least a partial region of the gate metal layer 50 may be formed of aluminum or an aluminum-silicon alloy. The emitter electrode 52 and the gate metal layer 50 may have barrier metal layer formed of titanium, a titanium compound, or the like below the regions formed of aluminum or the like. The emitter electrode 52 and the gate metal layer 50 may have a plug that is formed of tungsten or the like and provided in the contact holes.

One or more gate trench portions 40 and one or more dummy trench portions 30 are arranged at predetermined intervals along a predetermined arrangement direction (the Y axis direction in this example). The gate trench portion 40 of this example may include two extending portions 39 extending in an extending direction (an X axis direction in this example) that is in parallel with the upper surface of the semiconductor substrate and perpendicular to the arrangement direction and a connection portion 41 connecting the two extending portions 39 to each other. At least a part of the connection portion 41 is preferably provided to be in a curved form. With ends of the two extending portions 39 of the gate trench portion 40 connected to each other, electric field concentration at the end of the extending portions 39 can be relaxed. The gate runner 48 may be connected to the gate conductive portion in the connection portion 41 of the gate trench portion 40.

The dummy trench portion 30 of this example may have a U shape on the upper surface of the semiconductor substrate, similarly to the gate trench portion 40. Specifically, the dummy trench portion 30 of this example includes two extending portions 29 extending along the extending direction and a connection portion 31 connecting the two extending portions 29 to each other.

The emitter electrode 52 is provided above the gate trench portion 40, the dummy trench portion 30, the well region 11, the emitter region 12, the base region 14, and the contact region 15. The well region 11 is of a second conductivity type. For example, the well region 11 is of a P+ type. The well region 11 of this example is provided in a predetermined range from an end of the active region toward the inner side of the active region. The well region 11 of this example is provided to overlap the entirety of the gate metal layer 50 and of the gate runner 48 arranged in an end portion of the active region, in a top view. The well region 11 may also be provided more inside in the active region, than the gate metal layer 50 and the gate runner 48 are, in the top view. The well region 11 may have a diffusion depth greater than the depths of the gate trench portion 40 and the dummy trench portion 30. Partial regions of the gate trench portion 40 and the dummy trench portion 30 on the side of the gate metal layer 50 are provided in the well region 11. Bottoms of the gate trench portion 40 and the dummy trench portion 30 at an end in the extending direction may be covered with the well region 11

In the transistor portion 70, the contact holes 54 are provided above each of the contact region 15 and the emitter region 12. In the diode portion 81, the contact holes 54 are provided above the base region 14. In the boundary portion 90, the contact holes 54 are provided above each of the contact region 15 and the emitter region 12. None of the contact holes 54 is provided above the base region 14 and the well region 11 provided at both ends in the X axis direction.

A mesa portion is provided in a plane parallel to the upper surface of the semiconductor substrate while in contact with each trench portion in the Y axis direction. The mesa portion may be a portion, of the semiconductor substrate, sandwiched between two adjacent trench portions, and may extend from the upper surface of the semiconductor substrate to a depth of the bottom that is the deepest portion of each trench portion. The extending portions (39, 29) of each trench portion may be regarded as a single trench portion. Thus, the mesa portion may be a region sandwiched between two extending portions (39, 29).

First mesa portions 60 are provided in the transistor portion 70. The mesa portions in the transistor portion 70 may all be the first mesa portions 60. Of mesa portions in the boundary portion 90, one or more mesa portions arranged on the side of the transistor portion 70 in the Y axis direction are the first mesa portions 60. In this specification, the expression "the side of a certain member", such as the side of the transistor portion 70, indicates a region closer to the member. Of the mesa portions in the boundary portion 90, one or more mesa portions arranged on the side of the diode portion 81 in the Y axis direction are second mesa portions 62. In the diode portion 81, third mesa portions 64 are provided in regions each sandwiched between adjacent dummy trench portions 30. The mesa portions in the diode portion 81 may all be the third mesa portions 64.

As one example, the base regions 14 of the second conductivity type are provided at both ends of each of the first mesa portions 60, the second mesa portions 62, and the third mesa portions 64, in the X axis direction, on the upper surface of the semiconductor substrate. The base regions 14 of this example are of a P− type. In FIG. 1a, only one of the ends of each mesa portion in the X axis direction is shown.

The emitter regions 12 are provided on the upper surface of the first mesa portions 60 while being in contact with the gate trench portion 40. An emitter region 12 may be provided to extend in the Y axis direction, between two trench portions that sandwich the first mesa portions 60 therebetween and extend in the X axis direction. The emitter regions 12 are also provided beneath the contact holes 54. In FIG. 1a, a boundary of the emitter region 12 overlapping the contact holes 54 in the top view of the semiconductor substrate is indicated with a broken line.

The emitter region 12 may be or may not be in contact with the dummy trench portion 30. In this example, the emitter region 12 is in contact with the dummy trench portion 30. The emitter region 12 of this example is of a first conductivity type. The emitter region 12 of this example is of an N+ type, for example.

The contact regions 15 of the second conductivity type having a higher doping concentration than the base regions 14 are provided on the upper surface of the first mesa portion 60. The contact region 15 of this example is of a P+ type for example. In the first mesa portion 60, the emitter regions 12 and the contact regions 15 may be alternately provided along the extending direction of the gate trench portion 40. The contact region 15 may extend in the Y axis direction between the two trench portions that sandwich the first mesa portion 60 therebetween and extend in the X axis direction. The contact region 15 is also provided beneath the contact hole 54. In FIG. 1a, a boundary of the contact region 15 overlapping the contact holes 54 in the top view of the semiconductor substrate is indicated with a broken line.

The contact region 15 may or may not be in contact with the gate trench portion 40. The contact region 15 may or may not be in contact with the dummy trench portion 30. In this example, the contact region 15 is in contact with the dummy trench portion 30 and the gate trench portion 40.

The contact region 15 is provided on the upper surface of the second mesa portion 62. An area of the contact region 15 provided on the upper surface of one second mesa portion 62 is larger than an area of the contact region 15 provided on the upper surface of one first mesa portion 60. An area of the contact region 15 provided on the upper surface of one second mesa portion 62 may be larger than an area of the contact region 15 provided on the upper surface of one third mesa portion 64. The base regions 14 are provided at both ends of the second mesa portion 62 in the X axis direction. The contact region 15 on the upper surface of the second mesa portion 62 may be provided throughout the region sandwiched between the base regions 14 at the both ends. With the contact region 15 having a large area provided on the second mesa portion 62, carriers can be easily extracted at the time of turn OFF.

On the upper surface of the third mesa portion 64, the contact regions 15 are provided at both ends in the X axis direction. The base region 14 is provided in a region sandwiched by the contact regions 15 provided at the both end, on the upper surface of the third mesa portion 64. The base region 14 may be provided throughout the region sandwiched by the contact regions 15 in the X axis direction.

In the third mesa portion 64, the contact regions 15 and the base region 14 are provided between the dummy trench portions 30 sandwiching the third mesa portion 64 therebetween.

Thus, on the upper surface of the semiconductor substrate, the width of the third mesa portion 64 in the Y axis direction is the same as the width of the contact region 15 or the base region 14, provided in the third mesa portion 64, in the Y axis direction.

The third mesa portion 64 may or may not be provided with the emitter region 12. In this example, the emitter region 12 is not provided in the third mesa portion 64.

The semiconductor device 100 of this example has the dummy trench portions 30 provided in the diode portion 81. The linear extending portions 29 of the respective adjacent dummy trench portions 30 may be connected to each other by the connection portion 31. The third mesa portion 64 of this example is a region sandwiched by the extending portions 29 of each dummy trench portion 30.

The diode portion 81 has a cathode region 82 of the first conductivity type on a lower surface side of the semiconductor substrate. For example, the cathode region 82 of this example is of an N+ type. In FIG. 1a, a region provided with the cathode region 82 in the top view of the semiconductor substrate is indicated with a one-chain dotted portion. The diode portion 81 may be a region obtained by projecting the cathode region 82 on the upper surface of the semiconductor substrate. The diode portion 81 may include the entirety of the third mesa portion 64, partially provided with the cathode region 82, and the dummy trench portion 30 in contact with this third mesa portion 64. The region obtained by projecting the cathode region 82 on the upper surface of the semiconductor substrate may be away from the contact region 15 in the positive X axis direction.

A collector region of the second conductivity type may be provided in a region, of the lower surface of the semiconductor substrate, that is not provided with the cathode region 82. For example, the collector region of this example is of a P+ type. The collector region may be provided at a position obtained by projecting the end of the contact hole 54 in the diode portion 81 in the X axis on the lower surface of the semiconductor substrate.

The transistor portion 70 is a region, of the region obtained by projecting the collector region on the upper surface of the semiconductor substrate, where the gate trench portions 40 are arranged at constant intervals in the Y axis direction. In this example, in the region sandwiched by the diode portions 81 in the Y axis direction, the gate trench portions 40 closest to the respective diode portions 81 are defined as both ends of the transistor portion 70 in the Y axis direction. A region sandwiched by the transistor portion 70 and the diode portion 81 in the Y axis direction is defined as the boundary portion 90. The boundary portion 90 may have one or more mesa portions sandwiched between two dummy trench portions 30. In FIG. 1a, the gate trench portion 40 in contact with the boundary portion 90 and a region at more positive position in the Y axis direction than this gate trench portion 40 are the transistor portion 70. A boundary portion 90 not shown in FIG. 1a may exist on the positive side of the transistor portion 70 in the Y axis direction. The transistor portion 70 in FIG. 1a is a region from the gate trench portion 40 in contact with the boundary portion 90 (the diode portion 81 if the boundary portion 90 is not provided) on the positive side in the Y axis direction to the gate trench portion 40 in contact with the boundary portion 90 (the diode portion 81 if the boundary portion 90 is not provided) on the negative side in the Y axis direction. A range of the transistor portion 70 in the Y axis direction will be described with reference to FIG. 7a. In each figure, a description may be given with a side pointed by each of arrows of the X axis, the Y axis, and the Z axis defined as the positive side and with a side opposite to the arrows defined as the negative side. The positive side and the negative side indicate relative positions in the directions.

The semiconductor device 100 of this example includes an accumulation region 16 in at least some of the mesa portions. The accumulation region 16 is an N+ type region provided beneath the base region 14. In FIG. 1a, a range where the accumulation region 16 is provided, in the top view is indicated with a broken line.

The semiconductor device 100 of this example has upper surface side lifetime control regions 72, including a lifetime killer, locally provided in the depth direction (Z axis direction) of the semiconductor substrate. In FIG. 1a, a region in which the upper surface side lifetime control region 72 is provided, in the top view of the semiconductor substrate is indicated with a broken line portion.

The upper surface side lifetime control region 72 of this example may be continuously provided in the Y axis direction from the transistor portion 70 to the adjacent element portion 80, on the upper surface side of the semiconductor substrate. Specifically, the upper surface side lifetime control region 72 may be provided continuously from a region of the transistor portion 70 in contact with the boundary portion 90 to the boundary portion 90 and the diode portion 81 in the Y axis direction.

The upper surface side lifetime control region 72 of this example may be provided in at least a part of the transistor portion 70 and in at least a part of the adjacent element portion 80 in the X axis direction. The upper surface side lifetime control region 72 may be provided in a range covering at least some of the first mesa portions 60 in the transistor portion 70 and at least some of the mesa portions in the adjacent element portion 80, in the X axis direction. The upper surface side lifetime control region 72 may be provided in a range not overlapping the gate metal layer 50 and may be provided in a range overlapping the gate metal layer 50. A range of the upper surface side lifetime control region 72 in the Y axis direction will be described in detail with reference to FIG. 7a.

The upper surface side lifetime control region 72 may be provide in a part of the transistor portion 70 in the Y axis direction. The upper surface side lifetime control region 72 may be provided over the entirety of the adjacent element portion 80. The upper surface side lifetime control region 72 of this example is not provided in a part of a region, of the transistor portion 70, separated from the adjacent element portion 80 in the Y axis direction. The upper surface side lifetime control region 72 may be continuously provided in the entire range of the adjacent element portion 80 in the Y axis direction, and in parts of the two transistor portions 70 in contact with the adjacent element portion 80 in the Y axis direction.

The semiconductor device 100 of this example has a first lower surface side lifetime control region 74, including a lifetime killer, locally provided beneath the upper surface side lifetime control region 72 in the depth direction of the semiconductor substrate. Specifically, the first lower surface side lifetime control region 74 is provided at a position deeper than the upper surface side lifetime control region 72 with respect to the upper surface of the semiconductor substrate. A range where the first lower surface side lifetime control region 74 is provided in the top view is not limited to a range overlapping the upper surface side lifetime control region 72. In FIG. 1a, a region where the first lower surface side lifetime control region 74 is provided in the top view of the semiconductor substrate is indicated with a broken line portion. The lifetime killer is a recombination center of the carriers, may be crystal defects, and may be vacancy, divacancy, complex defect of these and an element of the semiconductor substrate 10, dislocation, a rare gas element such as helium and neon, a metal element such as platinum, and the like. With the lifetime killer implanted into the semiconductor substrate, the lifetime of the carriers in the semiconductor substrate can be adjusted.

The first lower surface side lifetime control region 74 of this example is provided over the entirety of the transistor portion 70 and in a part of the adjacent element portion 80, in the Y axis direction. The first lower surface side lifetime control region 74 may be provided in an adjacent region, of the adjacent element portion 80, in contact with the transistor portion 70. The first lower surface side lifetime control region 74 is continuously provided from the transistor portion 70 to the adjacent region of the adjacent element portion 80. A range of the first lower surface side lifetime control region 74 in the Y axis direction will be described in detail with reference to FIG. 7a.

The trench portions in the region where the upper surface side lifetime control region 72 is provided in the top view of the semiconductor substrate may all be the dummy trench portions 30. In this case, one or more dummy trench portions 30 are provided in an end portion of the transistor portion 70 in the Y axis direction. Thus, even when the upper surface side lifetime control region 72 is formed by implanting particle beams through the upper surface, the gate insulating film of the gate trench portion 40 can be prevented from being damaged by the particle beams. Thus, with the dummy trench portions 30 used for the trench portions in the upper surface side lifetime control region 72, fluctuation of a gate threshold and destruction of the gate insulating film can be prevented.

Figure 1B:
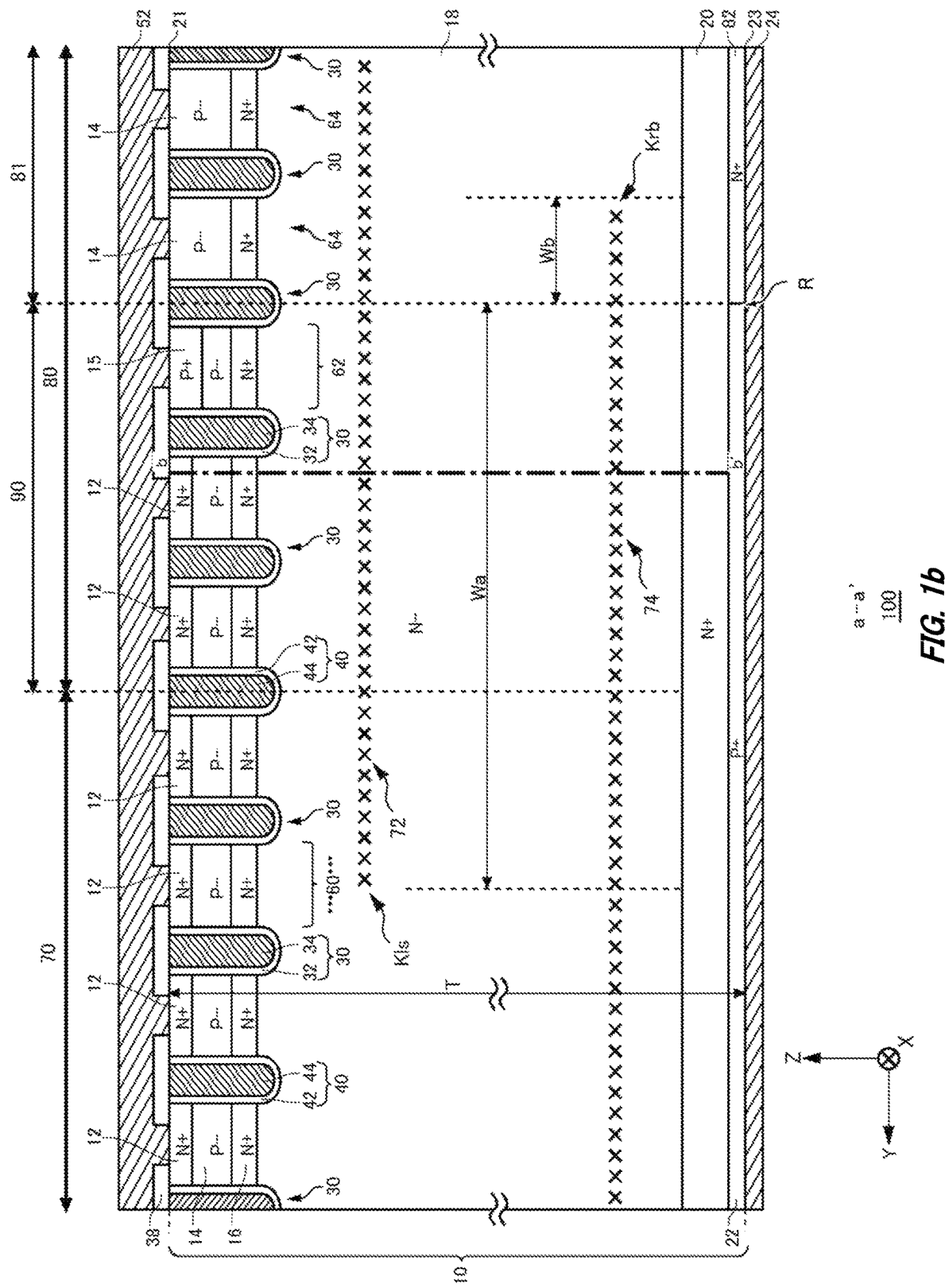

FIG. 1b is a diagram showing an example of the cross section taken along line a-a' in FIG. 1a. The a-a' cross section is a YZ plane passing through the emitter regions 12 of the transistor portion 70, the contact region 15 of the boundary portion 90, and the base regions 14 of the diode portion 81. In the a-a' cross section, the semiconductor device 100 of this example includes the semiconductor substrate 10, the inter-layer insulating film 38, the emitter electrode 52, and a collector electrode 24. The emitter electrode 52 is provided on an upper surface 21 of the semiconductor substrate 10 and on upper surfaces of inter-layer insulating films 38.

The collector electrode 24 is provided on a lower surface 23 of the semiconductor substrate 10. The emitter electrode 52 and the collector electrode 24 are formed of a conducting material such as metal.

The semiconductor substrate 10 may be a silicon substrate, may be a carbonized silicon substrate, a semiconductor substrate made of nitride such as gallium nitride, or the like. The semiconductor substrate 10 of this example is a silicon substrate.

The semiconductor substrate 10 includes a drift region 18 of the first conductivity type. For example, the drift region 18 of this example is of an N− type. The drift region 18 may be a region of the semiconductor substrate 10 remaining free of formation of other doped regions. Thus, the doping concentration of the drift region 18 may be the doping concentration of the semiconductor substrate 10.

The buffer region 20 of the first conductivity type may be provided beneath the drift region 18. For example, the buffer region 20 of this example is of the N+ type. The doping concentration of the buffer region 20 is higher than the doping concentration of the drift region 18. The buffer region 20 may function as a field stop layer that prevents a depletion layer spreading from the lower surface side of the base region 14 from reaching the collector region 22 of the second conductivity type and the cathode region 82 of the first conductivity type.

The diode portion 81 has a cathode region 82 of the first conductivity type provided beneath the buffer region 20. The transistor portion 70 and the boundary portion 90 have a collector region 22 of the second conductivity type provided beneath the buffer region 20.

The cathode region 82 may be provided at the same depth as the collector region 22 in the depth direction of the semiconductor substrate 10. With the cathode region 82 provided as the same depth as the collector region 22, the diode portion 81 may function as a Free Wheeling Diode (FWD) through which free wheeling current is conducted in an opposite direction when the transistor portion 70 of another semiconductor device 100 is turned OFF, in a power conversion circuit such as an inverter.

The collector region 22 may be provided to extend in the Y axis direction to the boundary portion 90. The collector region 22 may be provided over the entirety of the boundary portion 90. The collector region 22 of this example may be provided to extend in the Y axis direction to a region near the lower surface 23 of the second mesa portion 62 closest to the diode portion 81 in the boundary portion 90. With the collector region 22 extending to the lower surface 23 of the second mesa portion 62, a distance between the emitter region 12 of the transistor portion 70 and the cathode region 82 of the diode portion 81 can be provided. Furthermore, a distance between the emitter region 12 of the boundary portion 90 and the cathode region 82 of the diode portion 81 can also be provided. Thus, electrons implanted to the drift region 18 from a gate structure portion, including the emitter region 12 of the transistor portion 70 and the emitter region 12 of the boundary portion 90, can be prevented from flowing to the cathode region 82 of the diode portion 81.

In this example, a distance between the contact region 15 of the second mesa portion 62 and the cathode region 82 of the diode portion 81 can be made longer than that in a case where the cathode region 82 is provided to a portion immediately beneath the second mesa portion 62. Thus, implantation of holes to the cathode region 82 from the contact region 15 with a higher doping concentration than the base region 14 can be suppressed when current flows through the diode portion 81.

In the first mesa portion 60 and the second mesa portion 62, the accumulation region 16 of the first conductivity type may be provided above the drift region 18. For example, the accumulation region 16 of this example is of the N+ type. The accumulation region 16 is provided to be in contact with the gate trench portion 40. The accumulation region 16 may or may not be in contact with the dummy trench portion 30.

The doping concentration of the accumulation region 16 is higher than the doping concentration of the drift region 18. The accumulation region 16 may be a region where dopants of a conductivity type that is the same as that of the drift region 18 are accumulated. With the accumulation region 16 provided, carrier implantation enhancement effect (IE effect) can be improved, and thus ON voltage of the transistor portion 70 can be lowered.

In the first mesa portion 60 and the second mesa portion 62, the base region 14 of the second conductivity type is provided above the accumulation region 16. The base region 14 is provided to be in contact with the gate trench portion 40.

In the first mesa portion 60, the emitter region 12 is provided between the base region 14 and the upper surface 21. The emitter region 12 is provided to be in contact with the gate trench portion 40. The emitter region 12 may or may not be in contact with the dummy trench portion 30. The doping concentration of the emitter region 12 is higher than the doping concentration of the drift region 18. An example of the dopant in the emitter region 12 is arsenic (As).

In the second mesa portion 62, the contact region 15 of the second conductivity type is provided above the accumulation region 16. In the second mesa portion 62, the contact region 15 is provided to be in contact with the gate trench portion 40. In the second mesa portion 62, the emitter region 12 may not be provided.

In the third mesa portion 64, the accumulation region 16 of the first conductivity type may be provided above the drift region 18. In the third mesa portion 64, the base region 14 may be provided above the accumulation region 16. In the third mesa portion 64, the emitter region 12 may not be provided.

The upper surface 21 is provided with one or more trench portions 40 and one or more dummy trench portions 30. Each trench portion is provided from the upper surface 21 to the drift region 18. The trench portion are provided through regions, provided with at least any one of the emitter region 12, the contact region 15, and the accumulation region 16, to reach the drift region 18. The trench portions formed through the doped region are not limited to those formed in a sequence of forming the doped region and then forming the trench portions. The trench portions formed through the doped region includes trench portions formed in a sequence of forming the trench portions and then forming the doped region between the trench portions.

The gate trench portion 40 includes a gate trench, a gate insulating film 42, and a gate conductive portion 44 provided at the upper surface 21. The gate insulating film 42 is formed to cover an inner wall of the gate trench. The gate insulating film 42 may be formed by oxidizing or nitriding a semiconductor on the inner wall of the gate trench. In the gate trench, the gate conductive portion 44 is provided more inside than the gate insulating film 42. The gate insulating film 42 insulates the gate conductive portion 44 and the semiconductor substrate 10 from each other. The conductive portion 44 is formed of a conductive material such as polysilicon. The gate trench portion 40 is covered by an inter-layer insulating film 38 on the upper surface 21.

The gate conductive portion 44 has regions facing the base region 14 with the gate insulating film 42 provided in between. When a predetermined voltage is applied to the gate conductive portion 44, an electron inversion layer serving as a channel is formed on a surface of an interface of the base region 14, in contact with the gate trench.

In FIG. 1b, the dummy trench portion 30 may have the same structure as the gate trench portion 40. The dummy trench portion 30 has the dummy trench, a dummy insulating film 32, and a dummy conductive portion 34 provided in the region near the upper surface 21. The dummy insulating film 32 is formed to cover an inner wall of the dummy trench. The dummy conductive portion 34 is provided in the dummy trench and more inside than the dummy insulating film 32. The dummy insulating film 32 insulates the dummy conductive portion 34 and the semiconductor substrate 10 from each other. The dummy trench portion 30 is covered by the inter-layer insulating film 38 on the upper surface 21.

The semiconductor device 100 of this example has the first lower surface side lifetime control region 74 provided on the side of the lower surface 23 of the semiconductor substrate 10. The first lower surface side lifetime control region 74 of this example is continuously provided, in the Y axis direction, to the boundary portion 90 and the transistor portion 70 from a part of the diode portion 81. The side of the lower surface 23 of the semiconductor substrate 10 is a region beneath the upper surface side lifetime control region 72. The side of the lower surface 23 may indicate a region lower than the center of the semiconductor substrate 10 in the thickness direction. Thus, the first lower surface side lifetime control region 74 may be provided in a range that is ½ of a thickness T of the semiconductor substrate 10 from the lower surface 23 of the semiconductor substrate 10. Similarly, the side of the upper surface 21 of the semiconductor substrate 10 may indicate a region higher than the center of the semiconductor substrate 10 in the thickness direction. Thus, the side of the upper surface 21 of the semiconductor substrate 10 may indicate a range that is ½ of a thickness T of the semiconductor substrate 10 from the upper surface 21 of the semiconductor substrate 10. The first lower surface side lifetime control region 74 is provided in the region, of the diode portion 81, in contact with the boundary portion 90, and is not provided at least in a part of a region, of the diode portion 81, separated from the boundary portion 90. Thus, an end of the first lower surface side lifetime control region 74 in the Y axis direction (an end Krb on the negative side in the Y axis direction is shown in FIG. 1b) is provided in the diode portion 81.

The first lower surface side lifetime control region 74 may be continuously provided, in the Y axis direction, between two diode portions 81 sandwiching the transistor portion 70 therebetween in the Y axis direction. In this case, the first lower surface side lifetime control region 74 is provided over the entirety of the transistor portion 70 in the Y axis direction. A range of the first lower surface side lifetime control region 74 in the Y axis direction will be described with reference to FIG. 7a.

The first lower surface side lifetime control region 74 may be provided in a range that is ⅓ or ¼ of the thickness T of the semiconductor substrate 10 from the lower surface 23. With the first lower surface side lifetime control region 74 provided at a deep position, leak current in the transistor portion 70 can be suppressed.

The semiconductor device 100 of this example has the upper surface side lifetime control region 72 on the side of the upper surface 21. The upper surface side lifetime control region 72 of this example is continuously provided, in the Y axis direction, to the boundary portion 90 and the diode portion 81 from a part of the transistor portion 70. The upper surface side lifetime control region 72 is provided in a region, of the transistor portion 70, in contact with the boundary portion 90, and is not provided in at least a part of a region, of the transistor portion 70, separated from the boundary portion 90. Thus, an end of the upper surface side lifetime control region 72 in the Y axis direction (an end Kls on the positive side in the Y axis direction is shown in FIG. 1b) is provided in the transistor portion 70. The upper surface side lifetime control region 72 may be provided, in the Y axis direction, continuously between two transistor portions 70 sandwiching the adjacent element portion 80 therebetween in the Y axis direction. In this case, the upper surface side lifetime control region 72 is provided over the entirety of the adjacent element portion 80 in the Y axis direction.

The upper surface side lifetime control region 72 may be provided in a range that is ⅓ or ¼ of the thickness T of the semiconductor substrate 10 from the upper surface 21. Note that the upper surface side lifetime control region 72 is provided at a position deeper than a bottom of the trench portion. With the upper surface side lifetime control region 72 provided at a shallow position with respect to the upper surface 21, implantation of holes from the base region 14 of the diode portion 81 to the cathode region 82 can be suppressed. Thus, reverse recovery characteristics of the diode portion 81 can be improved. Furthermore, in the drift region 18 of the boundary portion 90, excessive accumulation of carriers at a higher concentration than the diode portion 81 is prevented, so that destruction in the boundary portion 90 at the time of switching can be prevented.

The upper surface side lifetime control region 72 and the first lower surface side lifetime control region 74 are locally provided in the depth direction of the semiconductor substrate 10. Specifically, the upper surface side lifetime control region 72 and the first lower surface side lifetime control region 74 have a higher defect density than other regions of the semiconductor substrate 10. An example of the lifetime killer is helium implanted at a predetermined depth position. By implanting helium, crystal defects can be formed in the semiconductor substrate 10.

With the lifetime killer implanted into the semiconductor substrate 10, a carrier lifetime of holes that are minority carriers produced in the drift region 18 can be shortened. On the other hand, the crystal defects and the like may lead to the leak current in the transistor portion 70. The upper surface side lifetime control region 72 is provided at a shallow position in the depth direction of the semiconductor substrate 10 with respect to the upper surface 21, and thus is more likely to cause the leak current in the transistor portion 70 than the first lower surface side lifetime control region 74. In the transistor portion 70, the upper surface side lifetime control region 72 does not exist in regions other than the region in contact with the boundary portion 90, and thus the semiconductor device 100 of this example can have the leak current in the transistor portion 70 more suppressed than in a case that the upper surface side lifetime control region 72 exists over the entirety of the transistor portion 70 in the Y axis direction.

In the transistor portion 70, the upper surface side lifetime control region 72 does not exist except for the region in contact with the boundary portion 90, and thus the semiconductor device 100 of this example can have a longer carrier lifetime than in a case where the upper surface side lifetime control region 72 exists over the entirety of the transistor portion 70 in the Y axis direction. Thus, tradeoff between the ON voltage and turn OFF power loss of the transistor portion 70 can be improved.

In a case that the first lower surface side lifetime control region 74 exists in addition to the upper surface side lifetime control region 72, a part of carriers drifting in the drift region 18 are recombined to disappear in both of the upper surface side lifetime control region 72 and the first lower surface side lifetime control region 74. In the semiconductor device 100 of this example, the lifetime of the carrier, implanted through the lower surface 23 of the semiconductor substrate 10, can be adjusted by adjusting the depth of the first lower surface side lifetime control region 74 from the lower surface 23. For example, when the distance between the first lower surface side lifetime control region 74 and the lower surface 23 is reduced, the carriers implanted through the lower surface 23 are more likely to be captured in the first lower surface side lifetime control region 74 to have a shorter average lifetime. Thus, the tradeoff between the ON voltage and the turn off power loss of the transistor portion 70 can be improved, while keeping the concentration and the depth position of the upper surface side lifetime control region 72, largely contributing to the leak current in the transistor portion 70, within a predetermined range. Even when the first lower surface side lifetime control region 74 is provided over the entirety of the transistor portion 70 in the Y axis direction, the characteristics of the transistor portion 70 change within the range of the tradeoff between the ON voltage and the turn off power loss. Thus, the characteristics of the transistor portion 70 are not compromised.

An end R is an end of the diode portion 81 in the Y axis direction. In this example, the end R is at a boundary between the cathode region 82 and the collector region 22. The diode portion 81 may have an end surface in parallel with an XZ plane at the end R.

A width Wa is a width, in the Y axis direction, from the end Kls of the upper surface side lifetime control region 72 in the Y axis direction to the end R. An end of the lifetime control region is a point at which the lifetime killer concentration starts to exceed the lifetime killer concentration in the drift region 18, in a case that a distribution of the lifetime killer concentration is measured from the drift region 18 toward the lifetime control region in the Y axis direction. Note that when this point is unidentifiable, the end may be a position at which the lifetime killer concentration becomes half (or ⅒) of the peak concentration in the lifetime control region.

A width Wb is a width from the end Krb of the first lower surface side lifetime control region 74 to the end R in the Y axis direction. The width Wa may be 3 times as large as the width Wb or more and 15 times as large as the width Wb or less. The width Wa may be equal to or larger than 90 µm and equal to or smaller than 150 The width Wb may be equal to or larger than 10 µm and equal to or smaller than 30 µm.

The semiconductor device 100 of this example has the first lower surface side lifetime control region 74 continuously provided from the transistor portion 70 to the diode portion 81, and provided over the entirety of the transistor portion 70 and in a part of the diode portion. Thus, implantation of the holes from the emitter region 12 of the transistor portion 70 and the emitter region 12 of the boundary portion 90 to the cathode region 82 of the diode portion 81 can be suppressed, when the diode portion 81 operates. Thus, the reverse recovery characteristics of the diode portion 81 can be improved.

Figure 1C:
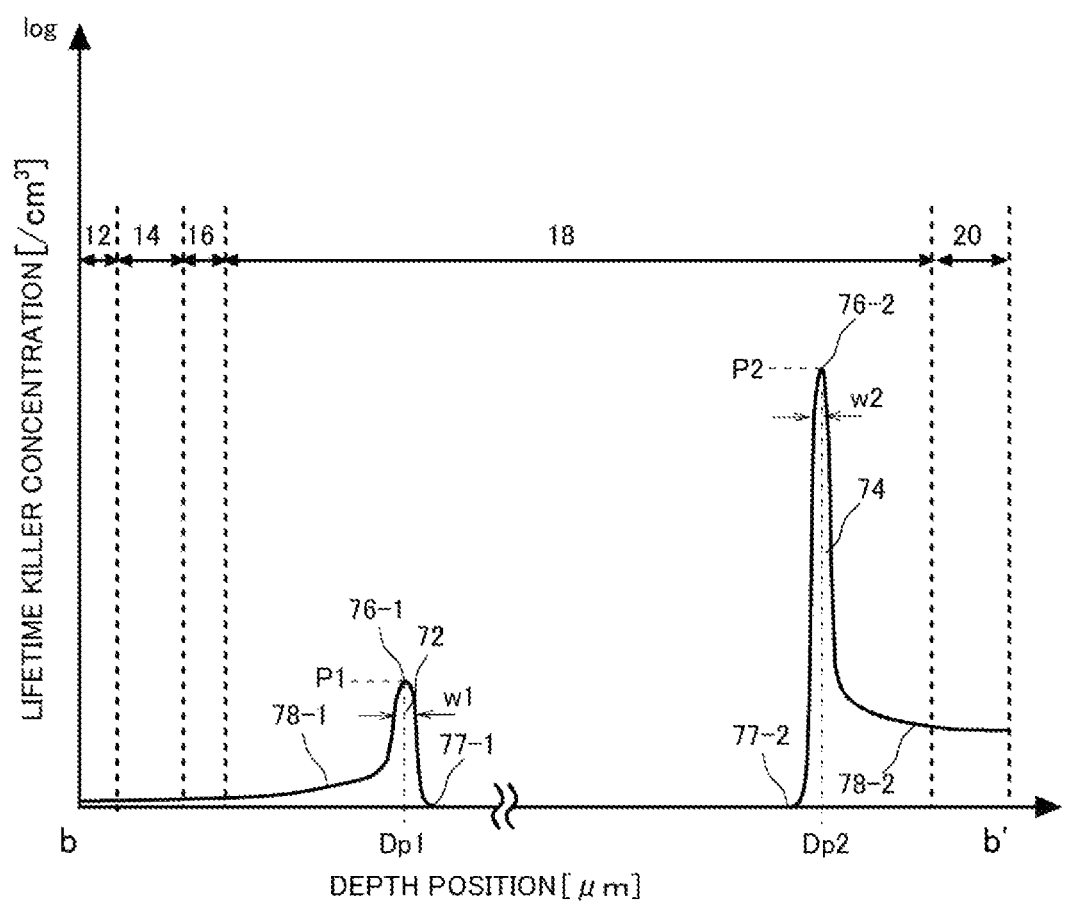
FIG. 1c is a diagram showing an example of a lifetime killer concentration distribution in an upper surface side lifetime control region 72 and a first lower surface side lifetime control region 74 in the cross section taken along line b-b' in FIG. 1b.

FIG. 1c is a diagram showing an example of a lifetime killer concentration distribution in the upper surface side lifetime control region 72 and the first lower surface side lifetime control region 74, in a b-b' cross section in FIG. 1b. In FIG. 1c, the vertical axis is a logarithmic axis indicating the lifetime killer concentration. The horizontal axis is a linear axis indicating a position in the depth direction of the semiconductor substrate 10. The upper surface side lifetime control region 72 is an example where helium ions are implanted through the upper surface 21. The first lower surface side lifetime control region 74 is an example where helium ions are implanted through the lower surface 23. In FIG. 1b, peak positions of the lifetime killer concentration in the lifetime control regions are indicated with x marks. In a case that helium ions and the like are implanted through the upper surface 21, a portion closer to the upper surface 21 than the peak position may have the lifetime killers distributed at a concentration lower than the peak concentration.

In a case that the first lower surface side lifetime control region 74 is formed by implanting helium ions through the lower surface 23, a portion closer to the lower surface 23 than the peak position may have the lifetime killers distributed at a concentration lower than the peak concentration (a tail part of the lifetime killers). This tail part 78-2 of the lifetime killers in the first lower surface side lifetime control region 74 is a region where the lifetime killers pass. The tail part 78-2 may be distributed from a lifetime implantation surface (the lower surface 23 in this example) to a peak concentration position 76-2. On the other hand, high concentration regions before and after the lifetime killer peak concentration position 76-2 in the first lower surface side lifetime control region 74 may be referred to as a lifetime killer range regions. The range region may include a region from the peak concentration position 76-2 to an end position 77-2 at which the concentration drops substantially to zero. The end position 77-2 of the first lower surface side lifetime control region 74 is positioned closer to the upper surface 21 than the peak position 76-2.

Similarly, in a case that the upper surface side lifetime control region 72 is formed by implanting helium ions through the upper surface 21, a portion closer to the upper surface 21 than the peak position may have the lifetime killers of a concentration lower than the peak concentration (a tail part 78-1 of the lifetime killers) distributed. This tail part 78-1 of the lifetime killers in the upper surface side lifetime control region 72 is a region where the lifetime killers pass. The tail part 78-1 may be distributed from a lifetime implantation surface (the upper surface 21 in this example) to a peak concentration position 76-1. On the other hand, high concentration regions before and after the peak concentration position 76-1 of the lifetime killers in the upper surface side lifetime control region 72 may be referred to as lifetime killer range regions. The range region may include a region from the peak concentration position 76-1 to an end position 77-1 at which the concentration drops substantially to zero. The end position 77-1 of the upper surface side lifetime control region 72 is positioned closer to the lower surface 23 than to the peak position 76-1.

A peak concentration P2 of the lifetime killer concentration in the first lower surface side lifetime control region 74 may be higher or lower than a peak concentration P1 of the upper surface side lifetime control region 72. The peak concentration P2 of the lifetime killer concentration in the first lower surface side lifetime control region 74 may be two to five times as high as the peak concentration P1 of the upper surface side lifetime control region 72.

A width w1 of the lifetime killer concentration distribution in the upper surface side lifetime control region 72 may be larger than a width w2 of the lifetime killer concentration distribution in the first lower surface side lifetime control region 74. The widths w1 and w2 may be a full width at half maximum (FWHM) of the peak concentration P1 or the peak concentration P2. Alternatively, the widths w1 and w2 may be a full width at a value that is 10% of the peak concentration P1 or the peak concentration P2 (F10% WHM). Alternatively, the widths w1 and w2 may be a full width at a value that is 1% of the peak concentration P1 or the peak concentration P2 (F1% WHM).

When the width w1 is larger than the width w2, a distance from the upper surface 21 to a depth position Dp1 with the peak concentration P1 may be longer than a distance from the lower surface 23 to a depth position Dp2 with the peak concentration P2. On the other hand, when the width w1 is smaller than the width w2, the distance from the upper surface 21 to the depth position Dp1 with the peak concentration P1 may be shorter than the distance from the lower surface 23 to the depth position Dp2 with the peak concentration P2. In a case that the peak concentration position is set have a large width in the depth direction of the semiconductor substrate 10, a gently-sloped recombination center concentration distribution can be achieved by forming the lifetime control region to have a large width in the depth direction. Thus, the leak current can be prevented from sharply increasing in response to a rise in the applied voltage.

The concentration distribution in the upper surface side lifetime control region 72 and the first lower surface side lifetime control region 74 indicated by the vertical axis in FIG. 1c may be a helium concentration or may be a density of crystal defects formed by helium implantation. The crystal defects may be interstitial helium, vacancy, divacancy, and the like. With these crystal defects, the recombination centers of the carriers are formed. The recombination of the carriers is facilitated via an energy level (trap level) of the recombination center formed. The lifetime killer concentration corresponds to the trap level density. The concentration distribution in the upper surface side lifetime control region 72 and the first lower surface side lifetime control region 74, indicated by the vertical axis in FIG. 1c, may be the recombination center concentration or may be the recombination center density of the energy-level.

The peak concentration position 76-2 in the first lower surface side lifetime control region 74 may be closer to the upper surface 21 than the buffer region 20, or may be inside the buffer region 20. In this example, the peak concentration position 76-2 in the first lower surface side lifetime control region 74 may be closer to the upper surface 21 than the buffer region 20.

The position 76-1 of the peak concentration in the upper surface side lifetime control region 72 may be closer to the lower surface 23 than the bottom of the trench portion, or may be inside the first mesa portion 60, the second mesa portion 62, or the third mesa portion 64. As described above, the first mesa portion 60, the second mesa portion 62, or the third mesa portion 64 is a region closer to the upper surface 21 than the bottom of the trench portion. In this example, the peak concentration position in the upper surface side lifetime control region 72 is closer to the lower surface 23 than the bottom of the trench portion.

The peak concentration position in the upper surface side lifetime control region 72 may be provided at a position deeper than the center in the depth direction of the semiconductor substrate 10 that is, a position at a depth T/2 from the upper surface 21). In this case, the tail part 78-1 of the upper surface side lifetime control region 72 may be provided closer to the upper surface 21 than the peak concentration position 76-1. Thus, in particular, the carriers accumulated on the side of the upper surface 21 in the diode portion 81 are reduced, whereby soft recovery can be achieved.

In this example, the lifetime killer concentration P2 of the first lower surface side lifetime control region 74 is set to be higher than the lifetime killer concentration P1 of the upper surface side lifetime control region 72, so that the lifetime killer concentration of the semiconductor substrate 10 as a whole can be increased, while maintaining the lifetime killer concentration of the upper surface side lifetime control region 72 contributing to the leak current. Thus, the tradeoff between the ON voltage and the turn off power loss of the transistor portion 70 can be adjusted, while maintaining the leak current characteristics of the transistor portion 70.

Figure 2A:
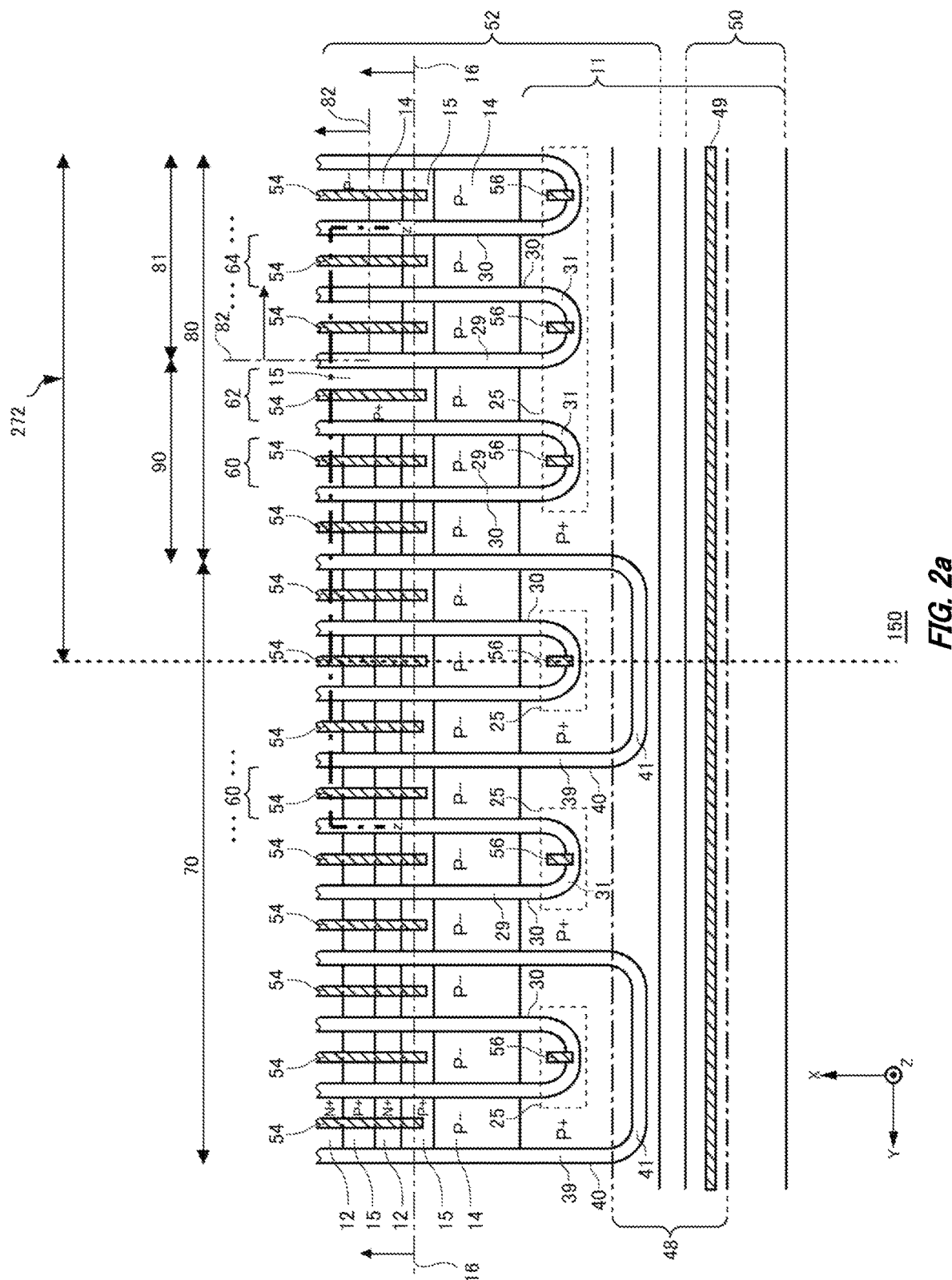
FIG. 2a is a diagram showing a part of an upper surface of a semiconductor device 150 of a comparative example.

FIG. 2a is a diagram partially showing an upper surface of a semiconductor device 150 according to a comparative example. The semiconductor device 150 in FIG. 2a is not provided with the first lower surface side lifetime control region 74 on the side of the lower surface 23. An upper surface side lifetime control region 272 is provided at a position that is the same as that in FIG. 1a in the top view of the semiconductor substrate 10.

Figure 2B:
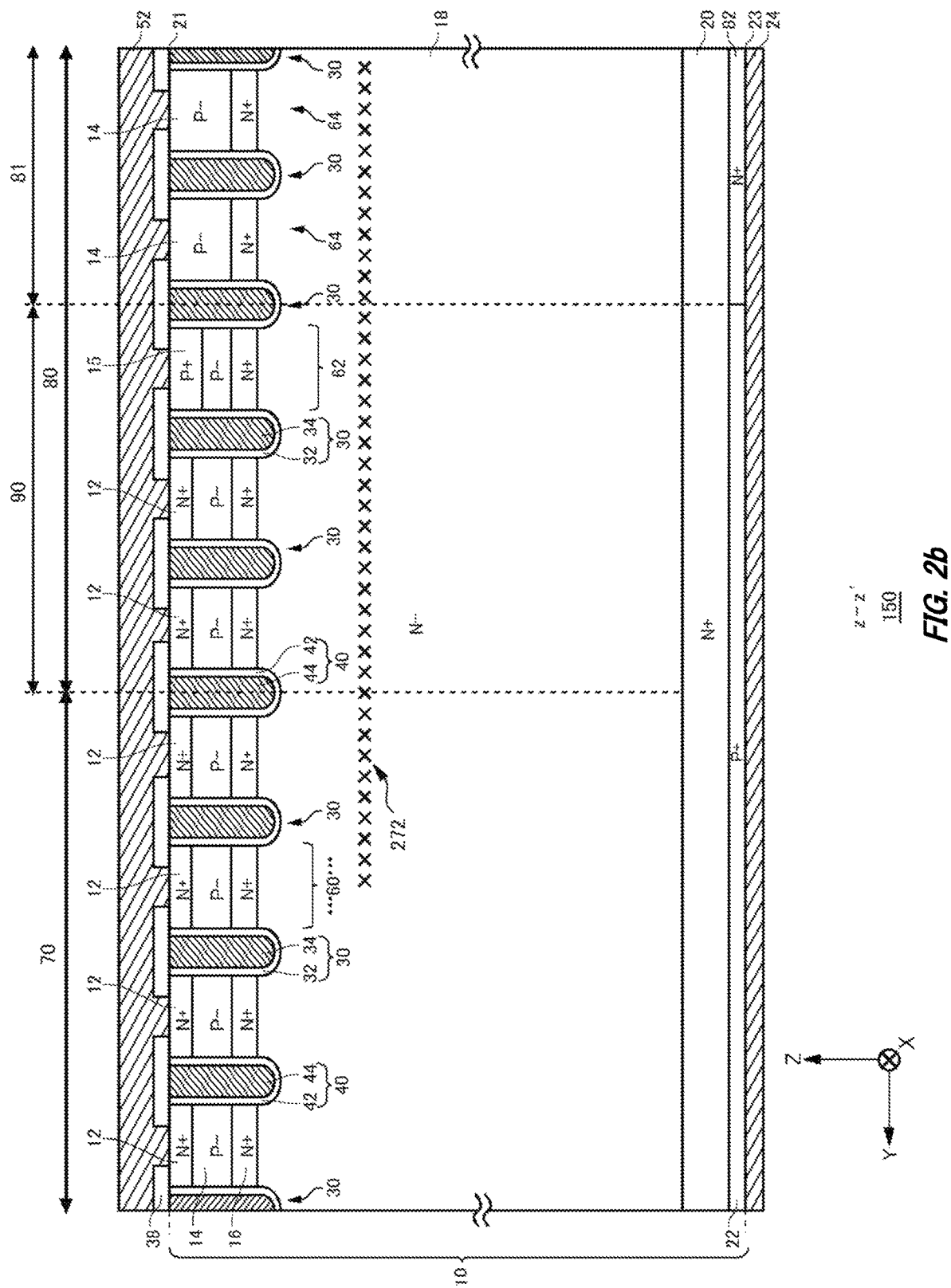

FIG. 2b is a diagram showing the cross section taken along line z-z' in FIG. 2a. As shown in FIG. 2b, the semiconductor device 150 of the comparative example is not provided with the first lower surface side lifetime control region 74 on the side of the lower surface 23. The upper surface side lifetime control region 272 is provided at the same position as the corresponding one in FIG. 1b in the z-z' cross section.

The semiconductor device 150 of the comparative example does not have the first lower surface side lifetime control region 74, and thus the hole implantation from the emitter side of the transistor portion 70 and the flowing of the implanted holes to the cathode region 82 cannot be suppressed when the diode portion 81 operates. Furthermore, the depth of the first lower surface side lifetime control region 74 and the like cannot be adjusted. Thus, the leak current characteristics of the transistor portion 70 cannot be improved, and the tradeoff between the ON voltage and the turn off power loss of the transistor portion 70 cannot be improved.

Figure 3A:
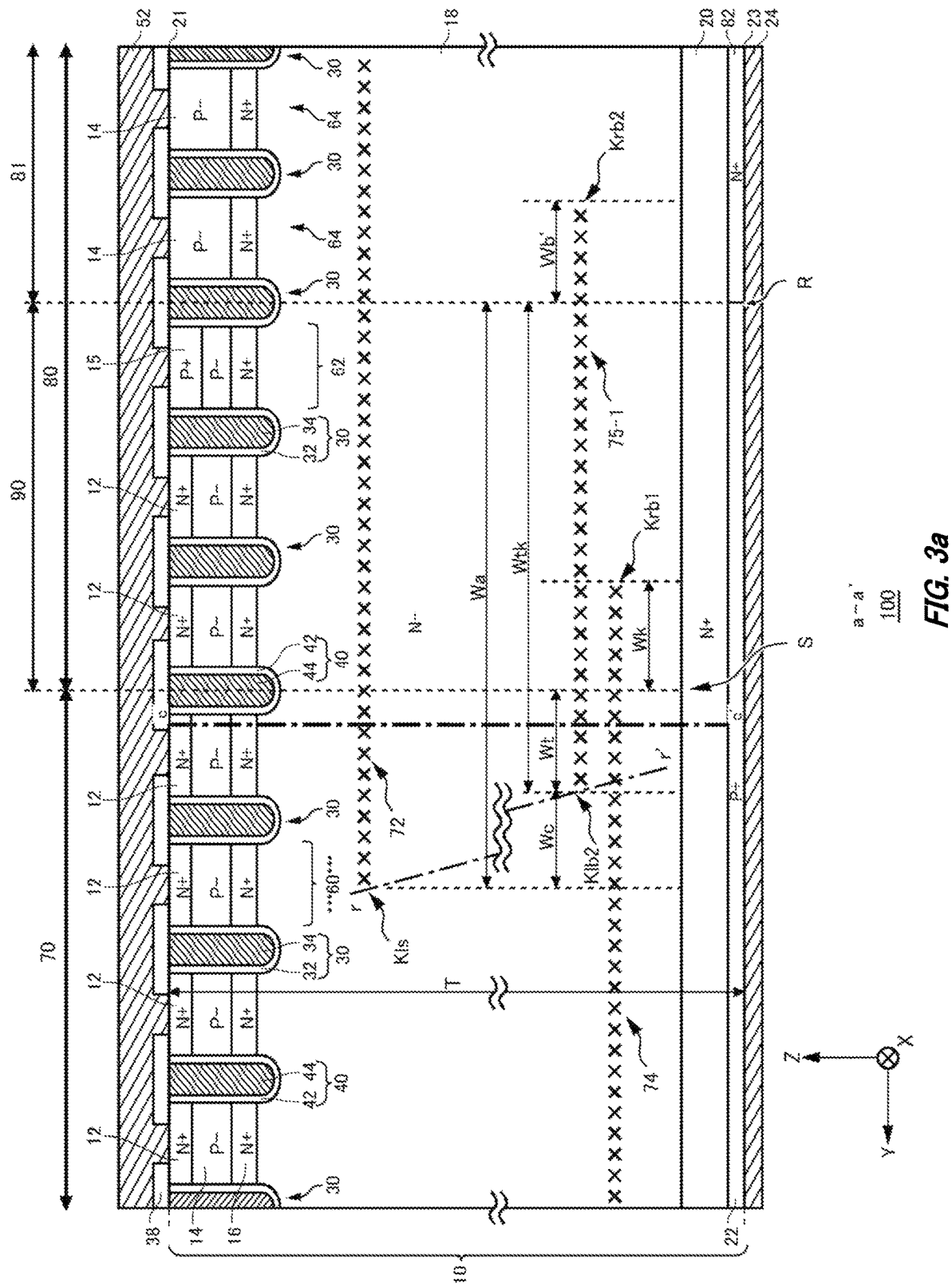

FIG. 3a is a diagram showing another example of the a-a' cross section in FIG. 1a. A semiconductor device 100 shown in FIG. 3a is different from the semiconductor device 100 shown in FIG. 1b in that a second lower surface side lifetime control region 75-1 is further provided in the semiconductor device 100 shown in FIG. 1b. Furthermore, the semiconductor device 100 shown in FIG. 3a is different from the semiconductor device 100 shown in FIG. 1b in that an end Krb1 of the first lower surface side lifetime control region 74 is provided in the boundary portion 90 in the Y axis direction.

The second lower surface side lifetime control region 75-1 is provided on the side of the lower surface 23. The second lower surface side lifetime control region 75-1 is provided at a deeper position than the first lower surface side lifetime control region 74 with respect to the lower surface 23. The second lower surface side lifetime control region 75-1 of this example is arranged between the first lower surface side lifetime control region 74 and the upper surface side lifetime control region 72 in the depth direction. The second lower surface side lifetime control region 75-1 may be provided to overlap the first lower surface side lifetime control region 74 in the top view of the semiconductor substrate 10. The second lower surface side lifetime control region 75-1 may be continuously provided in the Y axis direction from the transistor portion 70 to the adjacent element portion 80. The second lower surface side lifetime control region 75-1 of this example has one end Klb2 in the Y axis direction provided in the transistor portion 70 and has the other end Krb2 provided in the adjacent element portion 80. More specifically, the end Krb2 is provided in the diode portion 81.

In the semiconductor device 100 of this example, a width Wb' is a width, in the Y axis direction, from the end Krb2 of the second lower surface side lifetime control region 75-1 in the Y axis direction to the end R. A width Wc is a width, in the Y axis direction, from an end Kls of the upper surface side lifetime control region 72 in the Y axis direction to an end Klb2 of the second lower surface side lifetime control region 75-1 in the Y axis direction. The end portion Kls of this example is provided in the transistor portion 70. A width Wtk is a width, in the Y axis direction, from the end Klb2 of the second lower surface side lifetime control region 75-1 in the Y axis direction to the end R.

An end S is an end of the transistor portion 70 in the Y axis direction as shown in FIG. 3a. In this example, the end S is at the center, in the Y axis direction, of the gate trench portion 40 arranged closest to the diode portion 81 in the Y axis direction. An XZ plane passing through the end S is defined as a boundary between the transistor portion 70 and the adjacent element portion 80. In the semiconductor device 100 of this example, a width Wt is a width, in the Y axis direction, between the end Klb2 of the second lower surface side lifetime control region 75-1 in the Y axis direction and the end S. A width Wk is a width, in the Y axis direction, between the end S and the end Krb1 of the first lower surface side lifetime control region 74 in the Y axis direction. The end Krb1 is provided in the adjacent element portion 80.

In the semiconductor device 100 of this example, the width Wa may be 3 times as large as the width Wb' or more and 15 times as large as the width Wb' or less. The width We may be 0.1 times as large as the width Wa or more and 0.3 times as large as the width Wa or less. The width Wtk may be 0.5 times as large as the width Wa or more and 0.9 times as large as the width Wa or less. The width Wt may be 0.1 times as large as the width Wa or more and 0.3 times as large as the width Wa or less. The width Wk may 0.05 times as large as the width Wa or more and 0.2 times as large as the width Wa or less.

In the semiconductor device 100 of this example, the width Wa may be equal to or larger than 90 μm and equal to or smaller than 150 μm. The width Wb' may be equal to or larger than 10 μm and equal to or smaller than 30 μm. The width We may be equal to or larger than 20 μm and equal to or smaller than 30 μm. The width Wtk may be equal to or larger than 80 μm and equal to or smaller than 120 μm. The width t may be equal to or larger than 20 μm and equal to or smaller than 30 μm. The width Wk may be equal to or larger than 10 μm and equal to or smaller than 20 μm.

The second lower surface side lifetime control region 75-1 may be provided continuously from the transistor portion 70 to the adjacent element portion 80 in the Y axis direction. The second lower surface side lifetime control region 75-1 may be provided in a part of the transistor portion 70 and in a part of the adjacent element portion 80. Thus, implantation of holes from the emitter region 12 of the transistor portion 70 and the emitter region 12 of the boundary portion 90 to the cathode region 82 of the diode portion 81 can be suppressed, when the diode portion 81 operates. Thus, the reverse recovery characteristics of the diode portion 81 can be improved, and furthermore, switching destruction of the boundary portion 90 can be prevented.

In the transistor portion 70, the position of the end Klb2 of the second lower surface side lifetime control region 75-1 in the Y axis direction may be closer to the adjacent element portion 80 (or the diode portion 81) than the end Kls of the upper surface side lifetime control region 72 is. Thus, in the Y axis direction, the length of the second lower surface side lifetime control region 75-1 provided in the transistor portion 70 is shorter than the length of the upper surface side lifetime control region 72 provided in the transistor portion 70. With the end Klb2 provided closer to the adjacent element portion 80 than the end Kls is, the implantation of holes from the emitter region 12 of the transistor portion 70 and the emitter region 12 of the boundary portion 90 to the cathode region 82 of the diode portion 81 can be suppressed, when the diode portion 81 operates. Thus, the reverse recovery characteristics of the diode portion 81 can be improved, and furthermore, the switching destruction of the boundary portion 90 can be prevented.

The collector region 22 may be provided on an extension of a path reaching the end Klb2 from the end Kls, as indicated by a line r-r' in FIG. 3a. Thus, a straight line connecting the end Kls and the end Klb2 to each other may cross the collector region 22. The straight line may also cross the first lower surface side lifetime control region 74. With the straight line connecting the end Kls and the end Klb2 to each other provided to cross the collector region 22, some of the holes moving from the emitter region 12 of the transistor portion 70 and from the emitter region 12 of the boundary portion 90 to the cathode region 82 of the diode portion 81 are likely to recombine and disappear in the lifetime control region such as the first lower surface side lifetime control region 74. Thus, in the semiconductor device 100 of this example, implantation of holes from the emitter region 12 of the transistor portion 70 and the emitter region 12 of the boundary portion 90 to the cathode region 82 of the diode portion 81 can be suppressed when the diode portion 81 operates. Thus, the reverse recovery characteristics of the diode portion 81 can be improved, and furthermore, the switching destruction of the boundary portion 90 can be prevented At the end S, the first lower surface side lifetime control region 74 and the second lower surface side lifetime control region 75-1 may overlap in the depth direction of the semiconductor substrate 10 as shown in FIG. 3a. The first lower surface side lifetime control region 74 and the second lower surface side lifetime control region 75-1 may overlap in a region of the transistor portion 70 in contact with the boundary portion 90 in the Y axis direction. Furthermore, the first lower surface side lifetime control region 74 and the second lower surface side lifetime control region 75-1 may overlap in a region of the boundary portion 90 in contact with the transistor portion 70. The first lower surface side lifetime control region 74 and the second lower surface side lifetime control region 75-1 may overlap both of the transistor portion 70 and the boundary portion 90.

In the semiconductor device 100 of this example, at the end S, the first lower surface side lifetime control region 74 and the second lower surface side lifetime control region 75-1 overlap in the depth direction of the semiconductor substrate 10. Thus, some of the holes moving from the emitter region 12 of the transistor portion 70 to the cathode region 82 of the diode portion 81 are more likely to recombine and disappear, than in a case where the first lower surface side lifetime control region 74 and the second lower surface side lifetime control region 75-1 do not overlap in the depth direction of the semiconductor substrate 10 at the end S. Thus, the reverse recovery characteristics of the diode portion 81 can further be improved over that in the semiconductor device 100 shown in FIG. 1a, and furthermore, the switching destruction of the boundary portion 90 can be prevented.

The first lower surface side lifetime control region 74 and the second lower surface side lifetime control region 75-1 may not overlap in the depth direction of the semiconductor substrate 10 at the end R, as shown in FIG. 3a. In the semiconductor device 100 of this example, the second lower surface side lifetime control region 75-1 is provided continuously in the Y axis direction from the transistor portion 70 to the diode portion 81. Thus, even when the first lower surface side lifetime control region 74 is not provided at the end R, due to the presence of the second lower surface side lifetime control region 75-1, implantation of holes from the emitter region 12 of the transistor portion 70 and the emitter region 12 of the boundary portion 90 to the cathode region 82 of the diode portion 81 can be suppressed when the diode portion 81 operates. Thus, the reverse recovery characteristics of the diode portion 81 can be improved, and furthermore, the switching destruction of the boundary portion 90 can be prevented The first lower surface side lifetime control region 74 may be provided continuously from the transistor portion 70 to the boundary portion 90 in the Y axis direction. The first lower surface side lifetime control region 74 may not be provided in a part of the boundary portion 90 in contact of the diode portion 81 and may not be provided in the diode portion 81. With the first lower surface side lifetime control region 74 not provided in the region of the boundary portion 90 in contact with the diode portion 81, holes can be implanted to the diode portion 81 from the collector region 22 of the boundary portion 90. Thus, excellent soft recovery characteristics of the diode portion 81 can be achieved.

Figure 3B:
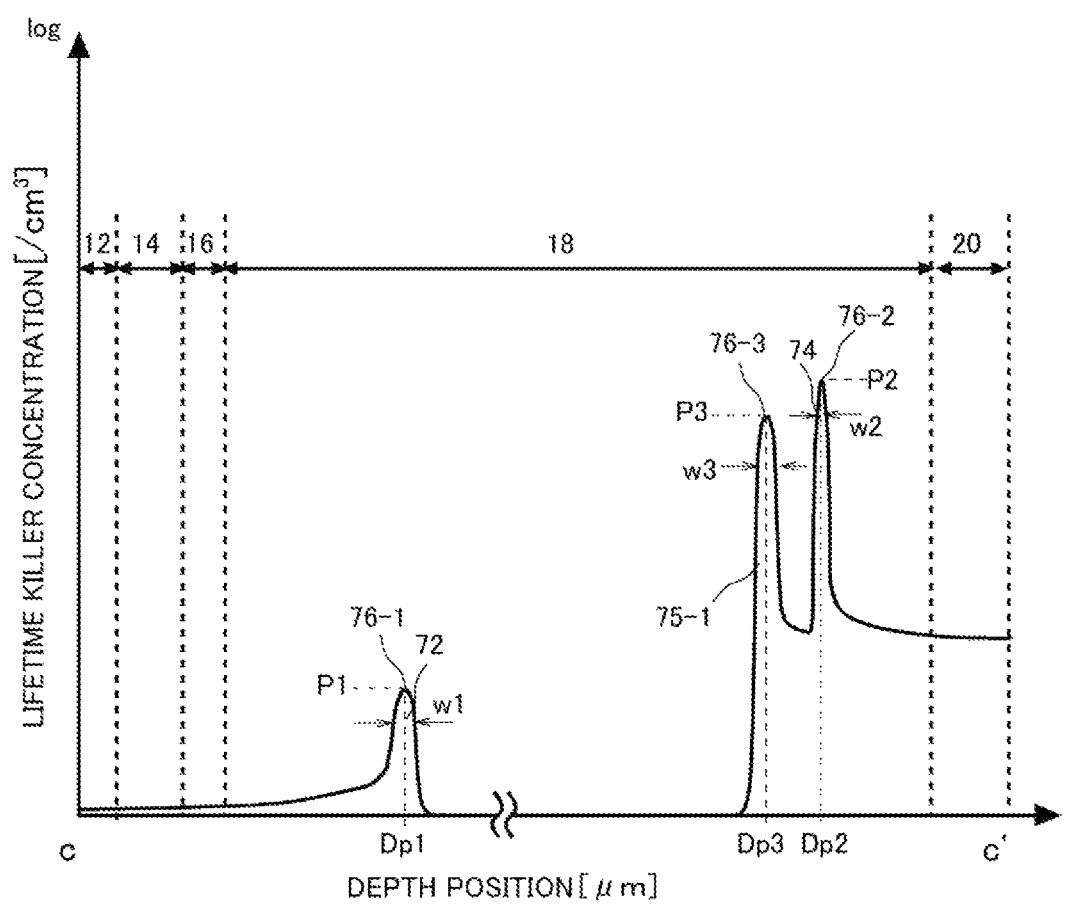

FIG. 3*b* is a diagram showing an example of a lifetime killer concentration distribution in the upper surface side lifetime control region 72, the first lower surface side lifetime control region 74, and the second lower surface side lifetime control region 75-1 in a c-c' cross section in FIG. 3*a*. In FIG. 3*b*, the vertical axis is a logarithmic axis indicating the lifetime killer concentration. The horizontal axis is a linear axis indicating a position in the depth direction of the semiconductor substrate 10. The upper surface side lifetime control region 72 is an example where helium ions are implanted through the upper surface 21. The first lower surface side lifetime control region 74 is an example where helium ions are implanted through the lower surface 23. In FIG. 3*a*, peak positions of the lifetime killer concentration in the lifetime control regions are indicated with x marks. in a case that helium ions and the like are implanted through the upper surface 21, a portion closer to the upper surface 21 than the peak position may have the lifetime killers distributed at a concentration lower than the peak concentration.

As shown in FIG. 3*b*, the peak concentration P2 of the lifetime killer concentration in the first lower surface side lifetime control region 74 may be higher than a peak concentration P3 of the lifetime killer concentration in the second lower surface side lifetime control region 75-1 provided closer to the upper surface 21 than the first lower surface side lifetime control region 74. The lifetime killer concentration P2 in the first lower surface side lifetime control region 74 may be two to five times as high as the lifetime killer concentration P3 in the second lower surface side lifetime control region 75-1.

The width w1 of the lifetime killer concentration distribution in the upper surface side lifetime control region 72 may be larger than a width w3 of the lifetime killer concentration distribution in the second lower surface side lifetime control region 75-1. The width w3 of the lifetime killer concentration distribution in the second lower surface side lifetime control region 75-1 may be larger than the width w2 of the lifetime killer concentration distribution in the first lower surface side lifetime control region 74.

The concentration distribution in the upper surface side lifetime control region 72, the first lower surface side lifetime control region 74, and the second lower surface side lifetime control region 75-1 indicated by the vertical axis in FIG. 3*b* may be a helium concentration or may be a density of crystal defects formed by helium implantation. The crystal defects may be interstitial helium, vacancy, diva- cancy, and the like. With these crystal defects, the recombination centers of the carriers are formed. The concentration distribution in the upper surface side lifetime control region 72, the first lower surface side lifetime control region 74, and the second lower surface side lifetime control region 75-1, indicated by the vertical axis in FIG. 3*b*, may be the recombination center concentration or may be the recombination center density of the energy-level.

The positions 76-2, 76-3 of the peak concentration in the first lower surface side lifetime control region 74 and the second lower surface side lifetime control region 75-1 may be closer to the upper surface 21 than the buffer region 20, or may be inside the buffer region 20. In this example, the positions 76-2, 76-3 of the peak concentration in the first lower surface side lifetime control region 74 and the second lower surface side lifetime control region 75-1 may be closer to the upper surface 21 than the buffer region 20.

The lifetime killer concentration P2 in the first lower surface side lifetime control region 74 may be higher than the lifetime killer concentration P3 in the second lower surface side lifetime control region 75-1. With the second lower surface side lifetime control region 75-1 provided, the entire lifetime killer concentration of semiconductor substrate 10 may be increased without increasing the lifetime killer concentration in the upper surface side lifetime control region 72. Thus, the leak current characteristics of the transistor portion 70 related to the lifetime killers in the upper surface side lifetime control region 72 can be improved over those in the semiconductor device 100 shown in FIG. 1*b*. Furthermore, excellent tradeoff between the ON voltage and the turn off power loss of the transistor portion 70 can be achieved.

Figure 3C:
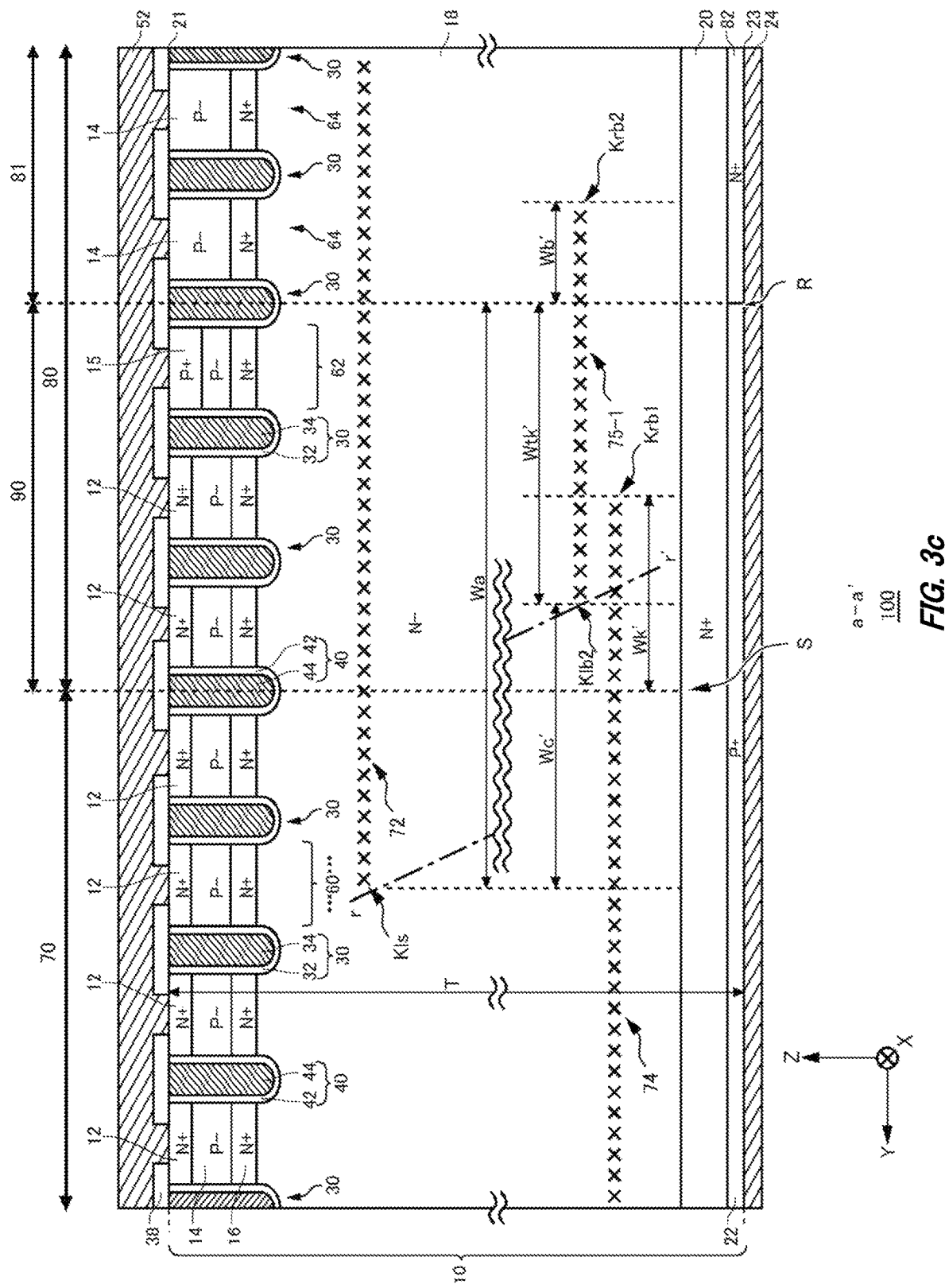

FIG. 3*c* is a diagram showing another example of the a-a' cross section in Fig. FIG. 1*a*. The semiconductor device 100 shown in FIG. 3*c* is different from the semiconductor device 100 shown in FIG. 3*a* in that the end Klb2 in the Y axis direction of the second lower surface side lifetime control region 75-1 is provided in the boundary portion 90. Specifically, in the semiconductor device 100 of this example, the second lower surface side lifetime control region 75-1 is provided continuously in the Y axis direction from the boundary portion 90 to the diode portion 81. The transistor portion 70 is not provided with the second lower surface side lifetime control region 75-1. The end Krb1 in the Y axis direction of the first lower surface side lifetime control region 74 is provided in the boundary portion 90, as in the semiconductor device 100 shown in FIG. 3*a*.

In the semiconductor device 100 of this example, the width Wc' may be 0.1 times as large as the width Wa or more and 0.3 times as large as the width Wa or less. The width Wtk' may be 0.3 times as large as the width Wa or more and 0.8 times as large as the width Wa or less. The width Wt' may be 0.1 times as large as the width Wa or more and 0.3 times as large as the width Wa or less. The width Wt' may be 0.25 times as large as the width Wa or more and 0.6 times as large as the width Wa or less.

In the semiconductor device 100 of this example, the width Wc' may be equal to or larger than 50 μm and equal to or smaller than 70 μm. The width Wtk' may be equal to or larger than 50 μm and equal to or smaller than 80 μm. The width Wt' may be equal to or larger than 20 μm and equal to or smaller than 30 μm. The width Wk' may be equal to or larger than 40 μm and equal to or smaller than 60 μm.

In the semiconductor device 100 of this example, as shown in FIG. 3*c*, the first lower surface side lifetime control region 74 and the second lower surface side lifetime control region 75-1 overlap in the depth direction of the semiconductor substrate 10 in the boundary portion 90. A transistor side region of the boundary portion 90, in contact with the transistor portion 70, may be provided with the first lower surface side lifetime control region 74 and may not be provided with the second lower surface side lifetime control region 75-1. A diode side region of the boundary portion 90, in contact with the diode portion 81, may be provided with the second lower surface side lifetime control region 75-1 and may not be provided with the first lower surface side lifetime control region 74. In the boundary portion 90, an intermediate region between the transistor side region and the diode side region may be provided with both of the first lower surface side lifetime control region 74 and the second lower surface side lifetime control region 75-1. In the semiconductor device 100 of this example, the first lower surface side lifetime control region 74 and the second lower surface side lifetime control region 75-1 overlap in the Z axis direction in the boundary portion 90, whereby some of the holes moving from the emitter region 12 of the transistor portion 70 and the emitter region 12 of the boundary portion 90 to the cathode region 82 of the diode portion 81 recombine and disappear. Thus, the reverse recovery characteristics of the diode portion 81 can be improved.

In the semiconductor device 100 of this example, the second lower surface side lifetime control region 75-1 is provided continuously from the boundary portion 90 and to the diode portion 81 in the Y axis direction. Thus, even though the first lower surface side lifetime control region 74 is not provided in the diode portion 81, implantation of holes from the emitter region 12 of the transistor portion 70 and the emitter region 12 of the boundary portion 90 to the cathode region 82 of the diode portion 81 can be suppressed. Thus, the reverse recovery characteristics of the diode portion 81 can be improved as in the semiconductor device 100 shown in FIG. 3a.

In the semiconductor device 100 of this example, the end Klb2 of the second lower surface side lifetime control region 75-1 is provided closer to the diode portion 81 than the end Kls of the upper surface side lifetime control region 72 in the Y axis direction, as in the semiconductor device 100 shown in FIG. 3a. Thus, the reverse recovery characteristics of the diode portion 81 can be improved as in the semiconductor device 100 shown in FIG. 3a.

In the semiconductor device 100 of this example, the collector region 22 is provided on an extension of a path from the end Kls to the end Klb, as indicated by a line r-r' in FIG. 3c. Thus, as in the semiconductor device 100 shown in FIG. 3a, the reverse recovery characteristics of the diode portion 81 can be improved. The first lower surface side lifetime control region 74 may also be provided on the extension of the path.

In the semiconductor device 100 of this example, the first lower surface side lifetime control region 74 and the second lower surface side lifetime control region 75-1 do not overlap in the Z axis direction at the end R. In the semiconductor device 100 of this example, the second lower surface side lifetime control region 75-1 is provided continuously from the boundary portion 90 to the diode portion 81 in the Y axis direction. Thus, even though the first lower surface side lifetime control region 74 is provided in the diode portion 81, implantation of holes from the emitter region 12 of the transistor portion 70 and the emitter region 12 of the boundary portion 90 to the cathode region 82 of the diode portion 81 can be suppressed. Thus, as in the semiconductor device 100 shown in FIG. 3a, the reverse recovery characteristics of the diode portion 81 can be improved.

In the semiconductor device 100 of this example, as in the semiconductor device 100 shown in FIG. 3a, the first lower surface side lifetime control region 74 may be provided continuously, in the Y axis direction, from the transistor portion 70 to a partial region of the boundary portion 90. The first lower surface side lifetime control region 74 may not be provided in a part of the boundary portion 90 and may not be provided in the diode portion 81. With the first lower surface side lifetime control region 74 not provided in a part of the boundary portion 90, implantation of holes from the collector region 22 of the boundary portion 90 into the diode portion 81 is not hindered. Thus, excellent soft recovery characteristics of the diode portion 81 can be achieved.

Figure 4A:
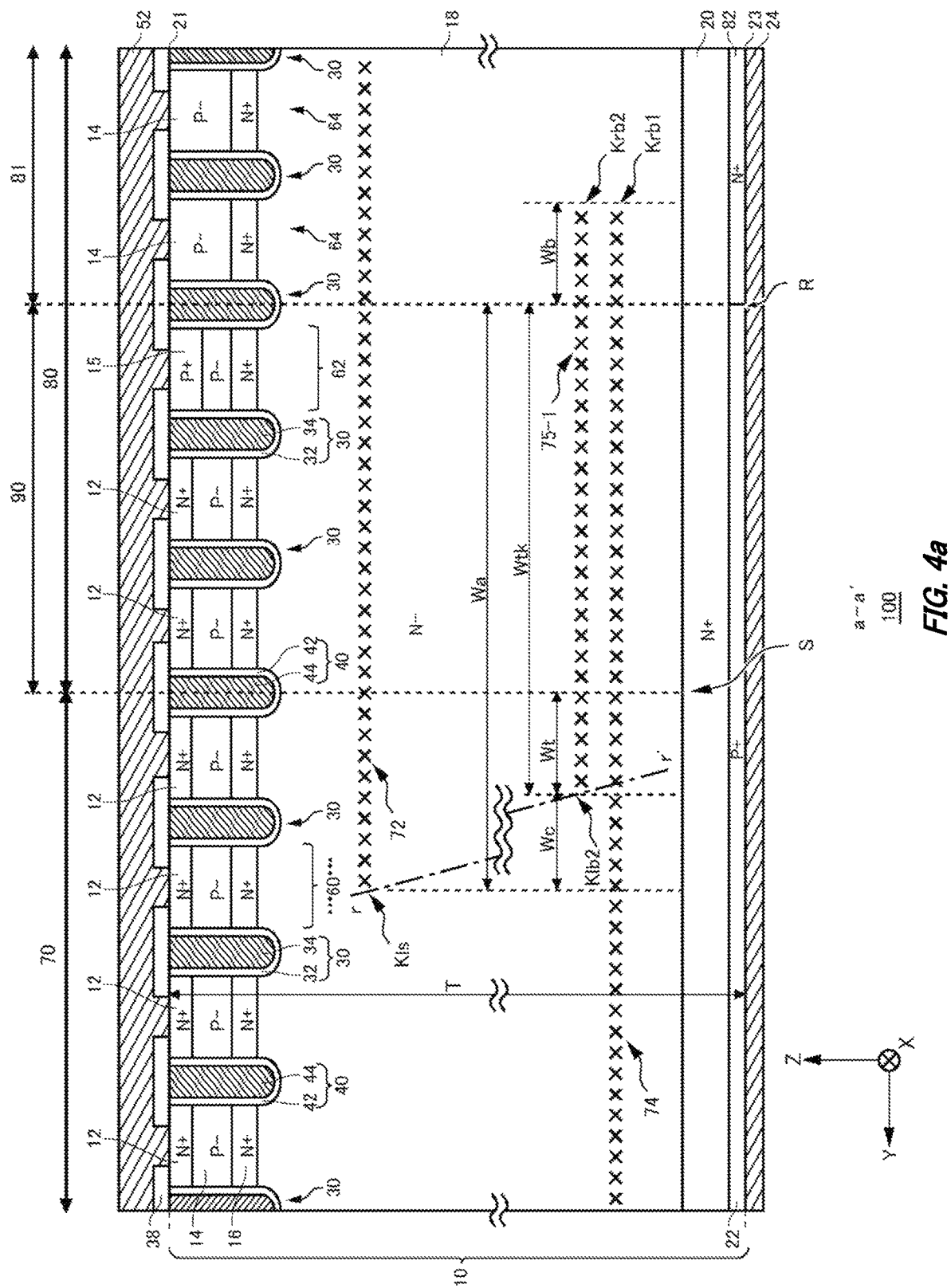

FIG. 4a is a diagram showing another example of the a-a' cross section in FIG. 1a. A semiconductor device 100 shown in FIG. 4a is different from the semiconductor device 100 shown in FIG. 3a in that the first lower surface side lifetime control region 74 is provided continuously in the Y axis direction from the transistor portion 70 to a partial region of the diode portion 81 in contact with the boundary portion 90. The end Krb1 of the first lower surface side lifetime control region 74 in the Y axis direction and the end Krb2 of the second lower surface side lifetime control region 75-1 in the Y axis direction are provided in the diode portion 81. The positions of the end Krb1 and the end Krb2 in the Y axis direction may or may not match.

In the semiconductor device 100 of this example, as shown in FIG. 4a, the first lower surface side lifetime control region 74 and the second lower surface side lifetime control region 75-1 overlap in the depth direction of the semiconductor substrate 10 at both of the end S and the end R. The first lower surface side lifetime control region 74 and the second lower surface side lifetime control region 75-1 of this example overlap in the Z axis direction in a region of the transistor portion 70 in contact with the boundary portion 90 in the Y axis direction, in the entirety of the boundary portion 90, and in a region of the diode portion 81 in contact with the boundary portion 90. Thus, holes flowing to the vicinity of the end R of the cathode region 82 of the diode portion 81 from the transistor portion 70 and the boundary portion 90 is more likely to recombine and disappear than in the semiconductor devices 100 shown in FIG. 3a and the FIG. 3c. Thus, the reverse recovery characteristics of the diode portion 81 can be improved over those in the semiconductor devices 100 shown in FIG. 3a and the FIG. 3c.

Figure 4B:
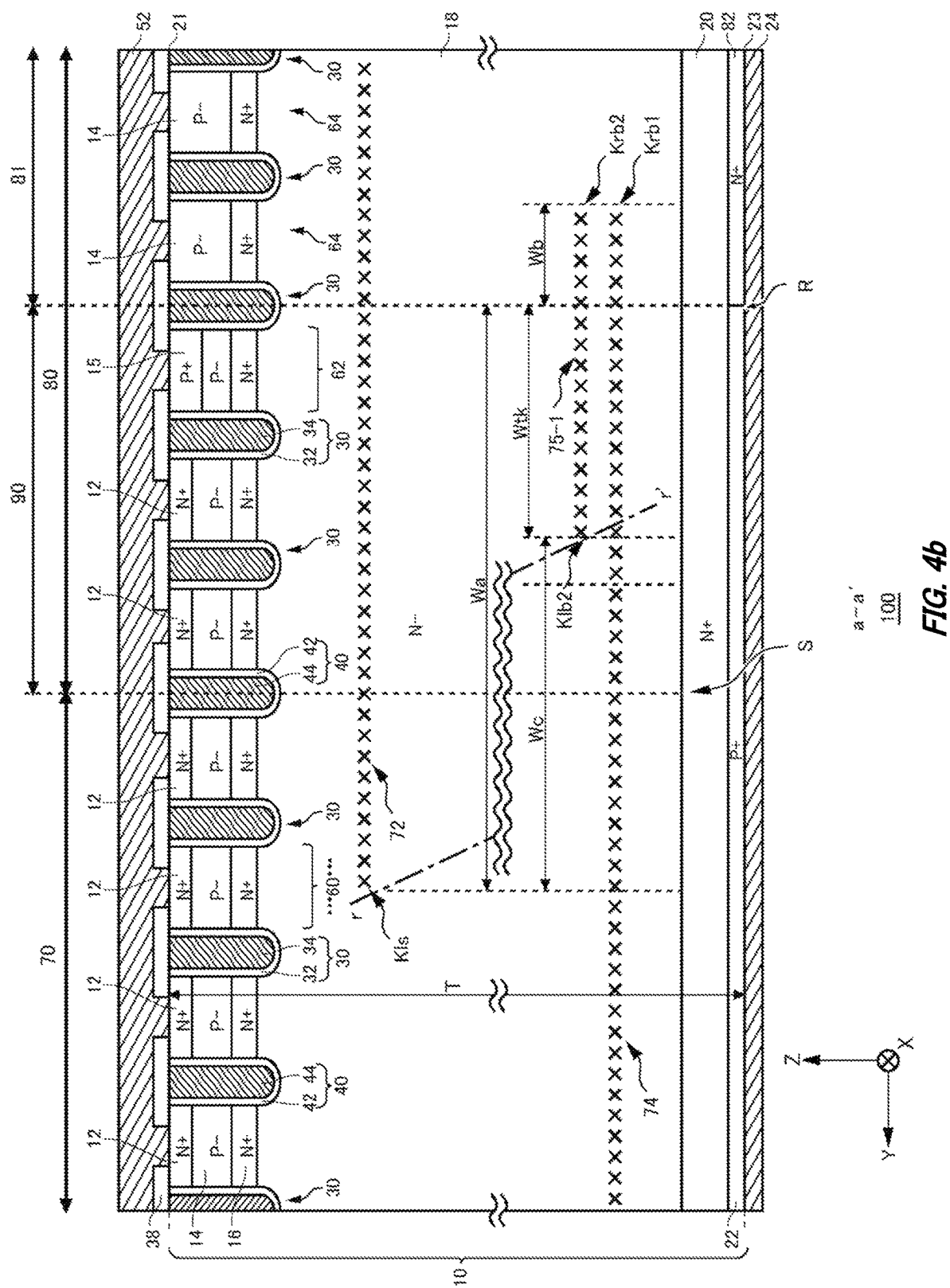

FIG. 4b is a diagram showing another example of the a-a' cross section shown in FIG. 1a. A semiconductor device 100 shown in FIG. 4b is different from the semiconductor device 100 shown in FIG. 3c in that the first lower surface side lifetime control region 74 is provided continuously, in the Y axis direction, from the transistor portion 70 to a partial region of the diode portion 81 in contact with the boundary portion 90. The end Krb1 of the first lower surface side lifetime control region 74 in the Y axis direction and the end Krb2 of the second lower surface side lifetime control region 75-1 in the Y axis direction are provided in the diode portion 81. The positions of the end Krb1 and the end Krb2 in the Y axis direction may or may not match.

In the semiconductor device 100 of this example, as shown in FIG. 4b, the first lower surface side lifetime control region 74 and the second lower surface side lifetime control region 75-1 overlap in the depth direction of the semiconductor substrate 10 at the end R. The first lower surface side lifetime control region 74 and the second lower surface side lifetime control region 75-1 of this example overlap in the Z axis direction in a region of the boundary portion 90 in contact with the diode portion 81 in the Y axis direction and a region of the diode portion 81 in contact with the boundary portion 90. Thus, holes flowing to the vicinity of the end R of the cathode region 82 of the diode portion 81 from the transistor portion 70 and the boundary portion 90 is more likely to recombine and disappear than in the semiconductor devices 100 shown in FIG. 3a and the FIG. 3c. Thus, the reverse recovery characteristics of the diode portion 81 can be improved over those in the semiconductor devices 100 shown in FIG. 3a and the FIG. 3c.

Figure 5A:
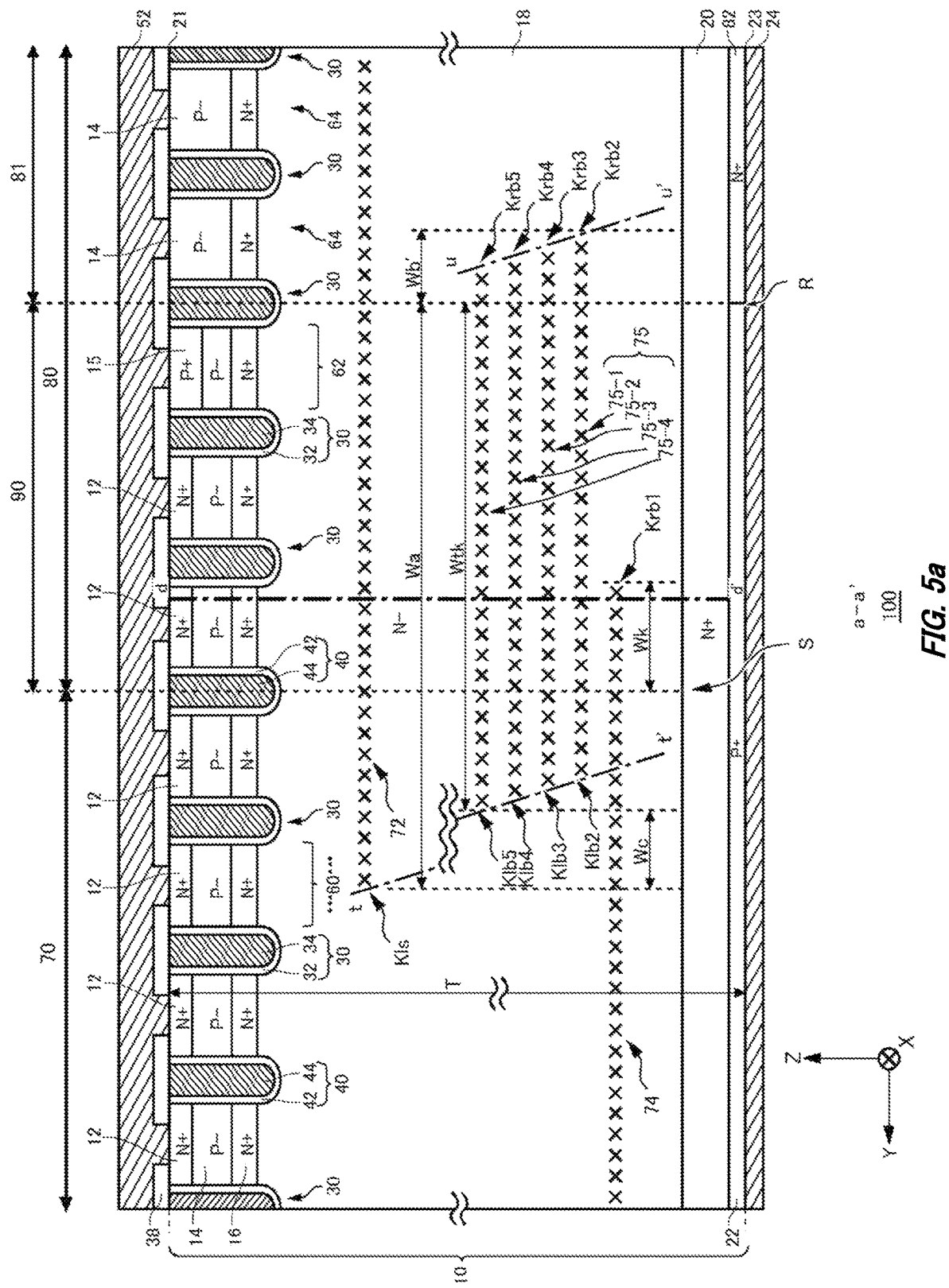

FIG. 5a is a diagram showing another example of the a-a' cross section shown in FIG. 1a. A semiconductor device 100 shown in FIG. 5a is different from the semiconductor device 100 shown in FIG. 3a in that a plurality of second lower surface side lifetime control regions 75 are provided at different depths in the Z axis direction. FIG. 5a shows an example where four second lower surface side lifetime control regions 75 are provided. In this example, the plurality of second lower surface side lifetime control regions 75 are defined as second lower surface side lifetime control regions 75-1, 75-2, 75-3, and 75-4 in this order from the side of the lower surface 23.

Each of the second lower surface side lifetime control regions 75 has the end Klb provided in the transistor portion 70, as shown in FIG. 5a. The end Klb of the second lower surface side lifetime control region 75 provided closer to the lower surface 23 may be provided closer to the diode portion 81 in the Y axis direction, than the end Klb of the second lower surface side lifetime control region 75 provided closer to the upper surface 21. Thus, as indicated by a broken line t-t' in FIG. 5a, the end Klb provided closer to the lower surface 23 may be provided closer to the diode portion 81 in the Y axis direction.

Each of the second lower surface side lifetime control region 75 has the end Krb provided in the diode portion 81, as shown in FIG. 5a. The end Krb of the second lower surface side lifetime control region 75 provided closer to the lower surface 23 may be provided farther from the transistor portion 70, than the end Krb of the second lower surface side lifetime control region 75 provided more on the side of the upper surface 21 is. Thus, as indicated by a broken line u-u' in FIG. 5a, the end Krb provided closer to the lower surface 23 may be provided farther from the transistor portion 70 in the Y axis direction.

In the semiconductor device 100 of this example, the end Klb of the second lower surface side lifetime control region 75 is provided closer to the diode portion 81 than the end Kls of the upper surface side lifetime control region 72 is. Of the plurality of ends Klb of the plurality of second lower surface side lifetime control regions 75, one provided closer to the lower surface 23 is provided closer to the diode portion 81. Thus, implantation of holes from the emitter region 12 of the transistor portion 70 and the emitter region 12 of the boundary portion 90 to the cathode region 82 of the diode portion 81 can be suppressed when the diode portion 81 operates. Thus, reverse recovery characteristics of the diode portion 81 can be improved. The plurality of second lower surface side lifetime control regions 75 may have lengths different from each other in the Y axis direction.

In the semiconductor device 100 of this example, the end Krb1 of the first lower surface side lifetime control region 74 on the side of the diode portion 81 in the Y axis direction is provided in the boundary portion 90. In the semiconductor device 100 of this example, the first lower surface side lifetime control region 74 and two or more of the second lower surface side lifetime control regions 75 overlap in the Z axis direction at the end S. At the end S, all (four in this example) second lower surface side lifetime control regions 75 may overlap in the Z axis direction. In this example, the plurality of second lower surface side lifetime control regions 75 are provided so that some of the holes moving from the emitter region 12 of the transistor portion 70 and the emitter region 12 of the boundary portion 90 to the cathode region 82 of the diode portion 81 are more likely to recombine and disappear than in the semiconductor device 100 shown in FIG. 3a. Thus, in the semiconductor device 100 of this example, reverse recovery characteristics of the diode portion 81 can be improved over that in the semiconductor device 100 shown in FIG. 3a.

In this example, as in the semiconductor devices 100 shown in FIG. 3a and FIG. 3c, the first lower surface side lifetime control region 74 may be provided continuously from the transistor portion 70 to the boundary portion 90 in the Y axis direction. The first lower surface side lifetime control region 74 may not be provided in a region of the boundary portion 90 in contact with the diode portion 81 and may not be provided in the diode portion 81. With the first lower surface side lifetime control region 74 not provided in the region of the boundary portion 90 in contact with the diode portion 81, holes can be implanted to the diode portion 81 from the collector region 22 of the boundary portion 90. Thus, excellent soft recovery characteristics of the diode portion 81 can be achieved.

Figure 5B:
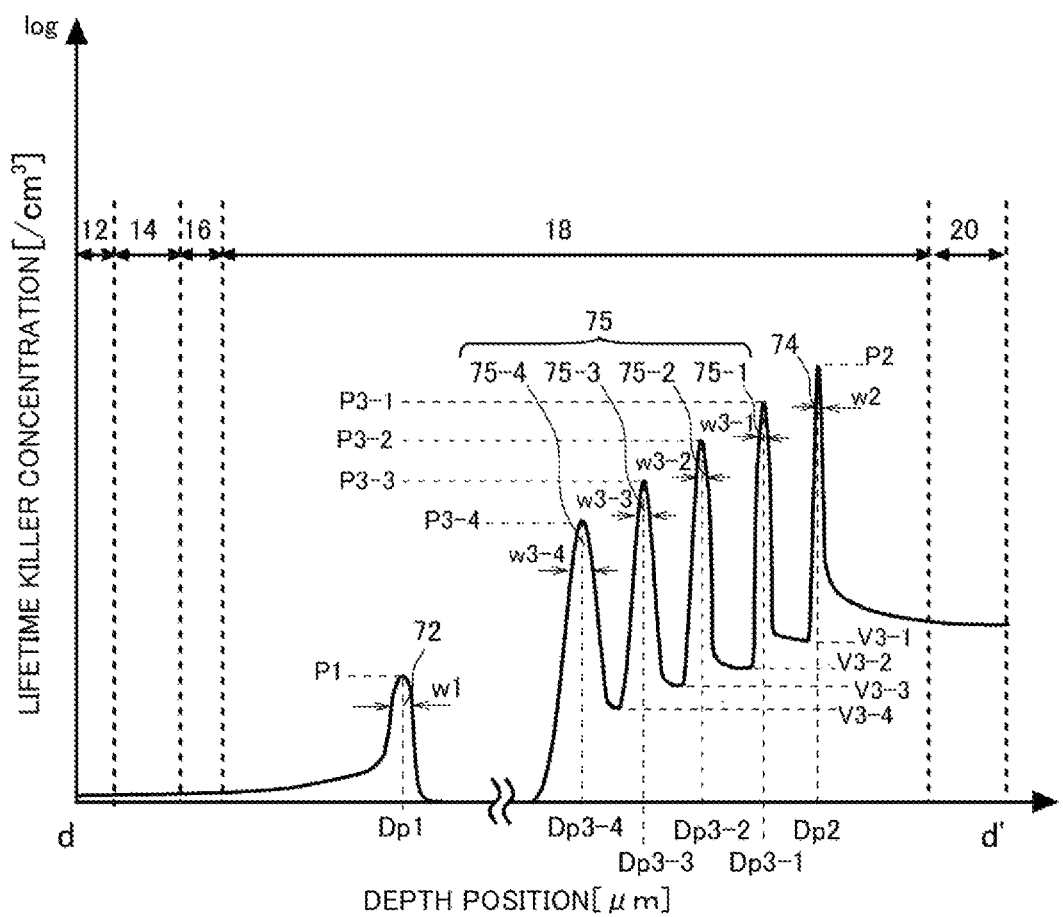

FIG. 5b is a diagram showing a lifetime killer concentration distribution in the upper surface side lifetime control region 72, the first lower surface side lifetime control region 74, and the plurality of second lower surface side lifetime control regions 75 in a d-d' cross section in FIG. 5a. In FIG. 5b, the vertical axis is a logarithmic axis indicating the lifetime killer concentration. The horizontal axis is a linear axis indicating a position in the depth direction of the semiconductor substrate 10. A lifetime killer concentration P2 in the first lower surface side lifetime control region 74 provided on the side of the lower surface 23 may be higher than any one of lifetime killer concentrations P3-1, P3-2, P3-3, and P3-4 in the plurality of second lower surface side lifetime control regions 75 provided closer to the upper surface 21 than the first lower surface side lifetime control region 74 is. Of the plurality of second lower surface side lifetime control regions 75, the second lower surface side lifetime control region 75 provided closer to the lower surface 23 may have a higher lifetime killer concentration P3. The lifetime killer concentration P2 of the first lower surface side lifetime control region 74 may be two to five times as higher as the maximum concentration (P3-1 in this example) of the lifetime killer concentrations P3 of the second lower surface side lifetime control regions 75.

In the semiconductor device 100 of this example, the lifetime killer concentration P2 in the first lower surface side lifetime control region 74 is higher than the lifetime killer concentration P3 in the second lower surface side lifetime control region 75 and of the plurality of second lower surface side lifetime control regions 75, one closer to the lower surface 23 has a higher lifetime killer concentration P3. In the semiconductor device 100 of this example, the lifetime killer concentration of the semiconductor substrate 10 as a whole can be increased, while maintaining the lifetime killer concentration P1 of the upper surface side lifetime control region 72 contributing to the leak current. Thus, the tradeoff between the ON voltage and the turn off power loss of the transistor portion 70 can be adjusted, while maintaining the leak current characteristics of the transistor portion 70.

It suffices if the lifetime killer concentrations P3 of the plurality of second lower surface side lifetime control regions 75 are such that the lifetime killer concentrations P3 are generally high from the side of the upper surface 21 to the side of the lower surface 23. Specifically, there may be local inversion of high and low of lifetime killer concentrations such as a case where the lifetime killer concentration P3-3 of the second lower surface side lifetime control region 75-3 is higher than the lifetime killer concentration P3-2 of the second lower surface side lifetime control region 75-2. The lifetime killer concentration P3-1 of the second lower surface side lifetime control region 75-1 closest to the lower surface 23, of the lifetime killer concentrations P3 of the plurality of second lower surface side lifetime control regions 75, may be the maximum value. The lifetime killer concentration P3-4 of the second lower surface side lifetime control region 75-4 closest to the upper surface 21, of the lifetime killer concentrations P3 of the plurality of second lower surface side lifetime control regions 75, may be the minimum value.

The lifetime killer concentration distribution has trough portions among peak concentrations P3. Of local minimum values V3 in the trough portions of the lifetime killer concentrations, one closer to the lower surface 23 may be higher. Furthermore, a local minimum value of the lifetime killer concentration between the concentration peak P2 of the first lower surface side lifetime control region 74 provided closest to the lower surface 23 and the lower surface 23 may be higher than the local minimum values V3 of the centration in the trough portions among the plurality of peaks P3.

It suffices if the local minimum values V3 in the trough portions are such that the concentrations are generally higher in the trough portions closer to the lower surface 23 than in the trough portions closer to the upper surface 21. Specifically, there may be local inversion of high and low of lifetime killer concentrations such as a case where the lifetime killer concentration in the trough portion between the second lower surface side lifetime control region 75-3 and the second lower surface side lifetime control region 75-4 is higher than the lifetime killer concentration in the trough portion between the second lower surface side lifetime control region 75-2 and the second lower surface side lifetime control region 75-3. A lifetime killer concentration V3-1 in the trough portion closest to the lower surface 23, of the lifetime killer concentrations V3 in the plurality of trough portions, may be the maximum value. A lifetime killer concentration V3-4 in the trough portion closest to the upper surface 21, of the lifetime killer concentrations V3 in the plurality of trough portions, may be the minimum value.

A width w3-4 of the lifetime killer concentration distribution in the second lower surface side lifetime control region 75-4 may be larger than a width w3-3 of the lifetime killer concentration distribution in the second lower surface side lifetime control region 75-3. The width w3-3 of the lifetime killer concentration distribution in the second lower surface side lifetime control region 75-3 may be larger than a width w3-2 of the lifetime killer concentration distribution in the second lower surface side lifetime control region 75-2. The width w3-2 of the lifetime killer concentration distribution in the second lower surface side lifetime control region 75-2 may be larger than a width w3-1 of the lifetime killer concentration distribution in the second lower surface side lifetime control region 75-1. The width w3-1 of the lifetime killer concentration distribution in the second lower surface side lifetime control region 75-1 may be larger than the width w2 of the lifetime killer concentration distribution in the first lower surface side lifetime control region 74. The width w1 of the lifetime killer concentration distribution in the upper surface side lifetime control region 72 may be larger than the width w3-4 of the lifetime killer concentration distribution in the second lower surface side lifetime control region 75-4. The width w1 of the lifetime killer concentration distribution in the upper surface side lifetime control region 72 may be larger than the width w3-3 of the lifetime killer concentration distribution in the second lower surface side lifetime control region 75-3, and may be smaller than the width w3-4 of the lifetime killer concentration distribution in the second lower surface side lifetime control region 75-4. The width w1 of the lifetime killer concentration distribution in the upper surface side lifetime control region 72 may be larger than the width w3-2 of the lifetime killer concentration distribution in the second lower surface side lifetime control region 75-2, and may be smaller than the width w3-3 of the lifetime killer concentration distribution in the second lower surface side lifetime control region 75-3. The width w1 of the lifetime killer concentration distribution in the upper surface side lifetime control region 72 may be larger than the width w3-1 of the lifetime killer concentration distribution in the second lower surface side lifetime control region 75-1, and may be smaller than the width w3-2 of the lifetime killer concentration distribution in the second lower surface side lifetime control region 75-2.

Figure 5C:
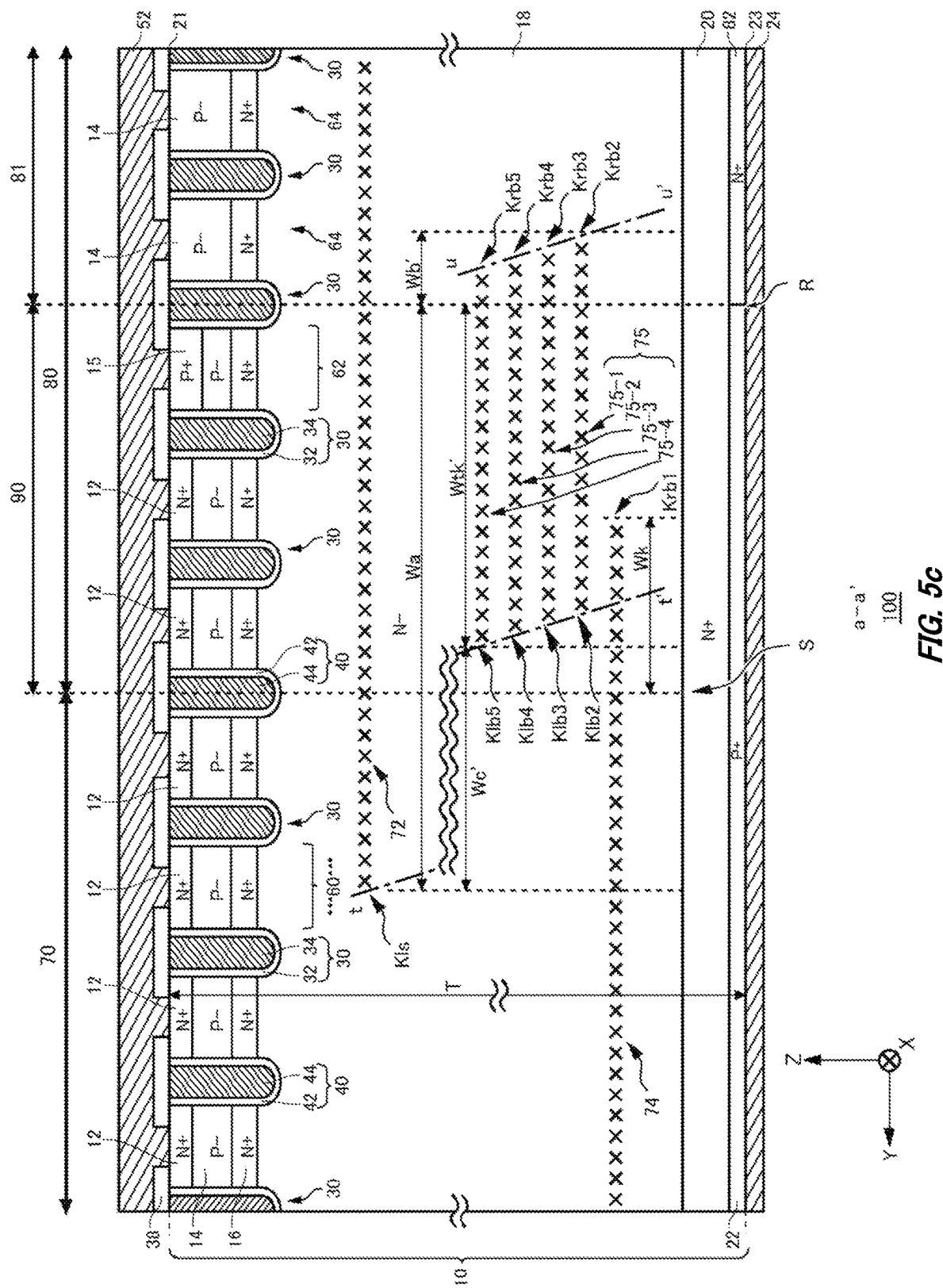

FIG. 5c is a diagram showing another example of the a-a' cross section in FIG. 1a. A semiconductor device 100 shown in FIG. 5c is different from the semiconductor device 100 shown in FIG. 5a in that the ends Klb of two or more second lower surface side lifetime control regions 75 in the Y axis direction are provided in the boundary portion 90. The ends Klb of all the second lower surface side lifetime control regions 75 in the Y axis direction may be provided in the boundary portion 90.

In the semiconductor device 100 of this example, in the boundary portion 90, the first lower surface side lifetime control region 74 and the plurality of second lower surface side lifetime control regions 75 overlap in the Z axis direction. In this example, as in the semiconductor device 100 shown in FIG. 5a, some of the holes moving from the emitter region 12 of the transistor portion 70 and the emitter region 12 of the boundary portion 90 to the cathode region 82 of the diode portion 81 recombine and disappear in the respective lifetime control regions. Thus, in the semiconductor device 100 of this example, the reverse recovery characteristics of the diode portion 81 can be improved, as in the semiconductor device 100 shown in FIG. 5a.

Figure 5D:
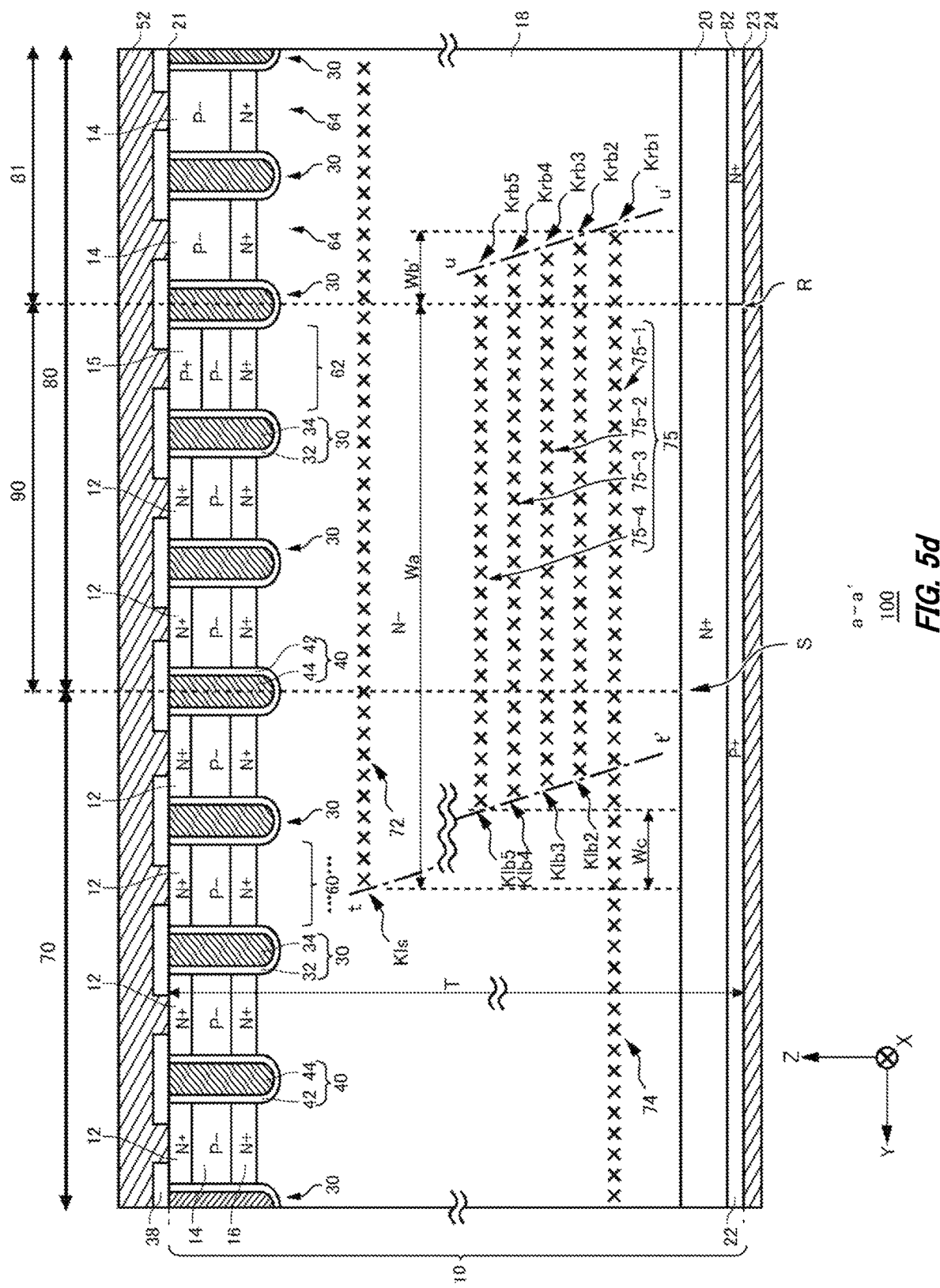

FIG. 5d is a diagram showing another example of the a-a' cross section in Fig. FIG. 1a. A semiconductor device 100 shown in FIG. 5d is different from the semiconductor device 100 shown in FIG. 5a in that the first lower surface side lifetime control region 74 is provided continuously in the Y axis direction from the transistor portion 70 to the diode portion 81.

In the semiconductor device 100 of this example, as shown in FIG. 5d, the first lower surface side lifetime control region 74 and the second lower surface side lifetime control region 75 overlap in the Z axis direction in a region from the transistor portion 70 to the diode portion 81. Thus, some of the holes moving from the emitter region 12 of the transistor portion 70 and the emitter region 12 of the boundary portion 90 to the cathode region 82 of the diode portion 81 are likely to recombine and disappear. Thus, the reverse recovery characteristics of the diode portion 81 can be improved over those in the semiconductor devices 100 shown in FIG. 5a and FIG. 5c. The first lower surface side lifetime control region 74 of this example has the end Krb1 in the Y axis direction in the diode portion 81. The end Krb1 may be provided farther from the transistor portion 70 than the ends Krb of the respective second lower surface side lifetime control regions 75 are. Specifically, in the diode portion 81, the first lower surface side lifetime control region 74 may be provided to extend longer in the Y axis direction than the second lower surface side lifetime control regions 75.

Figure 5E:
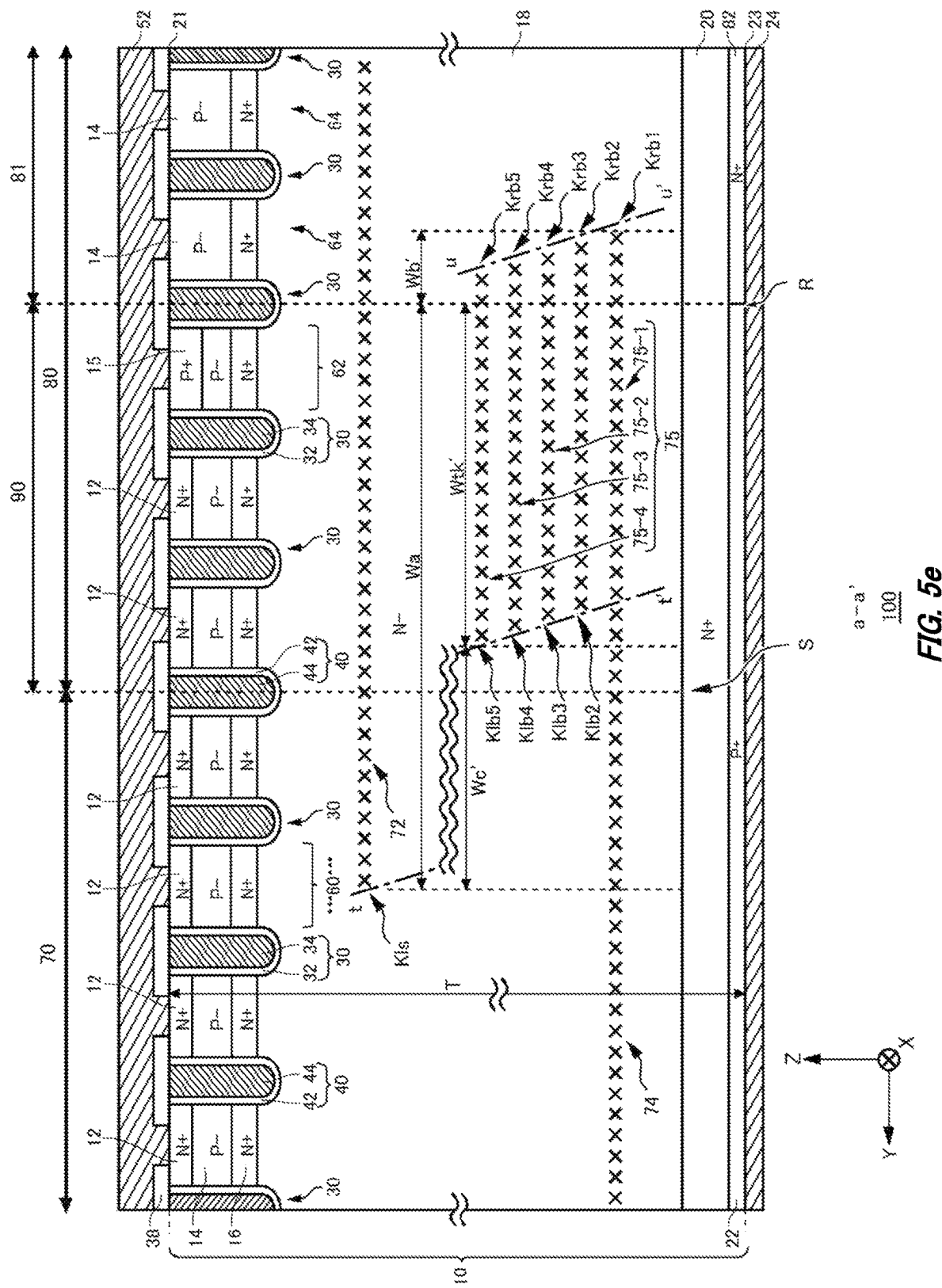

FIG. 5e is a diagram showing another example of the a-a' cross section in FIG. 1a. A semiconductor device 100 shown in FIG. 5e is different from the semiconductor device 100 shown in FIG. 5c in that the first lower surface side lifetime control region 74 is provided continuously in the Y axis direction from the transistor portion 70 to the diode portion 81.

In the semiconductor device 100 of this example, as shown in FIG. 5e, the first lower surface side lifetime control region 74 and the second lower surface side lifetime control region 75-1 overlap in the Z axis direction in a range from the boundary portion 90 to the diode portion 81. Thus, some of the holes moving from the emitter region 12 of the transistor portion 70 and the emitter region 12 of the boundary portion 90 to the cathode region 82 of the diode portion 81 are more likely to recombine and disappear than in the semiconductor device 100 shown in FIG. 5a and FIG. 5c. Thus, the reverse recovery characteristics of the diode portion 81 can be improved over those in the semiconductor devices 100 shown in FIG. 5a and FIG. 5c.

Figure 6:
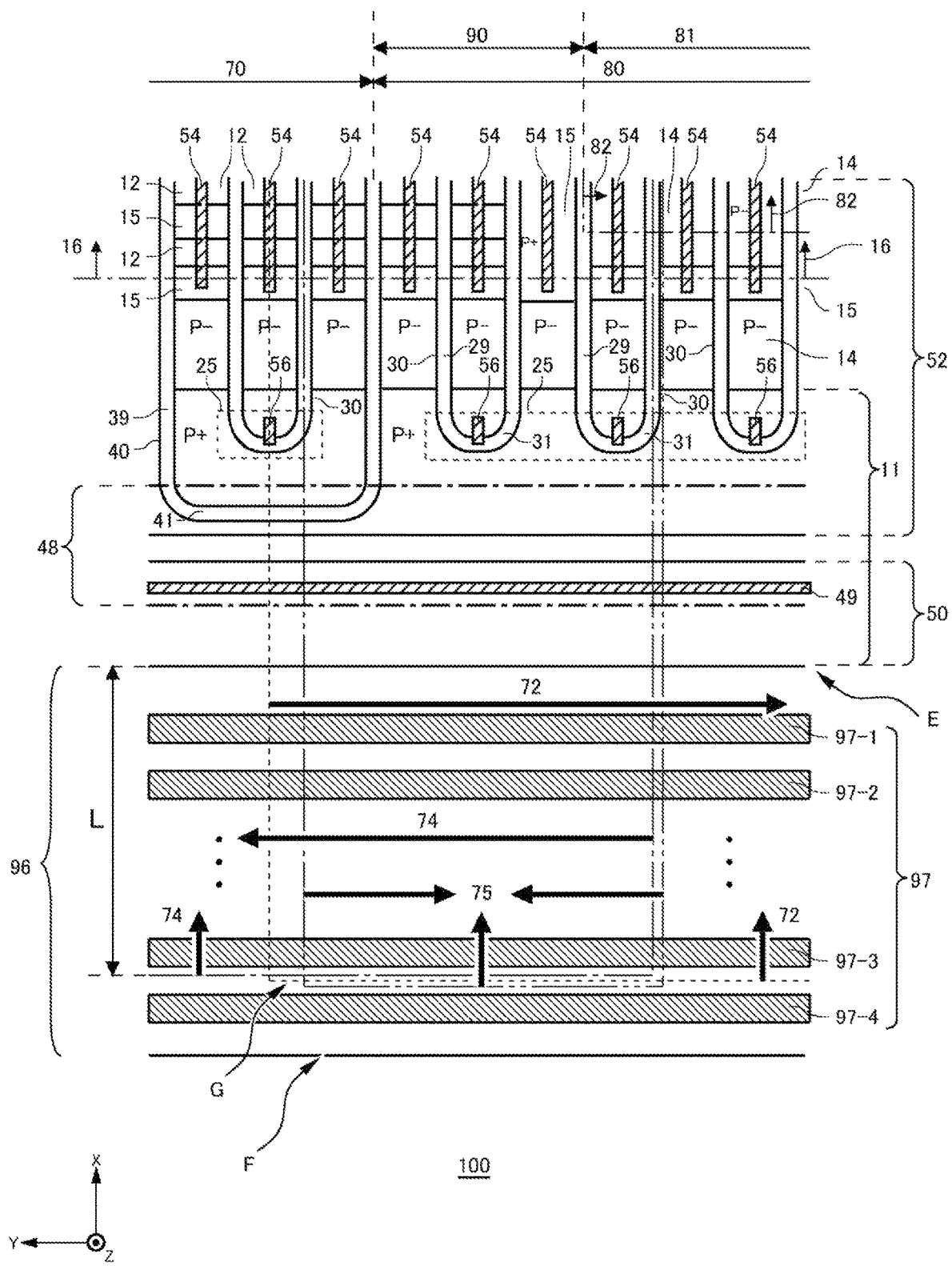
FIG. 6 is a diagram illustrating an example of the upper surface of the semiconductor device 100 in FIG. 1a further including an edge termination structure portion 96 positioned on the outer side of the well region 11.

FIG. 6 is a diagram showing an example of the upper surface of the semiconductor device 100 shown in FIG. 1a further including an edge termination structure portion 96 positioned on the outer side of the well region 11. An end E is an end of the well region 11 on the negative side in the X axis direction, and is an end of the edge termination structure portion 96 on the positive side of the X axis direction. An end F is an end of the edge termination structure portion 96 on the negative side in the X axis direction. The end F may be an outer circumference end of a semiconductor chip including the semiconductor device 100. In FIG. 6, the negative side in the X axis direction indicates the side of the outer circumference end of the semiconductor chip, and the positive side in the X axis direction indicates the center side of the semiconductor chip.

The edge termination structure portion 96 may be provided with a guard ring 97. In this example, the guard ring 97 is of the P+ type. The guard ring 97 is provided for maintaining pressure resistance of the transistor portion 70. The guard ring 97 may extend in the arrangement direction of the transistor portion 70 and the adjacent element portion 80, on the negative side of the well region 11 in the X axis direction. A plurality of guard rings 97 may be provided along the X axis direction in the top view of the semiconductor substrate 10. In FIG. 6, four guard rings that are a guard ring 97-1 to a guard ring 97-4 are clearly shown, but four or more guard rings may be provided. In this example, of the guard rings 97, the guard ring 97-4 is the guard ring provided farthest on the negative side in the X axis direction.

An end G is an end of the upper surface side lifetime control region 72, the first lower surface side lifetime control region 74, and the second lower surface side lifetime control region 75 on the negative side in the X axis direction. The end G may be provided between the guard ring 97-4 that is provided farthest on the negative side in the X axis direction and the guard ring 97-3 adjacent to and on the positive side of the guard ring 97-4 in the X axis direction, in the X axis direction in the top view of the semiconductor substrate 10.

The upper surface side lifetime control region 72, the first lower surface side lifetime control region 74, and the second lower surface side lifetime control region 75 may be provided over a predetermined length L in the X axis direction, outside the well region 11 as shown in FIG. 6. In the example shown in FIG. 6, L is the distance between the end E and the end G in the X axis direction. The length L may be larger than the thickness T of the semiconductor substrate 10. The length L may be 1.2 times as large as the thickness T or more. With the length L being larger than the thickness T, the pressure resistance of the transistor portion 70 can be maintained.

The positions of the end G of the upper surface side lifetime control region 72, the first lower surface side lifetime control region 74, and the second lower surface side lifetime control region 75 in the X axis direction are shown to be different from each other in FIG. 6 for easier understanding, but may match in the top view of the semiconductor substrate 10. The positions of the ends G of the upper surface side lifetime control region 72, the first lower surface side lifetime control region 74, and the second lower surface side lifetime control region 75 in the X axis direction may not match in the plan view of the semiconductor substrate 10. Thus, the upper surface side lifetime control region 72, the first lower surface side lifetime control region 74, and the second lower surface side lifetime control region 75 may be provided to the outside of the well region 11 from the end E, with lengths, in the X axis direction, different from each other.

The positions, in the Y axis direction, of an end of the first lower surface side lifetime control region 74 on the negative side in the Y axis direction and an end of second lower surface side lifetime control region 75 on the negative side in the Y axis direction are shown to be different from each other in FIG. 6 for easier understanding, but may match in the top view of the semiconductor substrate 10. The positions, in the Y axis direction, of the end of the first lower surface side lifetime control region 74 on the negative side in the Y axis direction and the end of second lower surface side lifetime control region 75 on the negative side in the Y axis direction may be different from each other in the top view of the semiconductor substrate 10.

Figure 7A:
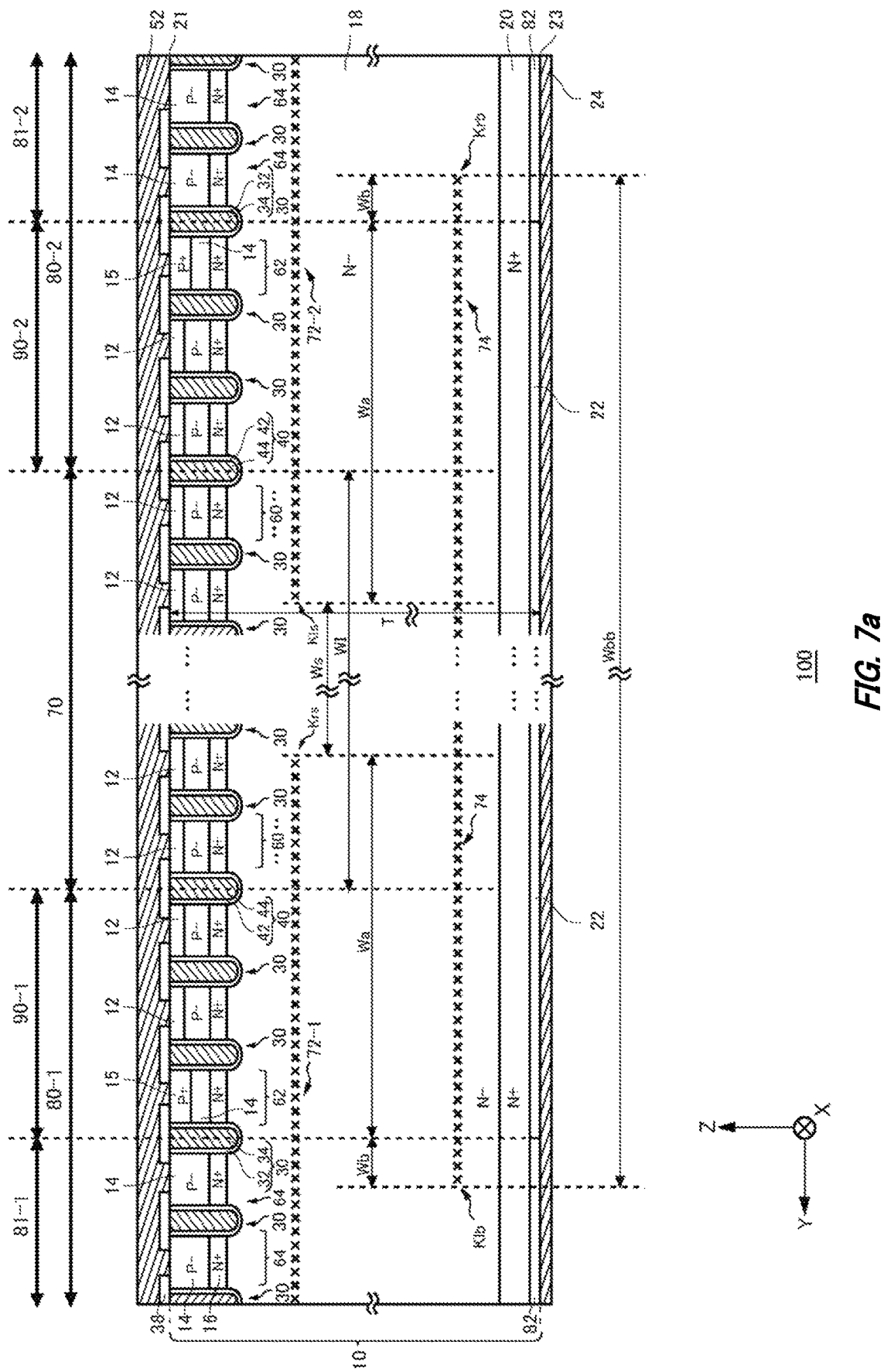
FIG. 7a is a diagram showing the cross-sectional view, shown in FIG. 1b, further including an adjacent element portion 80 that is on a positive side of and adjacent to a transistor portion 70 in a Y axis direction.

FIG. 7a is a diagram showing the cross-sectional view shown in FIG. 1b further including two adjacent element portions 80-1 and 80-2 sandwiching the transistor portion 70 in the Y axis direction. The transistor portion 70 and the adjacent element portion 80-2 have structures similar to the structures shown in FIG. 1b. Specifically, the upper surface side lifetime control region 72-2 is provided continuously in the Y axis direction from a partial region of the transistor portion 70 that is in contact with the adjacent element portion 80-2 and over the adjacent element portion 80-2.

Lifetime control regions in the adjacent element portion 80-1 and in the region of the transistor portion 70 in contact with the adjacent element portion 80-1 have a structure obtained by inverting, in the Y axis direction, lifetime control regions in the adjacent element portion 80-2 and in a region of the transistor portion 70 in contact with the adjacent element portion 80-2. Specifically, the upper surface side lifetime control region 72-1 is provided, in the Y axis direction, continuously from the region of the transistor portion 70 in contact with the adjacent element portion 80-1 over the adjacent element portion 80-1. In the semiconductor device 100 shown in FIG. 7a, the first lower surface side lifetime control region 74 is provided, in the Y axis direction, continuously from the adjacent element portion 80-1 to the adjacent element portion 80-2 to have a width Wbb. The structure of the lifetime control regions in the adjacent element portion 80-2 and the region of the transistor portion 70 in contact with the adjacent element portion 80-1 may be the same as that in the semiconductor device 100 according to any of the modes described with reference to FIG. 1a to FIG. 6. Also in this case, the lifetime control regions in the adjacent element portion 80-1 and the region of the transistor portion 70 in contact with the adjacent element portion 80-1 is obtained by inverting, in the Y axis direction, the lifetime control regions in the adjacent element portion 80-2 and the region of the transistor portion 70 in contact with the adjacent element portion 80-2.

The upper surface side lifetime control region 72-1 has an end Krs in the transistor portion 70. The upper surface side lifetime control region 72-2 has end Kls in the transistor portion 70. In the Y axis direction, the transistor portion 70 between the end Krs and the end Kls is not provided with the upper surface side lifetime control region 72.

A width WI is a width of the transistor portion 70 in the Y axis direction. The width WI of the transistor portion 70 is a width between a boundary between the transistor portion 70 and the adjacent element portion 80-1 and a boundary between the transistor portion 70 and the adjacent element portion 80-2. For example, the width WI is 1500 μm.

A width Ws is a width, in the transistor potion 70, from the end Krs to the end Kls in the Y axis direction. The upper surface side lifetime control region 72 provided on the side of the upper surface 21 of the semiconductor substrate 10 may cause leak current in the transistor portion 70. In this example, the width Ws may be equal to or larger than 95% and equal to or smaller than 99% of the width WI. The upper surface side lifetime control region 72 may not be provided over most of the width WI. Thus, the leak current in the transistor portion 70 can be suppressed.

The first lower surface side lifetime control region 74 is provided over the width Wbb in the Y axis direction. The width Wbb may be equal to or larger than 105% and equal to or smaller than 120% of the width WI. Thus, the first lower surface side lifetime control region 74 may be provided in a range that includes the transistor portion 70 in the Y axis direction and has a width larger that is equal to or larger than the width WI of the transistor portion 70. The first lower surface side lifetime control region 74 is provided on the side of the lower surface 23 of the semiconductor substrate 10 has a smaller impact on the leak current in the transistor portion 70 than the upper surface side lifetime control region 72. Thus, with the first lower surface side lifetime control region 74 provided over the entirety of the transistor portion 70 in the Y axis direction, the amount of lifetime killers in the semiconductor substrate 10 can be adjusted, while suppressing an increase in the leak current in the transistor portion 70.

Figure 7B:
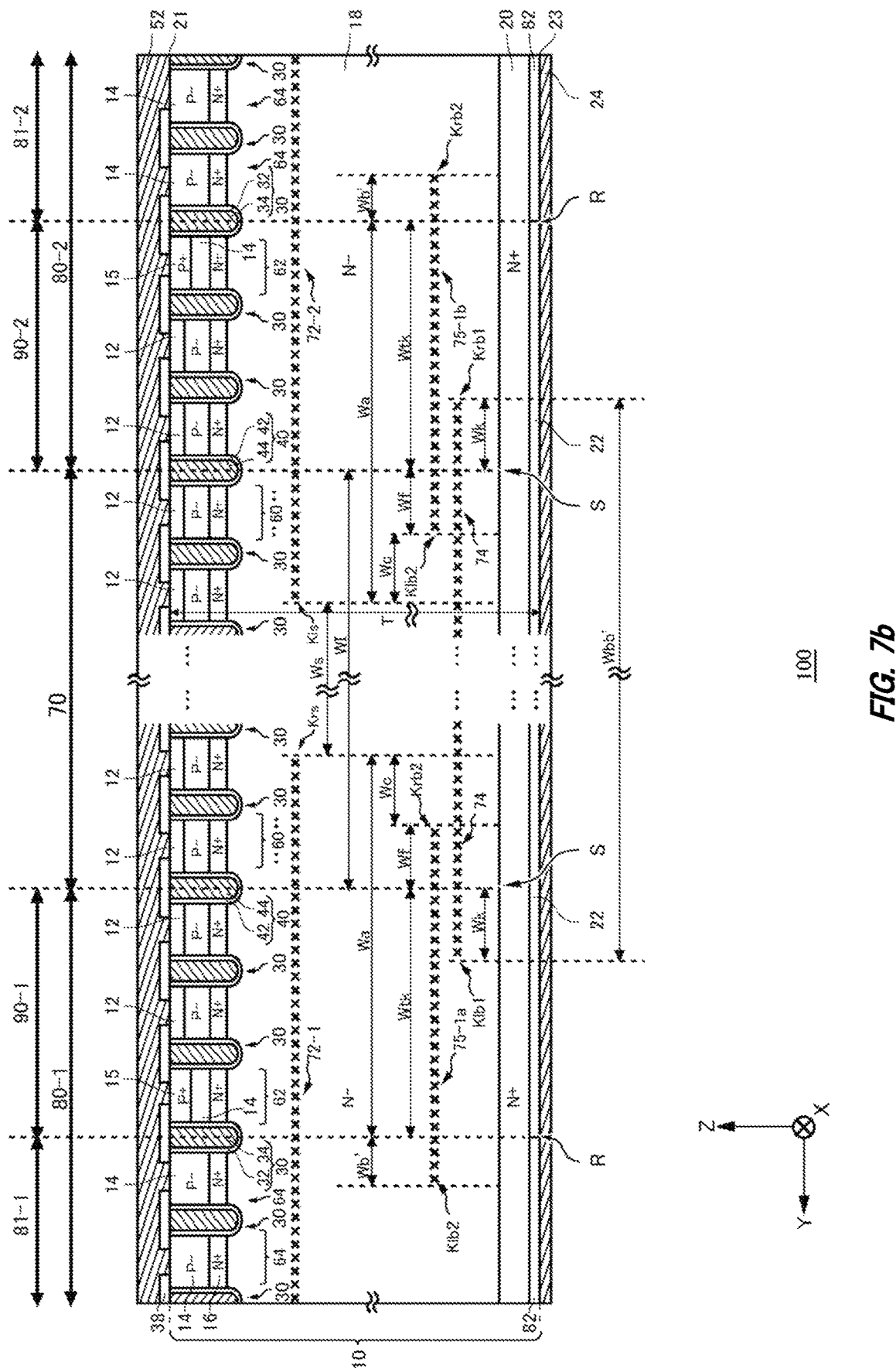
FIG. 7b is a diagram showing the cross-sectional view, shown in FIG. 3a, further including the adjacent element portion 80 that is on the positive side of and adjacent to the transistor portion 70 in the Y axis direction.

FIG. 7b is a diagram showing the cross-sectional view shown in FIG. 3a further including the two adjacent element portions 80-1 and 80-2 sandwiching the transistor portion 70 in the Y axis direction. In this example, the structure of lifetime control regions in the transistor portion 70 and the adjacent element portion 80-2 is similar to the structure shown in FIG. 3a. Lifetime control regions in the transistor portion 70 and the adjacent element portion 80-1 has a structure obtained by inverting the lifetime control regions in the transistor portion 70 and the adjacent element portion 80-2 in the Y axis direction. A semiconductor device 100 shown in FIG. 7b is different from the semiconductor device 100 shown in FIG. 7a in that second lower surface side lifetime control regions 75-1a and 75-1b are further provided. The semiconductor device 100 shown in FIG. 7b is further different from the semiconductor device 100 shown in FIG. 7a in that an end Klb1 and an end Krb1 of the first lower surface side lifetime control region 74 are provided in the boundary portions 90 in the Y axis direction.

In this example, an end Klb2 of the second lower surface side lifetime control region 75-1b is provided in the transistor portion 70 in the Y axis direction. An end Krb2 of the second lower surface side lifetime control region 75-1b is provided in the diode portion 81-2 in the Y axis direction. An end Krb2 of the second lower surface side lifetime control region 75-1a is provided in the transistor portion 70 in the Y axis direction. An end Klb2 of the second lower surface side lifetime control region 75-1a is provided in the diode portion 81-1 in the Y axis direction.

Each of the second lower surface side lifetime control regions 75-1 may be provided at a deeper position than the first lower surface side lifetime control region 74 with respect to the lower surface 23. Each of the second lower surface side lifetime control regions 75-1 may be provided continuously from the transistor portion 70 to the diode portion 81 in the Y axis direction. Each of the second lower surface side lifetime control regions 75-1 may be provided in a part of the transistor portion 70 and a part of the adjacent element portion 80 in the Y axis direction. The end Klb2 of the second lower surface side lifetime control region 75-1b may be provided closer to the adjacent element portion 80-2 in the arrangement direction (Y axis direction) than the end Kls of the upper surface side lifetime control region 72-2 is. The end Krb2 of the second lower surface side lifetime control region 75-1a may be provided closer to the adjacent element portion 80-1 in the arrangement direction (Y axis direction) than the end Krs of the upper surface side lifetime control region 72-1 is.

In the semiconductor device 100 of this example, the second lower surface side lifetime control region 75-1 is provided continuously from the transistor portion 70 to the adjacent element portion 80 in the Y axis direction, and is provided in a part of the transistor portion 70 and a part of the adjacent element portion 80. Thus, the implantation of holes from the emitter region 12 of the transistor portion 70 and the emitter region 12 of the boundary portion 90 to the cathode region 82 of the diode portion 81 can be suppressed when the diode portion 81 operates. Thus, reverse recovery characteristics of the diode portion 81 can be improved.

A width Wbb' is a width of the first lower surface side lifetime control region 74 in the Y axis direction from the end Klb1 to the end Krb1. The first lower surface side lifetime control region 74 of this example has the end Klb1 and the end Krb1 provided in the boundary portions 90 in the Y axis direction. Thus, the width Wbb' is smaller than the width Wbb in the semiconductor device 100 shown in FIG. 7a.

At each end S, the first lower surface side lifetime control region 74 and the second lower surface side lifetime control region 75-1 may overlap in the depth direction of the semiconductor substrate 10. In the semiconductor device 100 of this example, the first lower surface side lifetime control region 74 and the second lower surface side lifetime control region 75-1 overlap in the depth direction of the semiconductor substrate 10 at each end S, so that some of the holes moving from the emitter region 12 of the transistor portion 70 and the emitter region 12 of the boundary portion 90 to the cathode region 82 of the diode portion 81 recombine and disappear. Thus, reverse recovery characteristics of the diode portion 81 can be improved.

The first lower surface side lifetime control region 74 and the second lower surface side lifetime control region 75-1 may not overlap in the depth direction of the semiconductor substrate 10 at each end R. In the semiconductor device 100 of this example, the second lower surface side lifetime control region 75-1 is provided continuously from the transistor portion 70 and over the diode portion 81 in the Y axis direction. Thus, even when the first lower surface side lifetime control region 74 is not provided from the transistor portion 70 to the diode portion 81 in the Y axis direction, implantation of holes from the emitter region 12 of the transistor portion 70 and the emitter region 12 of the boundary portion 90 to the cathode region 82 of the diode portion 81 can be suppressed due to the presence of the second lower surface side lifetime control region 75-1.

Figure 7C:
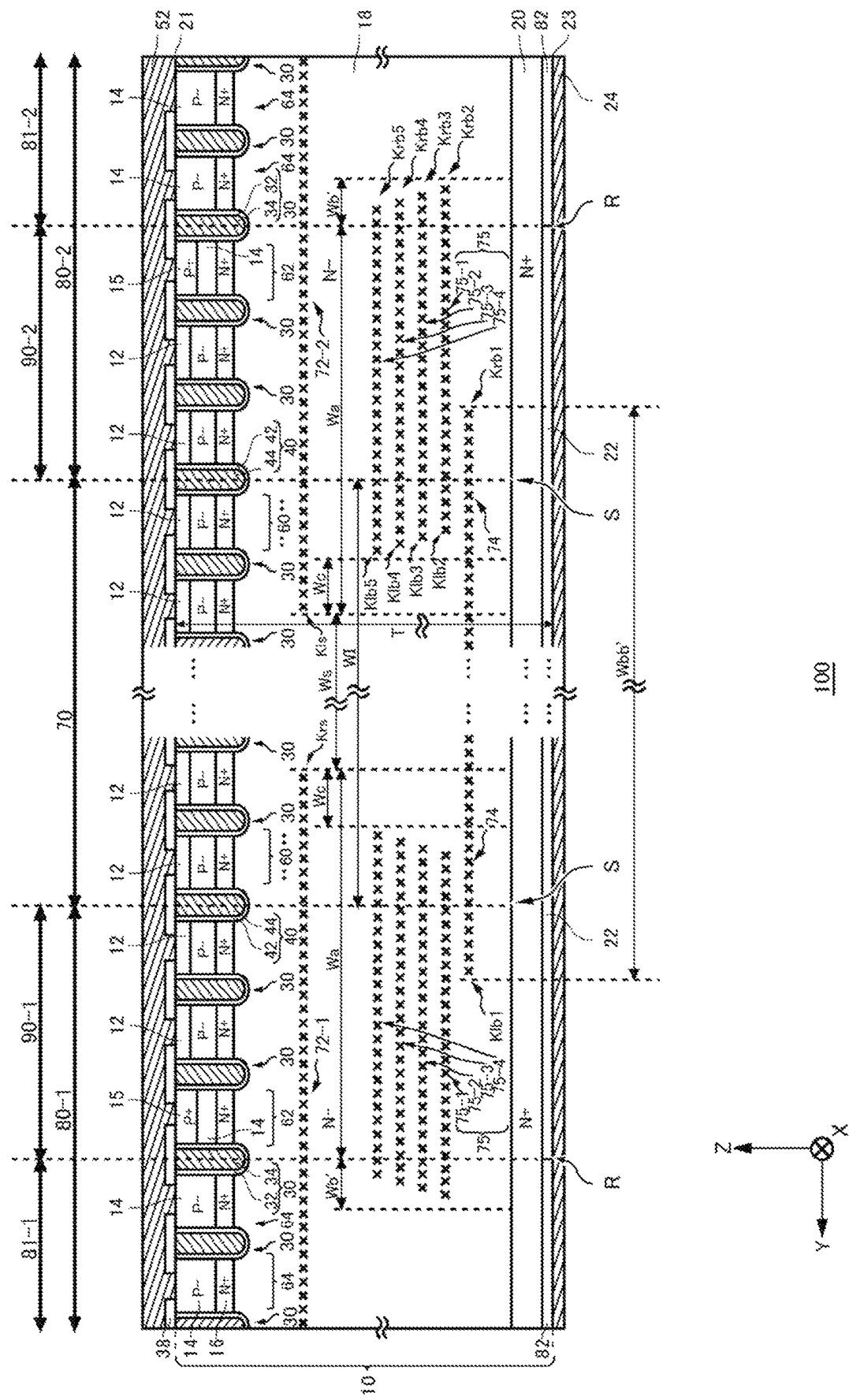
FIG. 7c is a diagram showing the cross-sectional view, shown in FIG. 5a, further including the adjacent element portion 80 that is on the positive side of and adjacent to the transistor portion 70 in the Y axis direction.

FIG. 7c is a diagram showing the cross-sectional view shown in FIG. 5a further including the two adjacent element portions 80-1 and 80-2 sandwiching the transistor portion 70 in the Y axis direction. In this example, the structure of lifetime control regions in the transistor portion 70 and the adjacent element portion 80-2 is similar to that structure shown in FIG. 5a. Lifetime control regions in the transistor portion 70 and the adjacent element portion 80-1 have a structure obtained by inverting, in the Y axis direction, the lifetime control regions in the transistor portion 70 and the adjacent element portion 80-2. The semiconductor device 100 shown in FIG. 7c is different from the semiconductor device 100 shown in FIG. 7b in that a plurality of second lower surface side lifetime control regions 75 are provided at different depths in the Z axis direction with respect o the lower surface 23. FIG. 7c shows an example where four second lower surface side lifetime control regions 75 are provided.

As shown in FIG. 7c, of the second lower surface side lifetime control regions 75, a second lower surface side lifetime control region 75-1 provided on the side of the lower surface 23 may be provided closer to the adjacent element portion 80 in the arrangement direction (Y axis direction) than a second lower surface side lifetime control region 75-4 provided on the side of the upper surface 21 is. Thus, of the ends Klb of the second lower surface side lifetime control regions 75 in the transistor portion 70, one closer to the lower surface 23 may be provided closer to the adjacent element portion 80 in the Y axis direction. Of the ends Krb of the second lower surface side lifetime control region 75 in the diode portion 81, one closer to the lower surface 23 may be provided closer to the adjacent element portion 80 in the Y axis direction.

In the semiconductor device 100 of this example, the end Klb of the second lower surface side lifetime control region 75 is provided closer to the diode portion 81 than the end Kls of the upper surface side lifetime control region 72 is. Of the plurality of ends Klb of the plurality of second lower surface side lifetime control regions 75, one closer to the lower surface 23 is provided closer to the diode portion 81. Thus, implantation of holes from the emitter region 12 of the transistor portion 70 and the emitter region 12 of the boundary portion 90 to the cathode region 82 of the diode portion 81 can be suppressed when the diode portion 81 operates. Thus, reverse recovery characteristics of the diode portion 81 can be improved.

In the semiconductor device 100 of this example, the plurality of, that is, four second lower surface side lifetime control regions 75 are provided at different depths in the Z axis direction. Thus, some of the holes moving from the emitter region 12 of the transistor portion 70 and the emitter region 12 of the boundary portion 90 to the cathode region 82 of the diode portion 81 are more likely to recombine and disappear than in the semiconductor device 100 shown in FIG. 7b. Thus, in the semiconductor device 100 of this example, the reverse recovery characteristics of the diode portion 81 can be improved over that in the semiconductor device 100 shown in FIG. 7b. The plurality of second lower surface side lifetime control regions 75 may have lengths different from each other in the Y axis direction.

Figure 8:
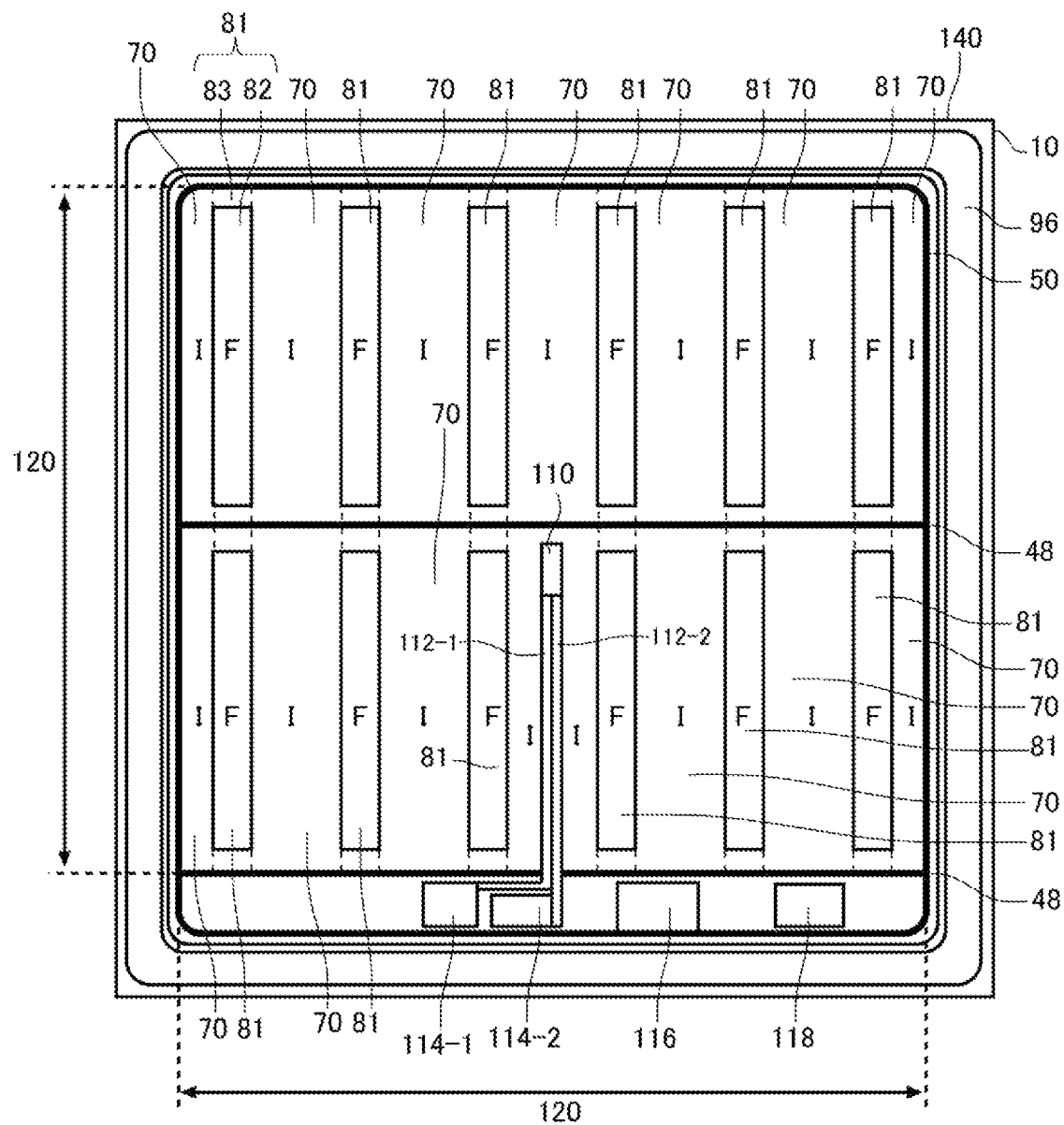
FIG. 8 is a diagram showing a structure of an upper surface of a semiconductor substrate 10.

FIG. 8 is a diagram showing a structure of an upper surface of the semiconductor substrate 10. In this specification, an outer circumference end of the semiconductor substrate 10 in the top view is defined as an outer circumference end 140. The top view corresponds to a view in parallel with the Z axis from the upper surface side of the semiconductor substrate 10.

The semiconductor device 100 includes an active portion 120 and an edge termination structure portion 96. The active portion 120 is a region in which main current flows between the upper surface and the lower surface of the semiconductor substrate 10 when the semiconductor device 100 is controlled to be in the ON state. In other words, it is a region in which current flows, inside the semiconductor substrate 10, from the upper surface to the lower surface or from the lower surface to the upper surface of the semiconductor substrate 10 in the depth direction. The active portion 120 may be a region in which the emitter electrode is provided and a region sandwiched by the regions in which the emitter electrode is provided in the top view of the semiconductor substrate 10.

The active portion 120 is provided with the transistor portion 70 and the adjacent element portion 80. In FIG. 8, only the diode portion 81 is shown as the adjacent element portion 80, but the boundary portion 90 may be provided between the diode portion 81 and the transistor portion 70. In each top view, a reference sign I may be provided to the region of the transistor portion 70 and a reference sign F may be provided to a region of the diode portion 81. As shown in FIG. 8, the transistor portions 70 and the diode portions 81 may be alternately arranged in the Y axis direction.

Each of the diode portions 81 is provided with the cathode region 82 in a region in contact with the lower surface 23 of the semiconductor substrate 10. In FIG. 8, the region provided with the cathode region 82 is indicated with a solid line. In the semiconductor device 100, a P+ type collector region is provided as a region, in the region in contact with the lower surface 23 of the semiconductor substrate 10, other than the cathode region 82.

The diode portion 81 is a region obtained by projecting the cathode region 82 on the Z axis direction. In this specification, the diode portion 81 includes an extended region 83 that is obtained by extending, to an end of the active portion 120 or the gate runner 48 in the X axis direction, a region obtained by projecting the cathode region 82 on the Z axis direction. The active portion 120 may be provided with the transistor portions 70 at both ends in the Y axis direction.

The edge termination structure portion 96 is provided between the active portion 120 and the outer circumference end 140 of the semiconductor substrate 10, on the upper surface of the semiconductor substrate 10. The edge termination structure portion 96 may be provided to be in an annular form surrounding the active portion 120 on the upper surface of the semiconductor substrate 10. The edge termination structure portion 96 of this example is provided along the outer circumference end 140 of the semiconductor substrate 10.

A gate metal layer 50 is provided between the edge termination structure portion 96 and the active portion 120 on the upper surface of the semiconductor substrate 10. An inter-layer insulating film is provided between the gate metal layer 50 and the semiconductor substrate 10 but is omitted in FIG. 8.

The gate metal layer 50 may be provided to surround the active portion 120 in the top view of the semiconductor substrate 10. The gate metal layer 50 is electrically connected to a gate pad 116 provided outside the active portion 120. The gate pad 116 may be provided between the gate metal layer 50 and the active portion 120. A pad such as an emitter pad 118 that is electrically connected to the emitter electrode may be provided between the gate metal layer 50 and the active portion 120. The gate metal layer 50 is electrically connected to the transistor portion 70, and supplies gate voltage to the transistor portion 70.

The gate runner 48 electrically connects the gate metal layer 50 and a gate electrode of the transistor portion 70 to each other. The gate runner 48 may be provided along the gate metal layer 50. The gate runner 48 of this example is provided to surround the active portion 120, along the gate metal layer 50. The gate runner 48 may be provided to overlap the gate metal layer 50. In this case, an inter-layer insulating film may be provided between the gate runner 48 and the gate metal layer 50. The gate runner 48 and the gate metal layer 50 is connected to each other through a contact hole provided in the inter-layer insulating film.

The gate runner 48 may be provided to extend to a portion above the active portion 120. With the gate runner 48 provided to be above the active portion 120, delay and attenuation of the gate voltage supplied to a region away from the gate metal layer 50 can be suppressed. At least one gate runner 48 may be provided across the active portion 120 in the Y axis direction. Thus, the active portion 120 can be divided by the gate runner 48 in the X axis direction. In each of the divided regions of the active portion 120, the transistor portions 70 and the diode portions 81 are alternatively arranged in the Y axis direction.

The semiconductor device 100 of this example includes a temperature sense portion 110, temperature sense wiring 112, and a temperature measurement pad 114. The temperature sense portion 110 is provided above the active portion 120. The temperature sense portion 110 may be provided at the center of the active portion 120 in the top view of the semiconductor substrate 10. The temperature sense portion 110 detects the temperature of the active portion 120. The temperature sense portion 110 may be a PN type temperature sense diode formed of monocrystalline or polycrystalline silicon.

The temperature sense wiring 112 is provided above the active portion 120 in the top view of the semiconductor substrate 10. The temperature sense wiring 112 is connected to the temperature sense portion 110. The temperature sense wiring 112 extends to a region between the active portion 120 and the outer circumference end 140 on the upper surface of the semiconductor substrate 10, and is connected to the temperature measurement pad 114. The temperature sense wiring 112 may include wiring 112-1 of an anode electrode that is electrically connected to a P type layer of a PN type temperature sense diode and wiring 112-2 of a cathode electrode electrically connected to an N type layer. The temperature measurement pad 114 may include an anode pad 114-1 and a cathode pad 114-2.

In FIG. 8, the lifetime control regions are omitted. A range in which the lifetime control regions are provided is the same as that in any of the semiconductor devices 100 shown in FIG. 1a to FIG. 7c.

Figure 9:
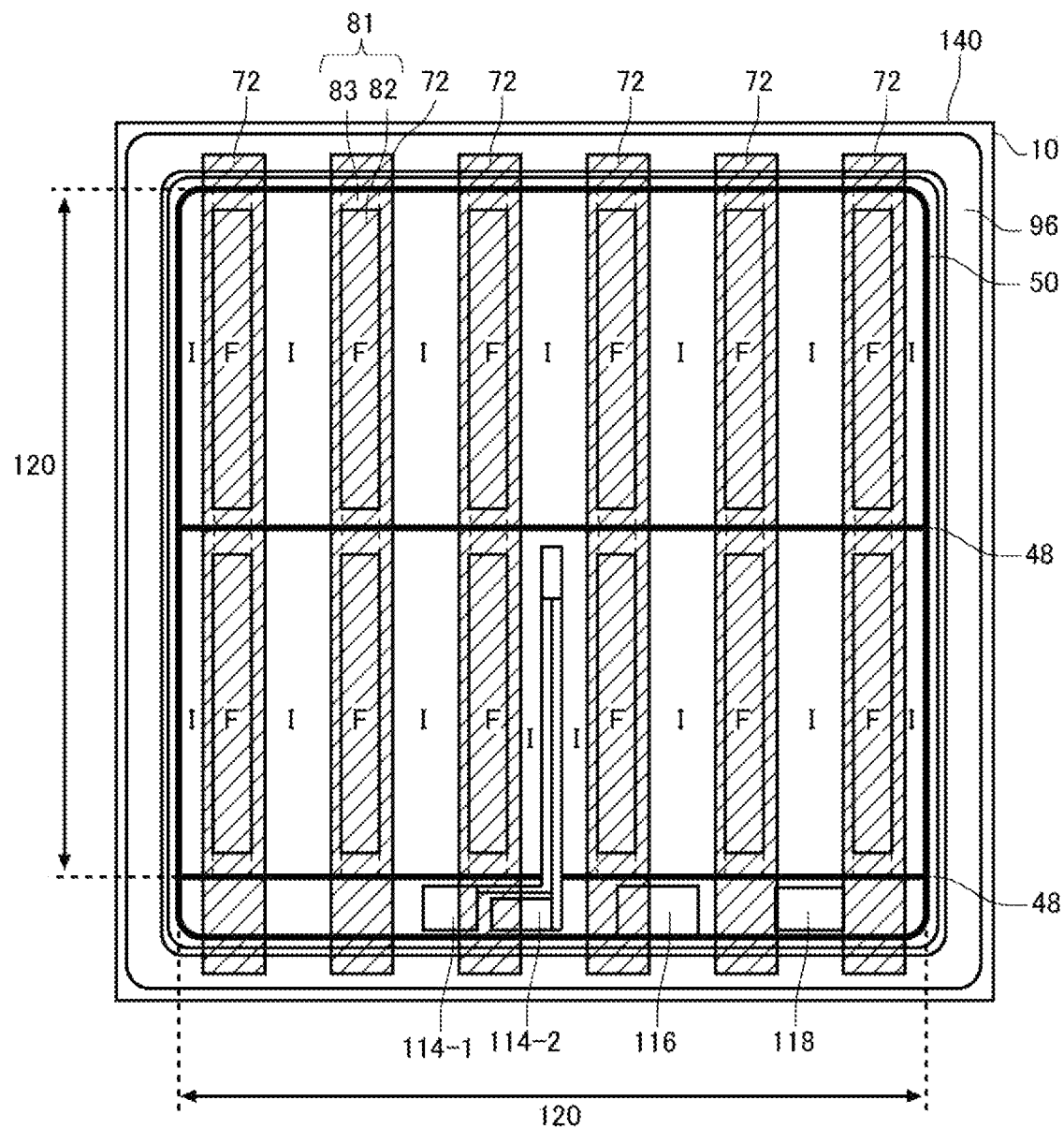
FIG. 9 is a diagram showing a range in which the upper surface side lifetime control region 72, in a top view of the semiconductor substrate 10.

FIG. 9 is diagram showing ranges in which the upper surface side lifetime control regions 72 are provided in the top view of the semiconductor substrate 10. In FIG. 9, the ranges in which the upper surface side lifetime control regions 72 are provided are hatched with diagonal lines. In FIG. 9, although some of the reference signs provided in FIG. 8 are omitted, the configuration other than the upper surface side lifetime control region 72 is the same as that in the example described above with reference to FIG. 8.

The range of the upper surface side lifetime control region 72 in the Y axis direction is the same as that in any of the semiconductor devices 100 described with reference to FIG. 1a to FIG. 7c. In the X axis direction, the upper surface side lifetime control region 72 may overlap the entirety of the diode portions 81. The upper surface side lifetime control region 72 may overlap at least a part of the extension regions 83. In the example shown in FIG. 9, the upper surface side lifetime control region 72 overlaps the entirety of the extension regions 83.

The upper surface side lifetime control region 72 may be provided to extend to a position overlapping the gate metal layer 50 in the X axis direction. The upper surface side lifetime control region 72 may also be provided at a position overlapping the edge termination structure portion 96. An end of the upper surface side lifetime control region 72 of this example in the X axis direction is provided in the edge termination structure portion 96. With the upper surface side lifetime control region 72 provided to a point that is more on the outer side than the cathode region 82 in the X axis direction, a flow of carriers to the cathode region 82 from the edge termination structure portion 96 and the like can be suppressed.

Figure 10:
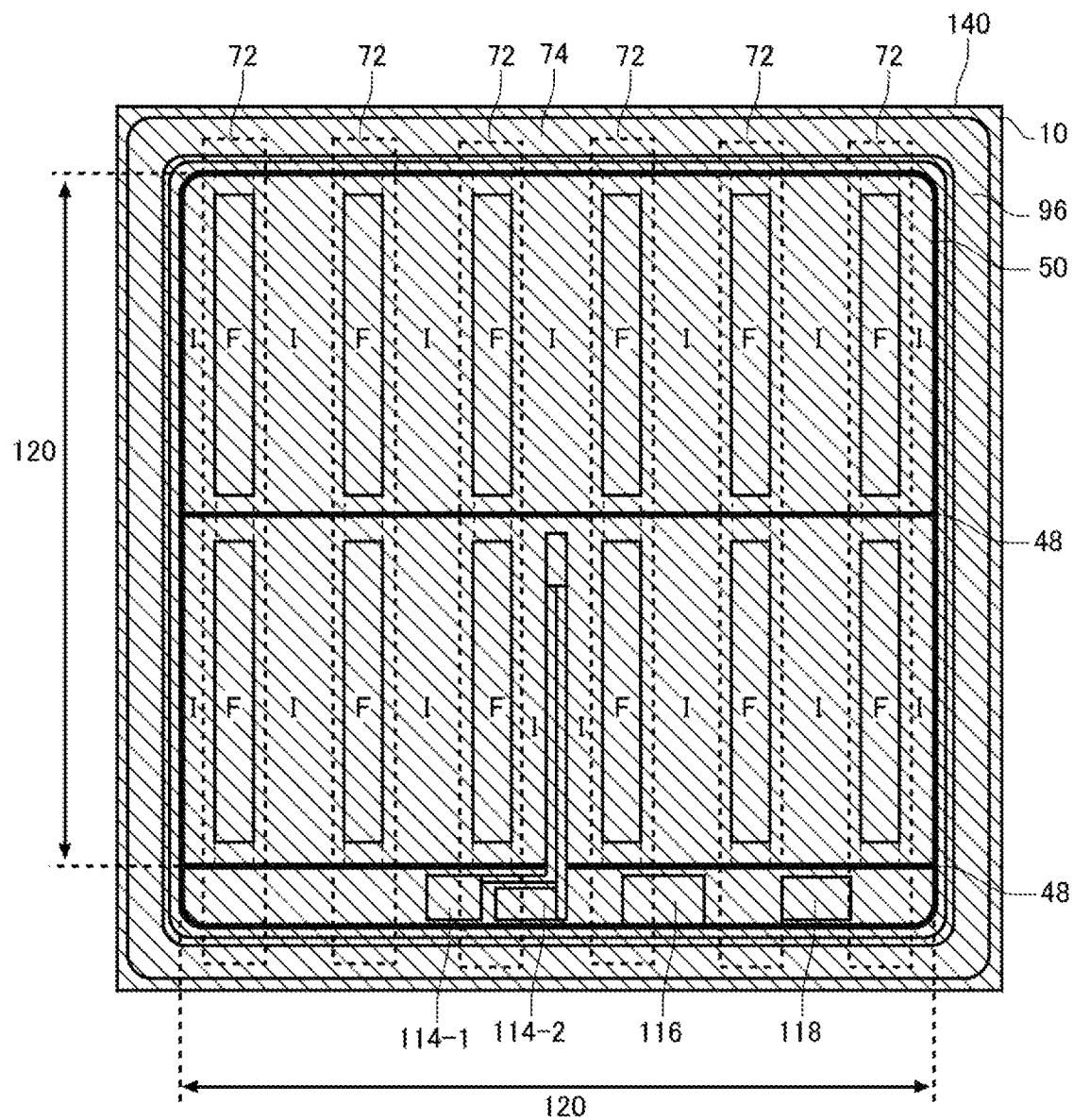
FIG. 10 is a diagram showing a range in which the first lower surface side lifetime control region 74 in the top view of the semiconductor substrate 10.

FIG. 10 is diagram showing a range in which the first lower surface side lifetime control region 74 is provided in the top view of the semiconductor substrate 10. In FIG. 10, the range in which the first lower surface side lifetime control region 74 is provided is hatched with diagonal lines. The range of the first lower surface side lifetime control region 74 in the Y axis direction is the same as that in any of the semiconductor devices 100 described with reference to FIG. 1a to FIG. 7c.

In the X axis direction, the first lower surface side lifetime control region 74 is provided more on the outer side than the upper surface side lifetime control region 72. In this example, the term outer side indicate a side closer to the outer circumference end 140. The first lower surface side lifetime control region 74 may be provided over the entire surface of the semiconductor substrate 10 in the top view. With the first lower surface side lifetime control region 74 provided over a wide range, flow of carriers to the cathode region 82 from the edge termination structure portion 96 and the like can be suppressed.

Figure 11:
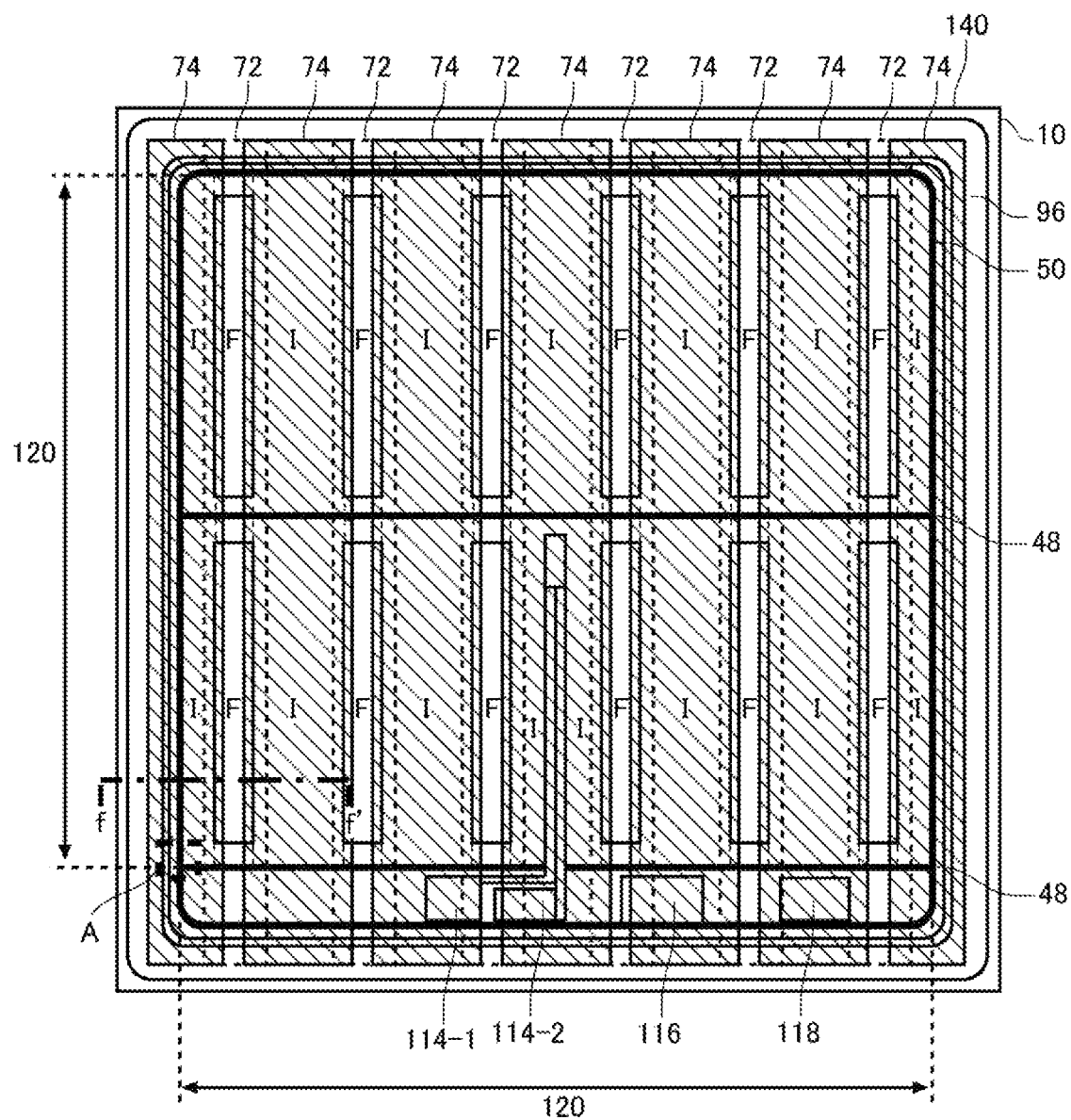
FIG. 11 is a diagram showing another example of the range in which the first lower surface side lifetime control region 74 is provided.

FIG. 11 is a diagram showing another example of the range in which the first lower surface side lifetime control region 74 is provided. The range of the first lower surface side lifetime control region 74 in the Y axis direction is similar to that in the example shown in FIG. 1b and the like. Specifically, in the Y axis direction, the first lower surface side lifetime control region 74 is provided in the region of the diode portion 81 in contact with the transistor portion 70 (or the boundary portion 90), but is not provided in a region of the diode portion 81 separated from the transistor portion 70 (or the boundary portion 90). As shown in FIG. 1b and the like, in the Y axis direction, the range in which the first lower surface side lifetime control region 74 is provided partially overlaps the range in which the upper surface side lifetime control region 72 is provided.

In the Y axis direction, the first lower surface side lifetime control region 74 may also be provided in the edge termination structure portion 96. The first lower surface side lifetime control region 74 may be provided to the outer circumference end 140. In the X axis direction, the range of the first lower surface side lifetime control region 74 may be the same as or wider than the range of the upper surface side lifetime control region 72. In the X axis direction, the first lower surface side lifetime control region 74 may be provided in the outer circumference end 140.

Figure 12:
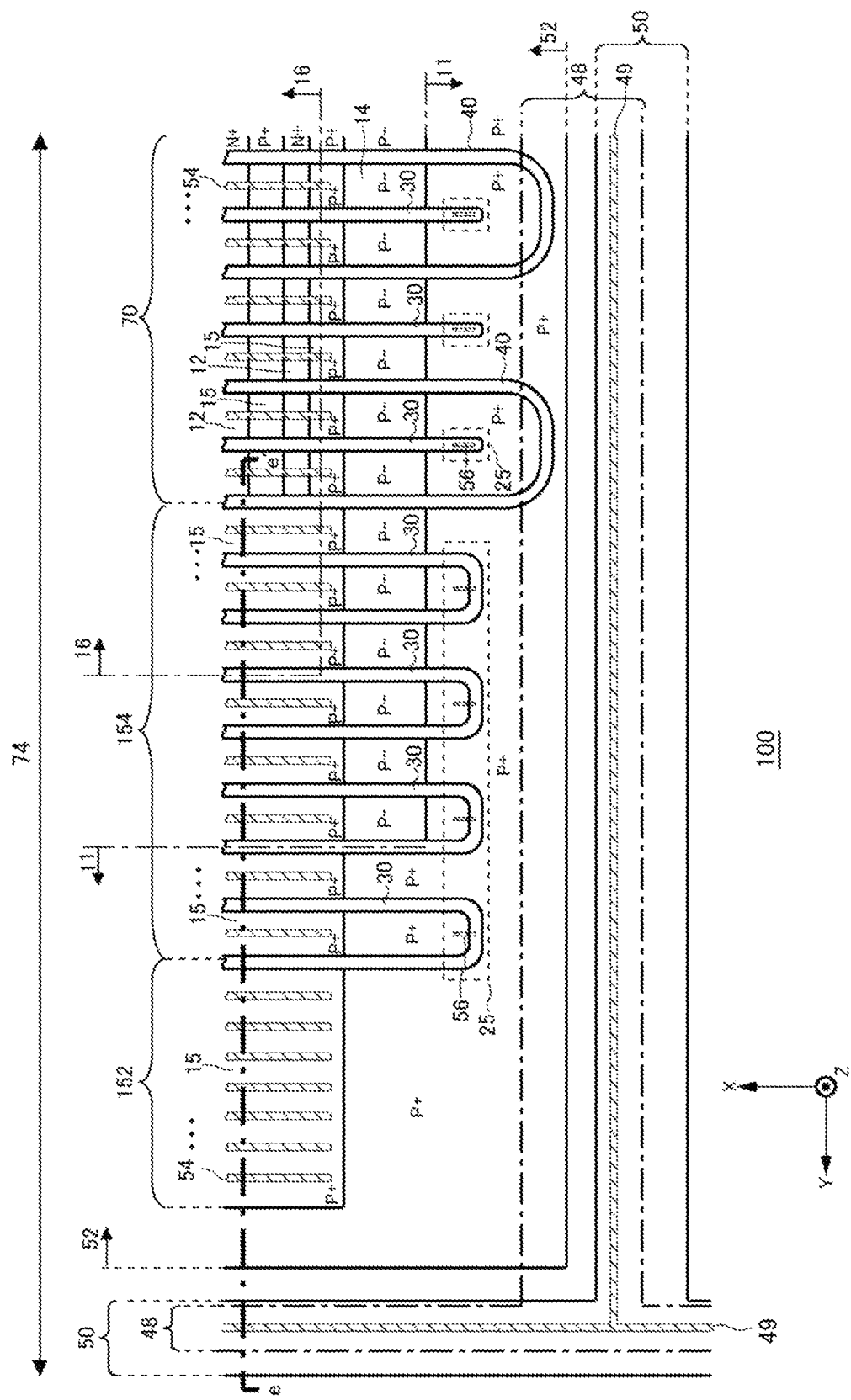
FIG. 12 is an enlarged top view a region A in FIG. 11.

FIG. 12 is an enlarged top view of a region A in FIG. 11. The region A includes an end of the active portion 120 in the Y axis direction. The transistor portion 70 is provided to the end of the active portion 120 in the Y axis direction. In this example, a first termination region 152 and a second termination region 154 are provided between the transistor portion 70 and the gate metal layer 50 in the Y axis direction. The semiconductor device 100 may include only one of the first termination region 152 and the second termination region 154. In the first termination region 152 and the second termination region 154, the lower surface 23 of the semiconductor substrate 10 is provided with the collector region 22.

Figure 13:
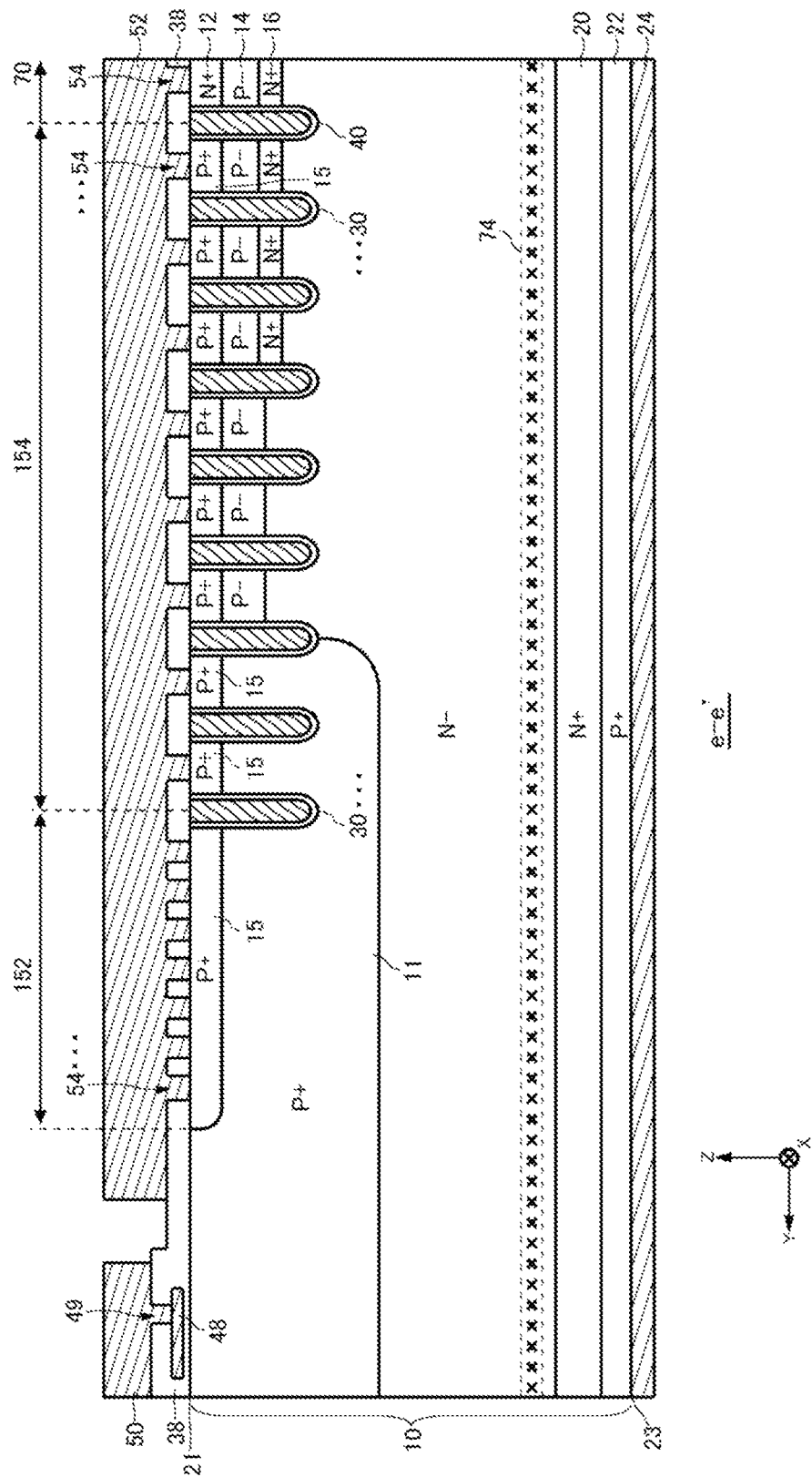
FIG. 13 is a diagram showing an example the cross section taken along line e-e' in FIG. 12.

FIG. 13 is a diagram showing an example of the cross section taken along line e-e' in FIG. 12. The e-e' cross section is a YZ cross section including the gate metal layer 50, the first termination region 152, the second termination region 154, and the transistor portion 70.

The second termination region 154 is in contact with the transistor portion 70 in the Y axis direction. The second termination region 154 is provided with the plurality of dummy trench portions 30 arranged in the Y axis direction. The second termination region 154 may be provided with the second mesa portion 62. In other words, the second termination region 154 may be provided with a mesa portion having the contact region 15 with a large area. This enables holes to be easily extracted in the second termination region 154. Thus, a flow of holes flowing from the side of the outer circumference end 140 to the vicinity of the end of the transistor portion 70 in the Y axis direction can be suppressed.

At least a part of the mesa portions in the second termination region 154 may not be provided with the accumulation region 16. In the examples shown in FIG. 12 and FIG. 13, in the second termination region 154, some of the mesa portions on the side of the transistor portion 70 is provided with the accumulation region 16, and some of the mesa portions on the side of the gate metal layer 50 is not provided with the accumulation region 16.

At least a part of the dummy trench portions 30 in the second termination region 154 may be provided inside the well region 11. In the examples shown in FIG. 12 and FIG. 13, in the second termination region 154, some of the dummy trench portions 30 on the side of the gate metal layer 50 is provided inside the well region 11. Specifically, in the active portion 120, of the trench portions arranged in the Y axis direction, the outermost trench portion is provided inside the well region 11. Thus, the trench portion where the electric field is relatively likely to be concentrated can be protected.

The first termination region 152 is provided between the second termination region 154 and the gate metal layer 50 in the Y axis direction. The first termination region 152 is provided with no trench portion. The contact region 15 may be exposed on the upper surface of the first termination region 152. The first termination region 152 may include a plurality of contact holes 54 extending in the X axis direction. The contact hole 54 connects the emitter electrode 52 and the contact region 15 to each other. The first termination region 152 may be provided to overlap the well region 11 in the top view. The length in the X axis direction of the contact hole 54 in the first termination region 152 may be the same as or longer than the length in the X axis direction of the contact hole 54 in the transistor portion 70.

With the first termination region 152 provided, holes can be extracted at a portion on the outer side of the second termination region 154. Thus, a flow of holes flowing from the side of the outer circumference end 140 to the vicinity of the end of the transistor portion 70 in the Y axis direction can be suppressed.

Figure 14:
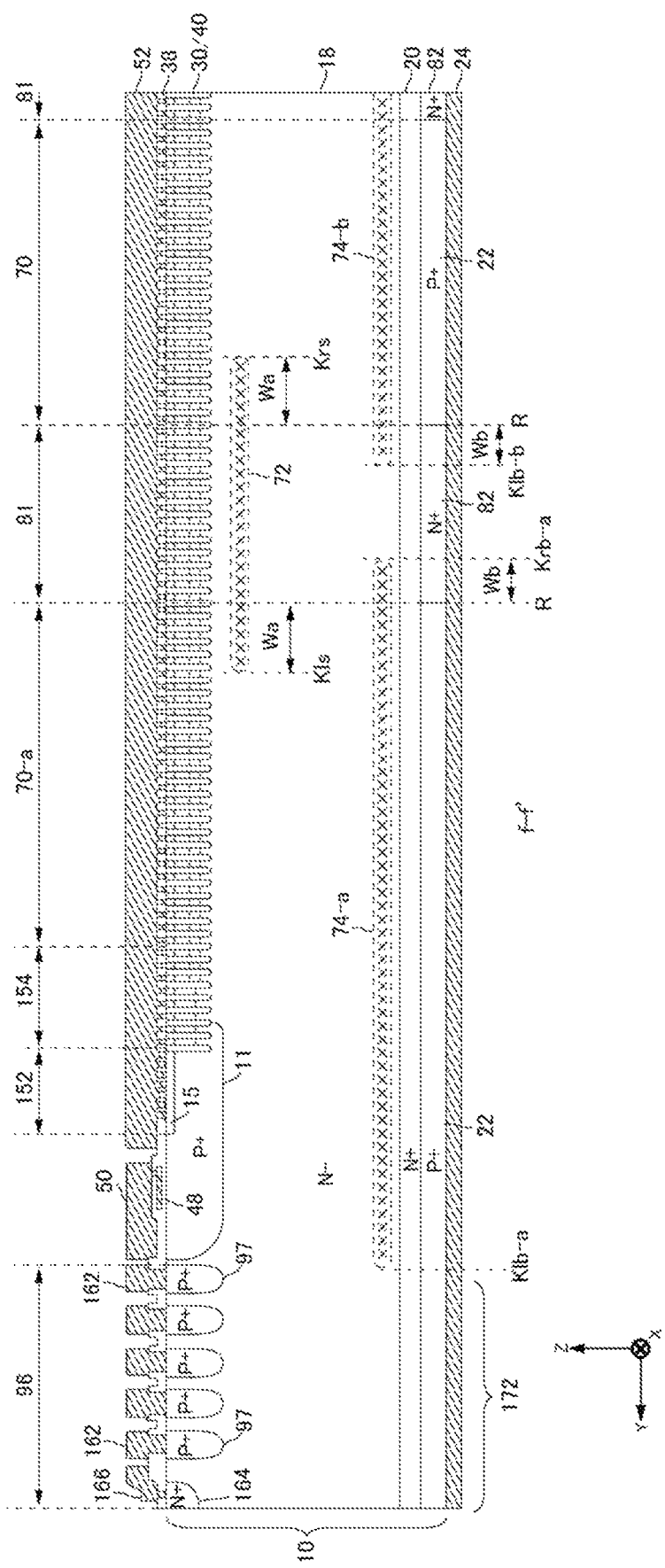
FIG. 14 is a diagram showing an example of the cross section taken along line f-f' in FIG. 11.

FIG. 14 is a diagram showing an example of the cross section taken along line f-f' in FIG. 11. The f-f' cross section is a YZ cross section including the edge termination structure portion 96, the gate metal layer 50, the first termination region 152, the second termination region 154, the plurality of transistor portions 70, and the plurality of diode portions 81.

The edge termination structure portion 96 may include a plurality of guard rings 97. The guard rings 97 of this example are P+ type regions provided on the upper surface 21 of the semiconductor substrate 10. The guard rings 97 are provided to surround the active portion 120, at a portion more on the outer side than the well region 11. With the guard rings 97 provided, a depletion layer from the active portion 120 can be extend in a direction to the outer circumference end 140. Thus, the pressure resistance of the active portion 120 can be improved.

The edge termination structure portion 96 may include a plurality of field plates 162. The field plates 162 of this example are formed of a conductive material. The field plates 162 is provided above the guard rings 97, and may be electrically connected to the guard rings 97. By applying voltage to the field plates 162, a depletion layer extending from the guard rings 97 to the drift region 18 can be widened. The field plates 162 may be electrically connected to the emitter electrode 52.

The edge termination structure portion 96 may include a channel stopper 164. The channel stopper 164 of this example is an N+ type region provided on the upper surface 21 of the semiconductor substrate 10. The channel stopper 164 is provided to surround the plurality of guard rings 97, in a portion more on the outer side than the guard rings 97. With the channel stopper 164 provided, the depletion layer extending from the guard rings 97 can be prevented from reaching the outer circumference end 140 of the semiconductor substrate 10. The edge termination structure portion 96 may include an electrode 166 connected to the channel stopper 164. The electrode 166 may be electrically connected to the emitter electrode 52.

In the cross section, a first lower surface side lifetime control region 74-*a* and a first lower surface side lifetime control region 74-*b* are provided. The first lower surface side lifetime control region 74-*b* is similar to the first lower surface side lifetime control region 74 described with reference to FIG. 1*a* to FIG. 13.

The first lower surface side lifetime control region 74-*a* provided over the entirety of a transistor portion 70-*a* closest to the end in the Y axis direction. The first lower surface side lifetime control region 74-*a* is also provided in the diode portion 81 in contact with the transistor portion 70-*a*.

The first lower surface side lifetime control region 74-*a* may be provided continuously to a portion beneath the gate metal layer 50. In the Y-axis direction, the first lower surface side lifetime control region 74-*a* of this example is provided over then entirety of the gate metal layer 50, the entirety of the first termination region 152, and the entirety of the second termination region 154. The first lower surface side lifetime control region 74-a of this example is not provided in at least a part of the edge termination structure portion 96. The edge termination structure portion 96 of this example includes a killer-free region 172 not provided with the first lower surface side lifetime control region 74. With the killer-free region 172 provided, hard recovery can be suppressed and oscillation of a reverse recovery waveform can be suppressed when the diode portion 81 performs a reverse recovery operation.

The killer-free region 172 is a region obtained by projecting a region not provided with the first lower surface side lifetime control region 74 on the Z axis direction. The killer-free region 172 is also not provided with other lifetime control regions. In the Y axis direction, the killer-free region 172 may be provided over 50% or more of the width of the edge termination structure portion 96, or may be provided over the entirety of the edge termination structure portion 96. The killer-free region 172 may be in contact with the outer circumference end 140 of the semiconductor substrate 10.

In the semiconductor devices 100 described with reference to FIG. 8 to FIG. 14, the second lower surface side lifetime control region 75 is omitted, but any of the semiconductor devices 100 described with reference to FIG. 8 to FIG. 14 may include any of the second lower surface side lifetime control regions 75 described with reference to FIG. 1a to FIG. 7c.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

REFERENCE SIGNS LIST

10 . . . semiconductor substrate, 11 . . . well region, 12 . . . emitter region, 14 . . . base region, 15 . . . contact region, 16 . . . accumulation region, 18 . . . drift region, 20 . . . buffer region, 21 . . . upper surface, 22 . . . collector region, 23 . . . lower surface, 24 . . . collector electrode, 25 . . . connection portion, 29 . . . extending portion, 30 . . . dummy trench portion, 31 . . . connection portion, 32 . . . dummy insulating film, 34 . . . dummy conductive portion, 38 . . . inter-layer insulating film, 39 . . . extending portion, 40 . . . gate trench portion, 41 . . . connection portion, 42 . . . gate insulating film, 44 . . . gate conductive portion, 48 . . . gate runner, 49 . . . contact hole, 50 . . . gate metal layer, 52 . . . emitter electrode, 54 . . . contact hole, 56 . . . contact hole, 60 . . . first mesa portion, 62 . . . second mesa portion, 64 . . . third mesa portion, 70 . . . transistor portion, 72 . . . upper surface side lifetime control region, 74 . . . first lower surface side lifetime control region, 75 . . . second lower surface side lifetime control region, 75-1 . . . second lower surface side lifetime control region, 75-2 . . . second lower surface side lifetime control region, 75-3 . . . second lower surface side lifetime control region, 75-4 . . . second lower surface side lifetime control region, 76 . . . position, 77 . . . end position, 78 . . . tail part, 80 . . . adjacent element portion, 81 . . . diode portion, 82 . . . cathode region, 83 . . . extension region, 90 . . . boundary portion, 96 . . . edge termination structure portion, 97 . . . guard ring, 97-1 . . . guard ring, 97-2, guard ring, 97-3 . . . guard ring, 97-4 . . . guard ring, 98 . . . semiconductor chip, 100 . . . semiconductor device, 110 . . . temperature sense portion, 112 . . . temperature sense wiring, 114 . . . temperature measurement pad, 116 . . . gate pad, 118 . . . emitter pad, 120 . . . active portion, 140 . . . outer circumference end, 150 . . . semiconductor device, 152 . . . first termination region, 154 . . . second termination region, 162 . . . field plate, 164 . . . channel stopper, 166 . . . electrode, 172 . . . killer-free region, 272 . . . upper surface side lifetime control region

What is claimed is:

1. A semiconductor device comprising:
a semiconductor substrate that includes a drift region of a first conductivity type;
a transistor portion provided in the semiconductor substrate; and
an adjacent element portion provided in the semiconductor substrate, the adjacent element portion and the transistor portion being arranged along a predetermined arrangement direction, wherein
the transistor portion and the adjacent element portion both include
a base region of a second conductivity type provided above the drift region inside the semiconductor substrate,
a plurality of trench portions that are formed through the base region from an upper surface of the semiconductor substrate, extend in an extending direction orthogonal to the arrangement direction on the upper surface of the semiconductor substrate, and have a conductive portion provided inside the trench portions, and
a first lower surface side lifetime control region that is provided, on a lower surface side of the semiconductor substrate, continuously from the transistor portion to the adjacent element portion and includes a lifetime killer, and
in the arrangement direction, the first lower surface side lifetime control region is provided over entirety of the transistor portion and in only a part of the adjacent element portion in a top view of the semiconductor substrate.

2. The semiconductor device according to claim 1, wherein a second lower surface side lifetime control region is further included, that is provided on a lower surface side of the semiconductor substrate at a position deeper than the first lower surface side lifetime control region with respect to a lower surface of the semiconductor substrate, provided to overlap the first lower surface side lifetime control region in the top view of the semiconductor substrate, and includes a lifetime killer.

3. The semiconductor device according to claim 2, wherein in the arrangement direction, the second lower surface side lifetime control region is provided continuously from the transistor portion to the adjacent element portion and is provided in a part of the transistor portion and in a part of the adjacent element portion.

4. The semiconductor device according to claim 2, wherein at an end of the transistor portion in the arrangement direction, the first lower surface side lifetime control region and the second lower surface side lifetime control region overlap in a depth direction of the semiconductor substrate.

5. The semiconductor device according to claim 2, wherein
the transistor portion further includes an upper surface side lifetime control region including a lifetime killer, on an upper surface side of the semiconductor substrate, and
in the transistor portion, an end of the second lower surface side lifetime control region is provided closer to the adjacent element portion in the arrangement direction than an end of the upper surface side lifetime control region is.

6. The semiconductor device according to claim 5, wherein
the adjacent element portion includes a diode portion and a boundary portion that is sandwiched between the diode portion and the transistor portion in the arrangement direction, and
in the boundary portion, the first lower surface side lifetime control region and the second lower surface side lifetime control region overlap in a depth direction of the semiconductor substrate.

7. The semiconductor device according to claim 6, wherein at an end of the diode portion in the arrangement direction, the first lower surface side lifetime control region and the second lower surface side lifetime control region do not overlap in the depth direction of the semiconductor substrate.

8. The semiconductor device according to claim 5, wherein the upper surface side lifetime control region is provided continuously from the transistor portion to the adjacent element portion in the arrangement direction, on the upper surface side of the semiconductor substrate.

9. The semiconductor device according to claim 5, wherein in the arrangement direction, the upper surface side lifetime control region is provided in a part of the transistor portion and over entirety of the adjacent element portion.

10. The semiconductor device according to claim 5, further comprising:
a well region of the second conductivity type provided to overlap the plurality of trench portions in the top view of the semiconductor substrate, wherein
a part of the upper surface side lifetime control region is provided to have a predetermined length in the extending direction, from an end of the well region to outside of the well region, and
the predetermined length is larger than a thickness of the semiconductor substrate in a depth direction.

11. The semiconductor device according to claim 10, wherein
a part of the second lower surface side lifetime control region is provided to have a predetermined length in the extending direction, from the end of the well region to the outside of the well region in the top view of the semiconductor substrate, and
the predetermined length is larger than the thickness of the semiconductor substrate in the depth direction.

12. The semiconductor device according to claim 10, wherein
a part of the first lower surface side lifetime control region is provided to have a predetermined length in the extending direction, from the end of the well region to the outside of the well region in the top view of the semiconductor substrate, and
the predetermined length is larger than the thickness of the semiconductor substrate in the depth direction.

13. The semiconductor device according to claim 1, further comprising:
an active portion provided with the transistor portion and the adjacent element portion; and
an edge termination structure portion surrounding the active portion in the top view of the semiconductor substrate, wherein
the first lower surface side lifetime control region is not provided in at least a partial region of the edge termination structure portion.

14. The semiconductor device according to claim 1, further comprising:
an upper surface side lifetime control region, including a lifetime killer, provided on an upper surface side of the semiconductor substrate.

15. The semiconductor device according to claim 14, wherein the upper surface side lifetime control region is provided continuously from the transistor portion to the adjacent element portion in the arrangement direction, on the upper surface side of the semiconductor substrate.

16. The semiconductor device according to claim 14, wherein in the arrangement direction, the upper surface side lifetime control region is provided in a part of the transistor portion and over entirety of the adjacent element portion.

17. The semiconductor device according to claim 14, further comprising
a well region of the second conductivity type provided to overlap the plurality of trench portions in the top view of the semiconductor substrate, wherein
a part of the upper surface side lifetime control region is provided to have a predetermined length in the extending direction, from an end of the well region to outside of the well region, and
the predetermined length is larger than a thickness of the semiconductor substrate in a depth direction.

18. The semiconductor device according to claim 17, wherein
a part of the first lower surface side lifetime control region is provided to have a predetermined length in the extending direction, from the end of the well region to the outside of the well region in the top view of the semiconductor substrate, and
the predetermined length is larger than the thickness of the semiconductor substrate in the depth direction.

* * * * *